United States Patent
Inoue et al.

(10) Patent No.: US 6,867,907 B2
(45) Date of Patent: Mar. 15, 2005

(54) PUMPING LIGHT SOURCE UNIT, RAMAN AMPLIFIER, AND OPTICAL TRANSMISSION SYSTEM

(75) Inventors: Masayuki Inoue, Yokohama (JP);
Motoki Kakui, Yokohama (JP);
Masakazu Shigehara, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 211 days.

(21) Appl. No.: 10/183,366

(22) Filed: Jun. 28, 2002

(65) Prior Publication Data

US 2003/0002143 A1 Jan. 2, 2003

(30) Foreign Application Priority Data

Jun. 29, 2001 (JP) .................................... P2001-199158

(51) Int. Cl.[7] ................................................ H01S 3/00
(52) U.S. Cl. .................................... 359/334; 359/341.3
(58) Field of Search ............................... 359/334, 341.3

(56) References Cited

U.S. PATENT DOCUMENTS 6,125,162 A    9/2000  English
6,433,921 B1 *  8/2002  Wu et al. .................... 359/334
6,525,870 B1 *  2/2003  Cho et al. .................... 359/334
6,636,344 B2 * 10/2003  Akasaka et al. ............ 359/334

FOREIGN PATENT DOCUMENTS

JP          2001-208840          8/2001

* cited by examiner

Primary Examiner—Mark Hellner
(74) Attorney, Agent, or Firm—McDermott Will & Emery LLP

(57) ABSTRACT

The present invention relates to a pumping light source unit for Raman amplification and the like comprising a structure for improving the pumping light spectrum controllability so as to enable output signal light spectrum adjustment within an amplification wavelength band. The pumping light source unit comprises N ($\geq 2$) pumping light sources for outputting N channels of pumping light having respective wavelengths different from each other, a multiplexer for multiplexing the N channels of pumping light, and an output structure for supplying a Raman amplification optical fiber with the pumping light outputted from the multiplexer. In particular, at least one of the N pumping light sources includes a variable length pumping light source adapted to change the channel wavelength of pumping light outputted therefrom. This configuration makes it possible to adjust pumping light spectra, thereby improving the controllability of output signal light spectra (Raman gain spectra).

52 Claims, 30 Drawing Sheets

PUMPING LIGHT SOURCE UNIT, RAMAN AMPLIFIER, AND OPTICAL TRANSMISSION SYSTEM

BACKGROUND OF THE INVENTION

1. Field of the Invention

The present invention relates to a pumping light source unit for Raman amplification used as a light source for supplying pumping light in a Raman amplifier, a Raman amplifier using the same, and an optical transmission system.

2. Related Background Art

An optical fiber amplifier is an optical component for amplifying the power of signal light propagating through an optical fiber transmission line constituting an optical transmission system so as to compensate for the transmission loss occurring in the optical fiber transmission line. The optical fiber amplifier placed on the optical fiber transmission line comprises an optical fiber for optical amplification also functioning as a part of the optical fiber transmission line, and a pumping light source for supplying the optical fiber for optical amplification with pumping light. When signal light is fed into the optical fiber for optical amplification supplied with the pumping light, the signal light is amplified in the optical fiber for optical amplification.

As such an optical fiber amplifier, rare-earth-doped fiber amplifiers doped with rare earth elements such as Er (erbium) and Raman amplifiers utilizing Raman amplification phenomenon caused by stimulated Raman scattering are utilized.

Here, a rare-earth-doped fiber amplifier (e.g., EDFA: Erbium-Doped Fiber Amplifier) utilizes an optical fiber doped with a rare earth element as an optical fiber for optical amplification. On the other hand, a Raman amplifier utilizes a silica type optical fiber constituting an optical fiber transmission line as an optical fiber for Raman amplification.

SUMMARY OF THE INVENTION

The inventors studied conventional Raman amplifiers in detail and, as a result, have found problems as will be explained hereinafter. Among the conventional optical fiber amplifiers, Raman amplifiers are advantageous in that they can utilize a given wavelength band as their amplification wavelength band by appropriately selecting the wavelength band of pumping light. Also, when a pumping light source unit comprising a plurality of pumping light sources outputting a plurality of channels of pumping light having respective wavelengths different from each other is utilized, signal light amplification is possible in an amplification wavelength band wider than that determined by the plurality of channels of pumping light supplied from the pumping light source unit.

Here, for realizing a Raman amplifier having a wider amplification wavelength band by employing a pumping light source unit including a plurality of pumping light sources, it becomes necessary to flatten the gain spectrum (wavelength dependence of gain in the amplification wavelength band or the power spectrum of amplified signal light (wavelength dependence of output signal light power) in general. For this matter, U.S. Pat. No. 6,115,174 discloses a Raman amplifier employing a plurality of pumping light sources. In this Raman amplifier, the wavelength and power of pumping light supplied from each pumping light source are set such that the power spectrum of output signal light is substantially flattened within the amplification wavelength band. When the pumping light power in each pumping light source is adjusted as such, the pumping light spectrum in all the pumping channels is regulated, which makes it possible to control the power spectrum of output signal light.

However, such a configuration in which the pumping light spectrum in all the pumping channels is adjusted by the pumping light power alone may fail to control the pumping light spectrum and its corresponding output signal light spectrum sufficiently. For example, when the output signal light spectrum within the amplification wavelength band changes greatly, conventional Raman amplifiers may fail to adjust the output signal light spectrum sufficiently so as to make it respond to such a change.

Also, the Japanese Patent Application Laid-Open No. 2001-208840 discloses a structure that an optical multiplexer multiplexing light from a plurality of pumping light sources and a plurality of optical reflector provided so as to correspond to these pumping light sources are made of materials each having an approximately same differential coefficient of it's center wavelength change with respect to a temperature change in a wavelength band in use, and that the optimum wavelength of each input port of the optical multiplexer is approximately equal to the center reflection wavelength of the optical reflector at a predetermined temperature within a temperature range in use environment. In the above-mentioned structure, both optimum wavelengths of the optical reflector and the optical multiplexer similarly change with respect to the change of environment temperature. As a result, though a transmission loss and a power of pumping light can be maintain at a constant level, the wavelength shift of gain spectrum occurs in a Raman amplifier depending on a wavelength of pumping light because the change of wavelength is permitted.

In order to overcome the above-mentioned problems, it is an object of the present invention to provide a pumping light source unit comprising a structure for improving the controllability of pumping light spectrum so that the output signal light spectrum within the amplification wavelength band in a Raman amplifier can sufficiently be adjusted, a Raman amplifier including the pumping light source, and an optical transmission system including the Raman amplifier.

The pumping light source unit according to the present invention is a pumping light source unit for Raman amplification employed as a light source for supplying a Raman amplifier with N ($\geq 2$) channels of pumping light having respective wavelengths different from each other. The pumping light source unit comprises N pumping light sources, a pumping light multiplexer, and an output structure. The N pumping light sources output N channels of pumping light having respective wavelengths different from each other. The pumping light multiplexer multiplexes the N channels of pumping light respectively outputted from the N pumping light sources. The output structure supplies a Raman amplification optical fiber with the pumping light multiplexed by the multiplexer. In particular, in the pumping light source unit according to the present invention according to the present invention, at least one of the N pumping light sources includes a wavelength variable pumping light source adapted to change a channel wavelength of pumping light outputted therefrom.

The pumping light source unit functioning as pumping light supplying means in the Raman amplifier comprises N pumping light sources for respectively outputting a plurality of channels of pumping light, whereas at least one of the pumping light sources includes a wavelength variable pumping light source. Such a configuration makes it possible to adjust not only the pumping light power of each channel but also the channel wavelength outputted from the wavelength variable light source as necessary, when adjusting the spectrum of pumping light supplied from the pumping light source unit. This realizes a pumping light source unit whose pumping light spectrum controllability is improved so as to be able to respond sufficiently to various changes including those in cases where the pumping light spectrum greatly changes in all the channels of pumping light outputted therefrom. Also, when such a pumping light source unit is employed in a Raman amplifier, the power spectrum of output signal within the amplification wavelength band in the Raman amplifier can fully be adjusted.

The wavelength variable pumping light source adapted to control the channel wavelength of pumping light outputted therefrom comprises a pumping laser, a resonance grating, and a channel wavelength adjusting system. The resonance grating reflects the light outputted from the pumping laser toward the pumping laser. The channel wavelength adjusting system adjusts the reflection wavelength of the resonance grating. An external resonator type laser unit utilizing a resonance grating disposed outside the pumping laser as such can efficiently control the channel wavelength of output pumping light by adjusting the reflection wavelength of the resonance grating.

Preferably, in the external resonator type mentioned above, the resonance grating is a Bragg grating reflecting light having a Bragg wavelength. A specific example of Bragg grating employable is a fiber Bragg grating in which a periodic refractive index change is formed within at least a core region of an optical fiber along a longitudinal direction thereof. In a simple structure, such a fiber grating can realize both a configuration of external resonance in a wavelength variable laser unit and a configuration of optical waveguide for outputting pumping light from the wavelength variable laser unit to a pumping light multiplexer.

The channel wavelength adjusting system for adjusting the reflection wavelength of the fiber Bragg grating includes stress applying means and heating means. The stress applying means applies a predetermined stress to the fiber Bragg grating, so as to change the grating period, thereby adjusting the wavelength of reflected light. The heating means heats the fiber Bragg grating, so as to change the refractive index of the core region part formed with the Bragg grating, thereby adjusting the wavelength of reflected light.

When the Bragg grating is formed within an optical waveguide made of a material having an electrooptic effect, the channel wavelength adjusting system may include electric field applying means. The electric field applying means applies an electric field having a predetermined intensity to the optical waveguide formed with the Bragg grating, thereby changing the refractive index of optical waveguide. In a simple configuration, such a channel wavelength adjusting system can realize both a configuration of external resonance in a wavelength variable laser unit and a configuration of optical waveguide for outputting pumping light from the wavelength variable laser unit to a pumping light multiplexer as well.

The wavelength variable pumping light source may comprise a semiconductor laser, and heating means for changing an oscillating wavelength of the semiconductor laser by adjusting a chip temperature of the semiconductor laser. Alternatively, the wavelength variable pumping light source may include a wavelength variable laser unit comprising a pumping laser and a variable length bandpass filter adapted to change a wavelength of light transmitted therethrough. Each of these configurations can efficiently control the channel wavelength of output pumping light as with the external resonator type wavelength variable laser utilizing the resonance grating mentioned above.

The pumping light multiplexer may include transmission characteristic adjusting means for adjusting a transmission wavelength characteristic thereof. As a consequence, even when the channel wavelength of pumping light from each pumping light source to be multiplexed by the pumping light multiplexer changes, the transmission characteristic in the pumping light multiplexer can be adjusted in response to the change in wavelength, whereby each channel of the pumping light can be multiplexed appropriately.

For example, the pumping light multiplexer can be constituted by a plurality of polarization multiplexers each polarization-multiplexing a pair of channels of pumping light having respective wavelengths adjacent each other, and a wavelength multiplexer for wavelength-multiplexing a plurality of pumping light components outputted from the respective polarization multiplexers. Employing a polarization multiplexer in a pumping light multiplexer as such makes it unnecessary to adjust transmission characteristics even when the channel wavelength of pumping light changes upon polarization-multiplexing the pumping light. Therefore, pumping light can easily be multiplexed by combining a polarization multiplexer and a wavelength multiplexer together.

Preferably, thus configured pumping light multiplexer further comprises a depolarizer disposed between the polarization multiplexer and the wavelength multiplexer. Providing a depolarizer as such reduces the influence of polarization dependence of amplification gain in Raman amplification when the pumping light source is employed in a Raman amplifier.

Further, the pumping light multiplexer may include an arrayed waveguide grating, an interleaver, or a combination thereof. When constituted by an arrayed waveguide grating or interleaver, the pumping light multiplexer can favorably respond to channel wavelength changes in pumping light.

Preferably, each of the N pumping light sources includes an external resonator type laser unit comprising a pumping laser and a resonance grating, whereas at least one of the N external resonator type laser units is an external resonator type wavelength variable laser unit further comprising a channel wavelength adjusting system for changing a reflection wavelength of the resonance grating. Here, the pumping light multiplexer preferably comprises at least one optical circulator device and a reflection grating. The optical circulator device multiplexes respective pumping light components outputted from the N external resonator type laser units. Each of the reflection gratings is placed between the resonance grating and optical circulator device in its corresponding external resonator type laser unit. Each of these reflection gratings has a reflection characteristic of reflecting a respective channel of pumping light outputted from the optical circulator device to the resonance grating toward the optical circulator device. A configuration employing an optical circulator device as such can also multiplex pumping light components from a plurality of pumping light sources.

Specifically, the pumping light multiplexer employing the optical circulator device may include (N−1) 3-port optical circulators connected in (N−1) stages so as to successively multiplex N channels of pumping light respectively outputted from the N external resonator type laser units.

Alternatively, the pumping light multiplexer may include a single (N+1)-port optical circulator for multiplexing N channels of pumping light respectively outputted from the N external resonator type laser units. Further, the pumping light multiplexer may include a single (N+2)-port optical circulator for multiplexing N channels of pumping light respectively outputted from the N external resonator type laser units. In this case, return light caused by Rayleigh scattering and the like occurring within the Raman amplification optical fiber can effectively be blocked, and the output of each of the N pumping light sources can be stabilized.

The pumping light multiplexer may further comprise an optical isolator disposed between the resonance grating and reflection grating in each of the N external resonator type laser units. As a consequence, a plurality of wavelengths of light are prevented from externally resonating in the external resonator type laser units under the influence of reflection gratings.

The channel wavelength adjusting system changes the reflection wavelength of the reflection grating for reflecting the pumping light from its corresponding external resonator type wavelength variable laser unit in synchronization with the reflection wavelength of the resonance grating in the corresponding external resonator type wavelength variable laser unit. As a consequence, even when the channel wavelength of pumping light outputted from the external resonator type wavelength variable laser unit changes, the pumping light can reliably be reflected in the corresponding reflection grating.

Preferably, in the pumping light multiplexer employing the optical circulator device, the resonance grating and reflection grating include a Bragg grating for reflecting light having a Bragg wavelength. Specifically, it is preferred that the Bragg grating include a fiber Bragg grating in which a periodic refractive index change is formed within at least a core region of an optical fiber along a longitudinal direction thereof. While the reflection wavelength of the fiber Bragg grating is changed in the channel wavelength adjusting system, the reflection wavelength adjusting system includes stress applying means, heating means, or electric field applying means. The stress applying means changes the grating period by applying a predetermined stress to the fiber Bragg grating. The heating means changes the refractive index within the core region by heating the fiber Bragg grating. When the Bragg grating is formed within an optical waveguide made of a material having an electrooptic effect, the electric field applying means as the channel wavelength adjusting system changes the refractive index of the optical waveguide by applying an electric field having a predetermined intensity to the optical waveguide formed with the Bragg grating.

For outputting the pumping light multiplexed by the pumping light multiplexer to an optical transmission line propagating signal light to be Raman-amplified, the above-mentioned output structure includes an output multiplexer for multiplexing the pumping light with signal light. Such an output multiplexer may be configured so as to connect an output optical fiber of the pumping light source unit to the multiplexer disposed on the optical transmission line side, instead of being provided on the pumping light source unit side.

In the above-mentioned structure adjusting a pumping light spectrum by changing channel wavelengths of the remaining pumping light sources in order to maintain the flatness of a power spectrum (gain spectrum of Raman amplifier) even when the output of one of the plurality of pumping light sources remarkably decreases, the degradation of pumping light spectrum can not be prevented to a certain level. Thus, the pumping light source unit according to the present invention preferably comprises a main pumping light supply system outputting a plurality of channels of pumping light under steady condition, and a backup pumping light supply system for preventing a degradation of pumping light spectrum caused by the output decrease of any one of the pumping light sources included in the main pumping light supply system.

Namely, the pumping light source unit comprises a main pumping light supply system, a multiplexer, an output structure, a backup pumping light supply system and an optical switch. The main pumping light supply system includes N ($\geqq$2) pumping light sources for outputting N channels of pumping light having respective wavelengths different from each other. The multiplexer multiplexes the N channels of pumping light respectively outputted from the N pumping light sources. The output structure outputs the pumping light multiplexed by the multiplexer. The backup pumping light supply system includes one or more backup pumping light sources, and at least one of the backup pumping light sources is a wavelength variable pumping light source adapted to change a channel wavelength of pumping light outputted therefrom. The optical switch is arranged on an optical path between the main pumping light supply system and the multiplexer. When the output from one of N pumping light sources in the main pumping light supply system decreases, the optical switch functions so as to switch between the output from the one of the N pumping light sources and the output from the associated one of the backup pumping light sources in the backup pumping light supply system.

As described above, the pumping light sources according to the present invention comprises the main pumping light supply system and the backup pumping light supply system, and the optical switch switches between these systems. By this structure, the channel wavelengths included in pumping light supplied to the Raman amplifier are maintained under emergency condition that one of the N pumping light sources is failed, and therefore the effect against the gain spectrum of Raman amplifier is small.

It is preferable that the optical switch includes a switch using an optic intermerometric effect to prevent an instant breaking of pumping light to be introduced to the multiplexer.

The pumping light source unit preferably comprises a 1×M ($\geqq$2)-port optical switch arranged on an optical path between the optical switch and the backup pumping light supply system in order to improving a cost performance by reducing the number of the backup pumping light sources included in the backup pumping light supply system. Also, the pumping light source unit preferably comprises a M ($\geqq$2)-port output demultiplexer arranged on the optical path between the optical switch and the backup pumping light supply system.

Further, the pumping light source unit preferably comprises a resonance grating arranged on an optical path between the optical switch and the 1×M-port optical switch. The resonance grating has a centrer reflection wavelength being approximately equal to the wavelength of the pumping light outputted from a pumping light source to be switched by the optical switch within the N pumping light sources. Because a reliability degradation generated in a conventional wavelength variable systems can be prevented by this structure.

The pumping light source unit may further comprises a channel wavelength adjusting system for changing a wavelength of light reflected by the resonance grating, and in this case, the number of the backup pumping light sources can be effectively reduced. The channel wavelength adjusting system may include stress applying means for changing a grating period by applying a predetermined stress to the resonance grating. The channel wavelength adjusting system may include heating means for changing a refractive index within the core region by heating the resonance grating. When the resonance grating is formed within an optical waveguide made of a material having an electrooptic effect, the channel wavelength adjusting system may include electric field applying means for changing a refractive index of the optical waveguide by applying an electric field having a predetermined intensity to the optical waveguide formed with the resonance grating.

The Raman amplifier according to the present invention comprises a Raman amplification optical fiber and a pumping light source unit having one of the structures mentioned above. The Raman amplification optical fiber Raman-amplifies signal light within a predetermined amplification wavelength band when pumping light for Raman amplification is supplied thereto. The pumping light source unit supplies the pumping light to the Raman amplification optical fiber. This configuration makes it possible to sufficiently regulate an output signal light spectrum within the amplification wavelength band. This realizes a Raman amplifier whose amplification gain controllability is improved so as to be able to respond sufficiently to various changes including those in cases where the output signal light spectrum greatly changes in the amplification wavelength band.

Preferably, the Raman amplifier comprises an input power measuring system for measuring the power of input signal light, and a controller. According to a result of measurement effected by the input power measuring system, the controller controls a power or wavelength of N channels of pumping light respectively outputted from N pumping light sources included in the pumping light source unit so as to attain a substantially flat output signal light spectrum. Alternatively, the Raman amplifier may comprise an output power measuring system for measuring the power of Raman-amplified output signal light, and a controller. In this case, according to a result of measurement effected by the output power measuring system, the controller controls a power or wavelength of N channels of pumping light respectively outputted from N pumping light sources included in the pumping light source unit so as to attain a substantially flat output signal light spectrum. Also, the Raman amplifier may comprise an instruction signal input system for introducing an instruction signal from outside, and a controller. In this configuration, according to the instruction signal introduced from the instruction signal input system, the controller controls the power or wavelength of pumping light outputted from each of N pumping light sources included in the pumping light source unit so as to attain a substantially flat output signal light spectrum.

When the pumping light output is controlled according to a result of measurement of input signal light power, a result of measurement of output signal light power, or a control instruction based on the instruction signal as such, the pumping light spectrum of all the channels supplied from the pumping light source unit and the power spectrum of signal light outputted from the Raman amplifier can be controlled appropriately according to the state of signal light.

As a specific control method, the controller controls a power or wavelength of pumping light so as to attain a substantially flat output signal light spectrum. Preferably, at least one of channel wavelengths of pumping light is controlled such that a frequency yielding the lowest signal light power in the output signal light spectrum approaches a frequency higher by 13 THz to 15 THz than the former frequency.

Preferably, when the power of pumping light outputted from at least one of N pumping light sources included in the pumping light source unit decreases to a level failing to contribute to Raman amplification, the controller controls the power of pumping light outputted from a pumping light source other than the power-decreased pumping light source so as to attain a power fluctuation of 2 dB or less per channel of Raman-amplified signal light.

The optical transmission system according to the present invention comprises a plurality of relay sections, whereas an average fluctuation of output signal light power is 2 dB or less per relay section. Such an optical transmission system is constituted by six relay sections in general. Taking account of the fact that the optical power receivable by an avalanche photodiode utilized in a receiver has a dynamic range of about −17 to −32 dB, the power fluctuation of output signal light is required to be suppressed to about 2 dB per relay section, about 12 dB in the six relay sections in total.

The optical transmission system according to the present invention comprises an optical transmission system for propagating signal light within a predetermined signal wavelength band, and a Raman amplifier having one of the structures mentioned above placed at a predetermined position on the optical transmission line. In particular, the Raman amplifier may utilize the optical transmission line as a Raman amplification optical fiber, and comprise a structure for supplying pumping light to the optical transmission line. This realizes an optical transmission system comprising a distributed constant type optical amplifier adapted to control the power spectrum of signal light sufficiently within the signal light wavelength band with respect to the signal light transmitted through an optical transmission line such as an optical fiber transmission line.

The Raman amplifier included in the optical transmission system according to the present invention may comprise a Raman amplification optical fiber separate from the optical transmission line. This Raman optical fiber is optically coupled to the optical transmission line, and constitutes a part of the optical transmission line. This realizes an optical transmission system comprising a lumped constant type optical amplifier adapted to control the power spectrum of signal light sufficiently within the signal light wavelength band with respect to the signal light transmitted through an optical transmission line such as an optical fiber transmission line.

DETAILED DESCRIPTION OF THE PREFERRED EMBODIMENTS

Figure 1:
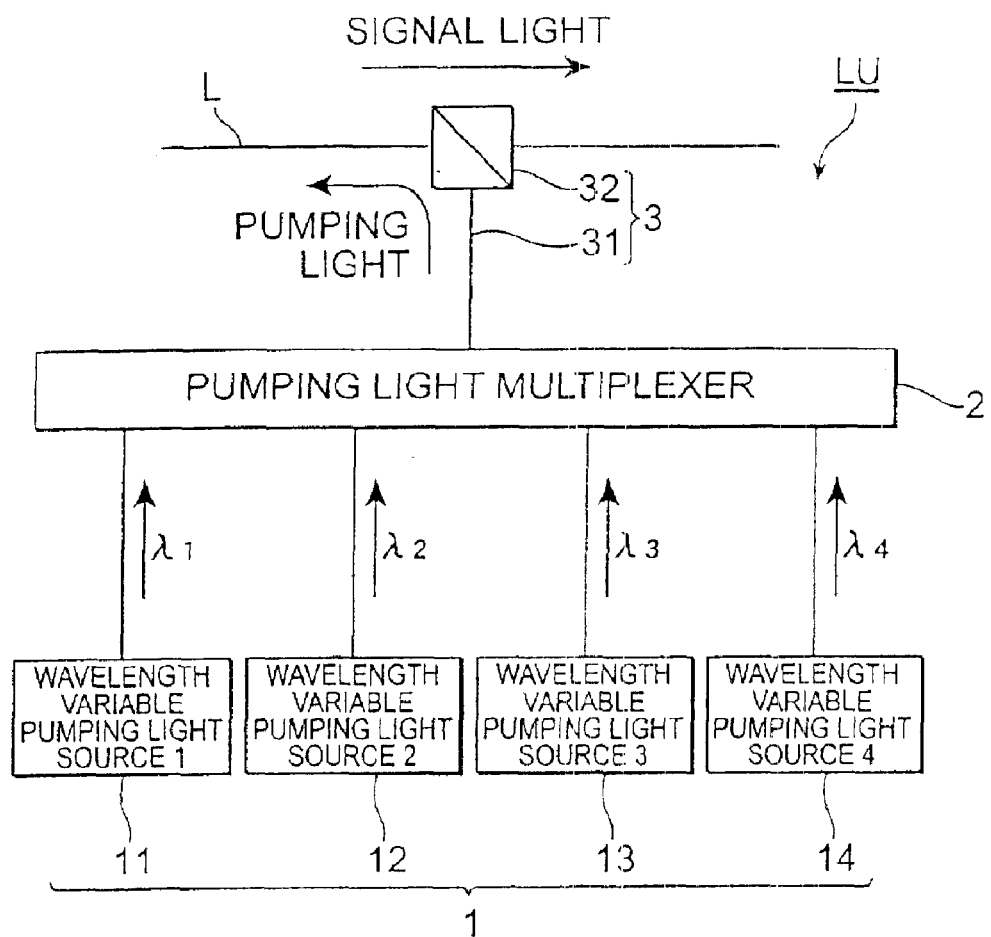
FIG. 1 is a diagram showing a first embodiment of the pumping light source unit according to the present invention.

In the following, embodiments of the pumping light source unit, Raman amplifier, and optical transmission system according to the present invention will be explained in detail with reference to FIGS. 1 to 19, 20A, 20B, 21 to 24, 25A, 25B, 26 to 36, and 37A to 38B. In the explanation of the drawings, constituents identical to each other will be referred to with numerals identical to each other without repeating their overlapping descriptions. Ratios of dimensions in the drawings do not always match those explained.

FIG. 1 is a diagram showing the configuration of a first embodiment of the pumping light source unit according to the present invention. The pumping light source unit LU according to the first embodiment is a light source-unit employed in a Raman amplifier for Raman-amplifying a plurality of channels of signal light (WDM signal) propagating through a Raman amplification optical fiber, and supplies the Raman amplification optical fiber with a plurality of channels of pumping light having respective wavelengths different from each other.

The pumping light source unit LU comprises a pumping light supply system 1 for supplying a plurality of channels of pumping light, a pumping light multiplexer 2 for multiplexing the plurality of channels of pumping light, and an output structure 3 for outputting thus multiplexed pumping light to an external optical transmission line L. The pumping light supply system 1 generating a plurality of channels of pumping light is constituted by a plurality of pumping light sources outputting respective pumping light components having wavelengths different from each other.

In the first embodiment shown in FIG. 1, the pumping light supply system 1 comprises four pumping light sources, i.e., a first pumping light-source 11 for outputting pumping light having a wavelength $\lambda_1$, a second pumping light source 12 for outputting pumping light having a wavelength $\lambda_2$ ($\lambda_2 > \lambda_1$), a third pumping light source 13 for outputting pumping light having a wavelength $\lambda_3$ ($\lambda_3 > \lambda_2$), and a fourth pumping light source 14 for outputting pumping light having a wavelength $\lambda_4$ ($\lambda_4 > \lambda_3$). These pumping light sources are wavelength variable pumping light sources configured such that their outputting wavelengths $\lambda_1$ to $\lambda_4$ of pumping light are variably controllable within their predetermined wavelength ranges.

The wavelengths $\lambda_1$ to $\lambda_4$ of pumping light (four-channel pumping light) respectively outputted from the four wavelength variable pumping light sources 11 to 14 are multiplexed in the pumping light multiplexer 2, so as to become pumping light having a predetermined power spectrum as a whole. Thus multiplexed pumping light is outputted by way of the output structure 3 to the optical transmission line 2 through which the signal light propagates. The output structure 3 includes an output optical waveguide 31 and an output multiplexer 32. As a consequence, the pumping light multiplexed by the multiplexer 2 is transmitted through the output optical waveguide 31 and then is multiplexed by the output multiplexer 32 with the signal light propagating through the optical transmission line L.

The pumping light supply system 1 in the pumping light source unit LU functioning as a pumping light source of the Raman amplifier is constituted by a plurality of pumping light sources 11 to 14 outputting respective channel wavelengths $\lambda_1$ to $\lambda_4$ of pumping light. Each of the pumping light sources 11 to 14 is a wavelength variable pumping light source. This configuration makes it possible to regulate not only the power of each pumping light but also wavelengths of pumping light outputted from the pumping light sources 11 to 14 as necessary, when adjusting the whole pumping light spectrum outputted from the pumping light source unit LU.

In general, when employing a pumping light source unit constituted by a plurality of pumping light sources in a Raman amplifier, it becomes necessary to flatten the gain spectrum within the amplification wavelength band, which is a wide band, or the power spectrum of output signal light. The power spectrum of signal light outputted from the Raman amplifier subjected to adjustment is determined by the power spectrum of pumping light supplied from the pumping light source unit. Therefore, for adjusting the power spectrum of signal light outputted from the Raman amplifier, it is necessary to regulate the power spectrum of pumping light outputted from the pumping light source unit.

Known as such a method of adjusting the pumping light spectrum is one adjusting the pumping light power of each channel outputted from the respective pumping light source included in the pumping light source. However, such an adjusting method may fail to attain sufficient controllability for the pumping light spectrum. For example, if the power of one of a plurality of pumping light sources included in the pumping light source unit comes down, the power spectrum of output signal light will greatly fall in the vicinity of a signal light wavelength corresponding to the channel wavelength of pumping light supplied by the power-decreased pumping light source. In such a case, the fall in the power spectrum of output signal light may not fully be compensated for even if the power of pumping light supplied by the pumping light sources other than the power-decreased one is adjusted.

By contrast, the pumping light source unit LU comprising a plurality of pumping light sources 11 to 14 each acting as a wavelength variable pumping light source realizes a pumping light source unit LU whose pumping light spectrum controllability is improved so as to be able to respond sufficiently to various changes including those in cases where the pumping light spectrum greatly changes in all the channels of pumping light outputted therefrom. Also, when such a pumping light source unit LU is employed in a Raman amplifier, the power fluctuation of output signal light within the amplification wavelength band in the Raman amplifier can fully be adjusted.

The pumping light spectrum adjustment and output signal light spectrum flattening in the pumping light source unit LU shown in FIG. 1 will now be explained with reference to FIGS. 2 and 3.

Figure 2:
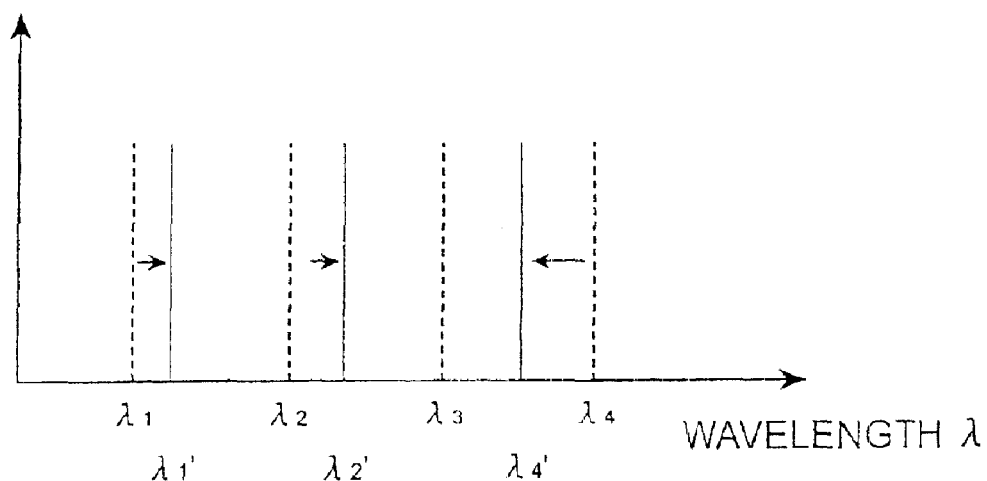
FIG. 2 shows power spectra of pumping light supplied from the pumping light source unit shown in FIG. 1.

FIG. 2 shows power spectra of pumping light source supplied from the pumping light source unit LU shown in FIG. 1, in which the abscissa indicates the pumping light wavelength $\lambda$. At the time when the pumping light source unit LU operates normally, four channels of pumping light having pumping light wavelengths $\lambda_1$ to $\lambda_4$ respectively indicated by broken lines in FIG. 2 are supplied from the four wavelength variable pumping light sources 11 to 14.

Here, suppose that the power of third pumping light source (wavelength variable pumping light source) 13 in the pumping light sources 11 to 14 comes down, whereby the wavelengths $\lambda_3$ of pumping light stops being supplied. In this case, the power spectrum of output signal light greatly falls in the vicinity of a signal light wavelength corresponding to the pumping light wavelength $\lambda_3$ in the Raman amplifier employing this pumping light source unit LU.

Figure 3:
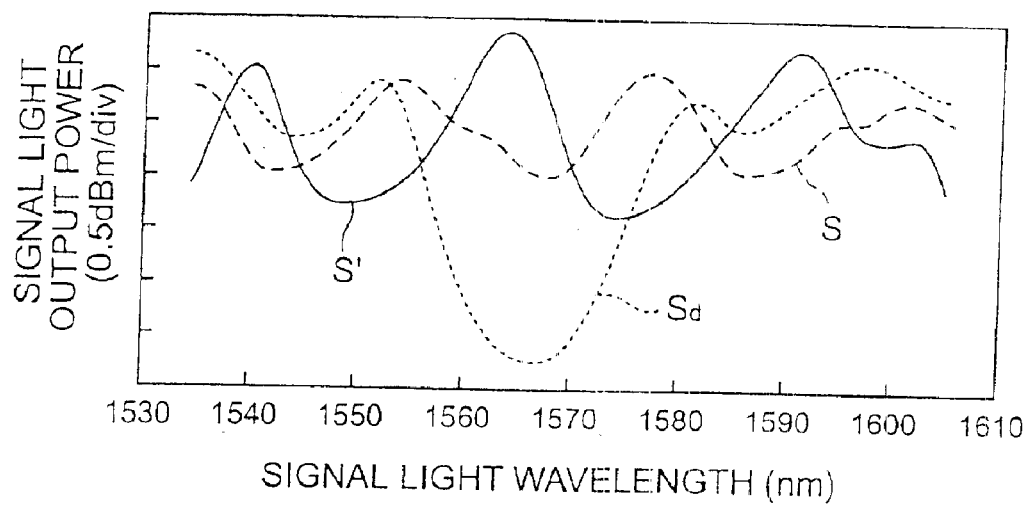
FIG. 3 shows an example of power spectra of output signal light in a Raman amplifier employing the pumping light source unit shown in FIG. 1.

FIG. 3 shows output signal light spectra in a Raman amplifier employing the pumping light source unit LU show in FIG. 1, in which the abscissa indicates the channel wavelength (nm) of signal light amplified by pumping light. On the other hand, the ordinate indicates the signal light output power (0.5 dBm/div) at each channel wavelength of signal light.

When the pumping light source unit LU, to which the four-channel pumping light having the wavelengths $\lambda_1$ to $\lambda_4$ is supplied, operates normally, the power of pumping light supplied from each of the pumping light sources 11 to 14 is optimized, whereby the power spectrum of signal light outputted from the Raman amplifier is substantially flattened as indicated by broken line S. If the pumping light source 13 fails at that time, so that the channel wavelength $\lambda_3$ of pumping light stops being supplied, the amplification gain and signal light output power will fall greatly in the vicinity of a signal light wavelength (near a wavelength of 1565 nm in FIG. 3) corresponding to the pumping light power wavelength $\lambda_3$ in the output signal light power spectrum as indicated by broken line Sd.

In the pumping light source unit LU according to the first embodiment, by contrast, three channels of pumping light having respective wavelengths of $\lambda_1$, $\lambda_2$, $\lambda_4$ supplied from the remaining three unfailing wavelength variable pumping light sources 11, 12, and 14 change their pumping light wavelengths along the wavelength axis so as to approach the wavelength $\lambda_3$, thereby being adjusted to $\lambda_1'$, $\lambda_2'$, $\lambda_4'$ as indicated by solid lines in FIG. 2, respectively. This adjusts the power spectrum as seen from all the channels of pumping light supplied from the pumping light source unit LU, whereby the power spectrum of signal light outputted from the Raman amplifier is flattened to the utmost as indicated by solid line S' in FIG. 3. Specifically, it is preferred that the remaining three unfailing wavelength variable pumping light sources 11, 12, and 14 be wavelength-controlled such that the power fluctuation per channel of Raman-amplified signal light becomes 2 dB or less.

The pumping light source unit LU according to the first embodiment utilizing a plurality of wavelength variable pumping light sources 11 to 14 exhibits an excellent controllability for output signal light spectra changed within the amplification wavelength band as mentioned above. Such a pumping light source unit LU is also effective in various adjustments to output signal light spectra other than the power spectrum flattening of output signal light.

For example, when output signal light spectra in at least two different wavelength bands are flattened so as be used as an amplification wavelength band (by utilizing at least two Raman amplifiers having the same configuration), the pumping light source unit LU having the above-mentioned structure can change the amplification wavelength band, which is a band where an output signal light spectrum is flattened, by shifting the pumping light spectrum as a whole with respect to the wavelength.

Though all of the plurality of pumping light sources 11 to 14 included in the pumping light supply system 1 are used as a wavelength variable pumping light source in the pumping light source unit LU shown in FIG. 1, the number of wavelength variable pumping light sources is flexible so that, as long as one of the plurality of pumping light sources is a wavelength variable pumping light source, the others may have their respective fixed channel wavelengths of pumping light. The number of such wavelength variable light sources or the ratio of wavelength variable pumping light sources in the pumping light supply system may be set as appropriate according to the channel interval (wavelength interval) of pumping light, the output signal light controllability required for the Raman amplifier employing the pumping light source unit, and the like.

In the pumping light source unit LU shown in FIG. 1, the output structure 3 for outputting the pumping light to the optical transmission line L comprises not only the output optical waveguide 31, but also the output multiplexer 32 for multiplexing the pumping light and signal light. As for the output multiplexer 32, only the output optical waveguide 31 may be disposed on the pumping light source unit LU side without providing a multiplexer there, so as to connect the output optical waveguide 31 of the pumping light source unit LU to a multiplexer disposed on the optical transmission line L side. Alternatively, the output end of the pumping light multiplexer 2 may be included in the output structure as it is.

Though FIG. 1 shows a configuration in which the pumping light from the output optical waveguide 31 is guided to the optical transmission line L in the direction opposite from the signal light transmission direction, the pumping light propagating direction may be a forward direction coinciding with the signal light transmission direction according to the configuration of Raman amplifier and the like.

Figure 4:
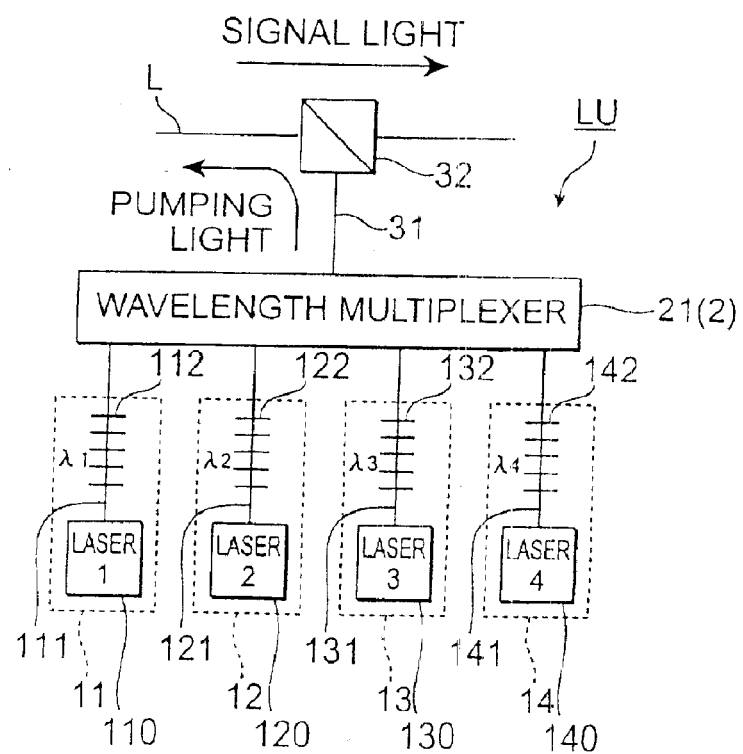
FIG. 4 is a diagram showing a second embodiment of the pumping light source unit according to the present invention.

FIG. 4 is a diagram showing the configuration of a second embodiment of the pumping light source unit according to the present invention. As in the first embodiment, the pumping light source unit LU according to the second embodiment comprises four wavelength variable pumping light sources for outputting respective channel wavelengths $\lambda_1$ to $\lambda_4$ ($\lambda_1<\lambda_2<\lambda_3<\lambda_4$) of pumping light as a plurality of pumping light sources constituting a pumping light supply system.

As a pumping light multiplexer 2 for multiplexing respective pumping light components outputted from the pumping light sources 11 to 14, a wavelength multiplexer 21 for multiplexing pumping light in terms of wavelength is provided.

The configuration of pumping light sources 11 to 14 will now be explained with reference to the first pumping light source 11 byway of example. In the second embodiment, the first wavelength variable pumping light source 11 has a first semiconductor laser 110 suitable for pumping laser as its pumping light generating source. Disposed between the semiconductor laser 110 and the wavelength multiplexer 21 is an optical waveguide 111 for guiding the pumping light from the pumping light source 11 to the wavelength multiplexer 21. Disposed at a predetermined position on the optical waveguide 111 is a resonance grating 112 for reflecting light outputted from the semiconductor laser 110. As the resonance grating, a Bragg grating reflecting light having a Bragg wavelength is preferred. The pumping light source 11 preferably comprises a channel wavelength adjusting system for adjusting the reflection wavelength of the resonance grating 112. Consequently, from the semiconductor laser 110 and the resonance grating 112 disposed on the optical waveguide 111, an external resonator type wavelength variable laser unit is obtained as the wavelength variable pumping light source 11 adapted to control the wavelength of pumping light outputted therefrom.

In the second embodiment, all of the four pumping light sources 11 to 14 are wavelength variable pumping light sources. The three pumping light sources 12 to 14 have the same configuration as that of the first wavelength variable pumping light source 11 mentioned above.

Namely, the second wavelength variable pumping light source 12 is an external resonator type wavelength variable laser unit comprising a second semiconductor laser 120 suitable for pumping laser, a resonance grating 122 disposed on the optical waveguide 121, and a channel wavelength adjusting system for adjusting the reflection wavelength of the resonance grating. The third wavelength variable pumping light source 13 is an external resonator type wavelength variable laser unit comprising a third semiconductor laser 130 suitable for pumping laser, a resonance grating 132 disposed on the optical waveguide 131, and a channel wavelength adjusting system for adjusting the reflection wavelength of the resonance grating. The fourth wavelength variable pumping light source 14 is an external resonator type wavelength variable laser unit comprising a fourth semiconductor laser 140 suitable for pumping laser, a resonance grating 142 disposed on the optical waveguide 141, and a channel wavelength adjusting system for adjusting the reflection wavelength of the resonance grating.

The respective channel wavelengths $\lambda_1$ to $\lambda_4$ of pumping light outputted from the four wavelength variable pumping light sources 11 to 14 are multiplexed by the wavelength multiplexer 21 acting as the pumping light multiplexer 2, while exhibiting a predetermined power spectrum in a wavelength band including all the channels. Thus multiplexed pumping light is outputted to an optical transmission line L by way of an output structure 3 constituted by an output optical waveguide 31 and an output multiplexer 32.

By variably controlling wavelengths of light reflected by the resonance gratings 112 to 142, the pumping light source unit LU according to the second embodiment can efficiently control the wavelengths $\lambda_1$ to $\lambda_4$ of pumping light outputted from the four wavelength variable pumping light sources 11 to 14, which are external resonator type laser units.

Figure 5:
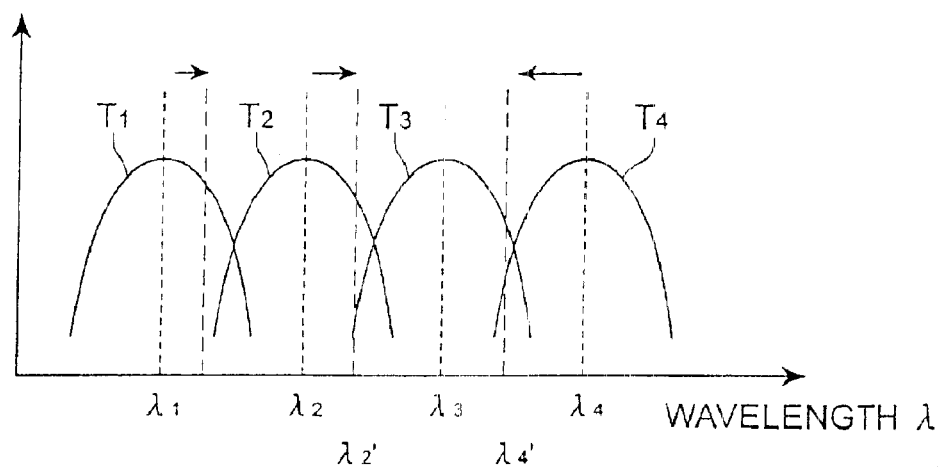
FIG. 5 shows power spectra of pumping light supplied from the pumping light source unit shown in FIG. 4.

FIG. 5 shows power spectra of pumping light supplied from the pumping light source unit LU according to the second embodiment shown in FIG. 4. FIG. 5 shows an example in which the respective channel wavelengths of pumping light are adjusted to wavelengths $\lambda_1'$, $\lambda_2'$, and $\lambda_4'$ (indicated by broken lines) when the power of channel wavelength $\lambda_3$ among channel wavelengths $\lambda_1$ to $\lambda_4$ (indicated by dotted lines) of pumping light comes down. It is preferred that the remaining three unfailing wavelength variable pumping light sources 11, 12, and 14 be wavelength-controlled such that the power fluctuation per channel of Raman-amplified signal light becomes 2 dB or less in the second embodiment as well.

When the external resonator type laser unit having the above-mentioned structure is employed as a wavelength variable pumping light source, the resonance grating for external resonance of pumping light is preferably a Bragg grating. Various forms of grating can be employed as a specific configuration of Bragg grating.

Figure 6:
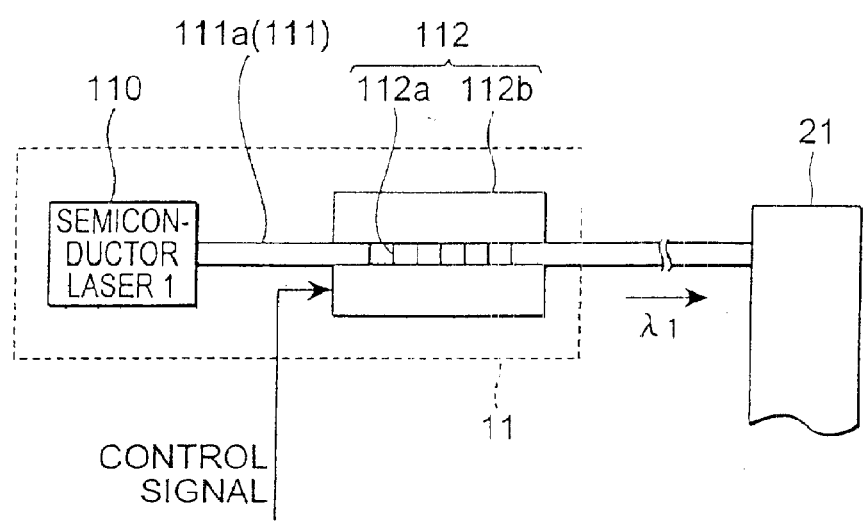
FIG. 6 is a diagram showing a first configuration of the wavelength variable pumping light source.

FIG. 6 is a diagram showing an example of first configuration of the wavelength variable pumping light source employed in the pumping light source unit LU shown in FIG. 4. FIG. 6 shows the configuration of the first wavelength variable pumping light source 11 alone among the four pumping light sources 11 to 14. The other pumping light sources 12 to 14 have the same structure as that of the first wavelength variable pumping light source 11 shown in FIG. 6.

The first wavelength variable pumping light source 11 is an external resonator type wavelength variable laser unit comprising a first semiconductor laser 110, and a resonance grating 112 disposed on the optical waveguide 111; and generating the channel wavelength $\lambda_1$ of pumping light due to the external resonance between the semiconductor laser 110 and resonance grating 112.

As the optical waveguide 111 for guiding the pumping light outputted from the pumping light source 11 to the wavelength multiplexer 21, FIG. 6 shows an optical fiber 111a disposed between the semiconductor laser 110 and the wavelength multiplexer 21. A predetermined part of the optical fiber 111a is formed with a fiber Bragg grating 112a as a resonance grating 112.

The pumping light source 11 further comprises a channel wavelength adjusting system 112b for adjusting the reflection wavelength of the fiber Bragg grating 112a. The channel wavelength adjusting system 112b is controlled by a control signal from the outside. As a consequence, the reflection wavelength of the resonance grating yielding the channel wavelength $\lambda_1$ of pumping light is adjusted.

In a simple configuration, such a fiber grating can realize both a configuration of external resonance in the pumping light source 11, which is a wavelength variable laser unit, and a configuration of the optical waveguide 111 for outputting pumping light from the pumping light source 11 to the pumping light multiplexer 21.

Employable as the channel wavelength adjusting system 112b is stress applying means, for example. By applying a predetermined stress to the optical fiber 111a, the stress applying means causes the optical fiber 111a to expand/contract. As a result, the grating period of the fiber Bragg grating 112a changes, whereby the reflection wavelength of resonance grating 112 is adjusted. The channel wavelength $\lambda_1$ of pumping light supplied from the pumping light source 11 is controlled by the external resonator constituted by the resonance grating 112 with thus adjusted reflection wavelength and the semiconductor laser 110.

Also employable as the channel wavelength adjusting system 112b is heating means. By heating the optical fiber 111a, the heating means changes the grating refractive index of fiber Bragg grating 112a (the refractive index of the core region in the optical fiber 111a formed with the fiber Bragg grating 112a). This changes the reflection wavelength of resonance grating 112, thereby controlling the channel wavelength of pumping light supplied from the pumping light source 11.

When controlling the channel wavelength of pumping light supplied from the pumping light source by utilizing channel wavelength adjusting means such as a resonance grating as shown in FIG. 6, transmission wavelength characteristics of light in the pumping light multiplexer 2 such as the wavelength multiplexer 21 might become problematic.

FIG. 5 shows transmission wavelength characteristics $T_1$ to $T_4$ as an example of transmission wavelength characteristics (multiplexing wavelength characteristics) in the wavelength multiplexer 21 with respect to channel wavelengths $\lambda_1$ to $\lambda_4$ of pumping light before wavelength adjustment, and channel wavelengths $\lambda_1'$, $\lambda_2'$, and $\lambda_4'$ of pumping light after wavelength adjustment.

In general, these transmission wavelength characteristics $T_1$ to $T_4$ are optimized such that the channel wavelengths $\lambda_1$ to $\lambda_4$ of pumping light are favorably multiplexed at the time when the pumping light source unit LU operates normally. However, when the power of channel wavelength $\lambda_3$ comes down and the other channel wavelengths are changed to $\lambda_1'$, $\lambda_2'$, and $\lambda_4'$, respectively, in order to adjust the pumping light spectrum in response thereto, there are cases where the wavelength multiplexer 21 fails to attain a sufficient transmission characteristic with respect to pumping light yielding a large amount of change in the channel wavelength.

For example, concerning the channel wavelength $\lambda_4$ of pumping light near the channel wavelength $\lambda_3$ of pumping light whose power has come down, the amount of change in channel wavelength from $\lambda_4$ to $\lambda_4'$ due to the wavelength adjustment is greater as shown in FIG. 5. When there is a possibility of greatly changing the channel wavelength of pumping light as such, the wavelength multiplexer 21 preferably comprises a structure adapted to adjust transmission wavelength characteristics in order to secure a sufficient transmission characteristic with respect to each channel of pumping light in the pumping light multiplexer 2.

Figure 7:
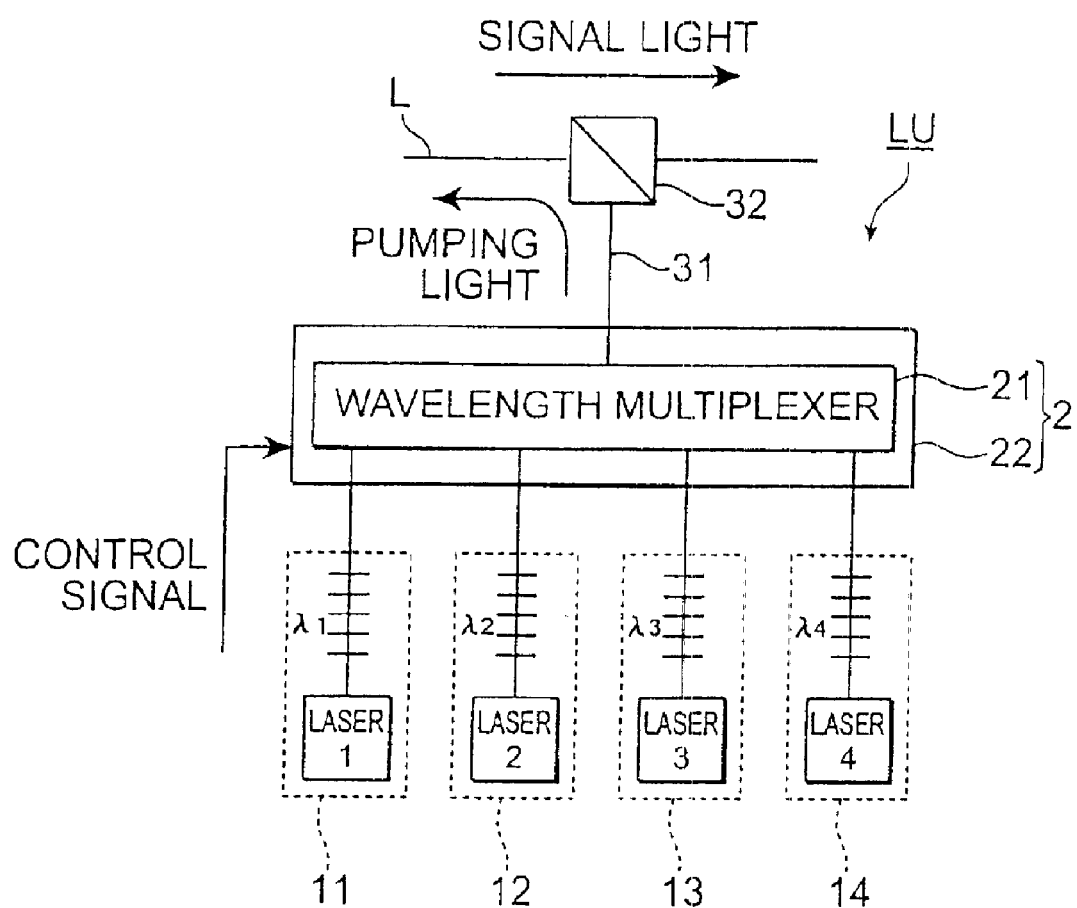
FIG. 7 is a diagram showing the configuration of a modified example of the pumping light source unit according to the second embodiment.

FIG. 7 is a diagram showing an example of configuration of a pumping light source unit having a pumping light multiplexer adapted to adjust a transmission wavelength characteristic. In the configuration of FIG. 7, the wavelength multiplexer 21 is provided with a transmission characteristic adjusting system 22 for adjusting the transmission characteristic of the former. The wavelength multiplexer 21 and the transmission characteristic adjusting system 22 constitute a pumping light multiplexer 2 adapted to adjust a transmission wavelength characteristic. The transmission characteristic adjusting system 22 is controlled by a control signal from the outside. As a consequence, the transmission characteristic in the pumping light multiplexer 2 is optimally controlled in response to changes in the respective channel wavelengths $\lambda_1$ to $\lambda_4$ of pumping light outputted from the pumping light sources 11 to 14.

Without being restricted to the external resonator type wavelength variable laser unit utilizing a fiber Bragg grating shown in FIG. 6, various pumping light sources are applicable as wavelength variable pumping light sources employed in the pumping light source unit.

Figure 8:
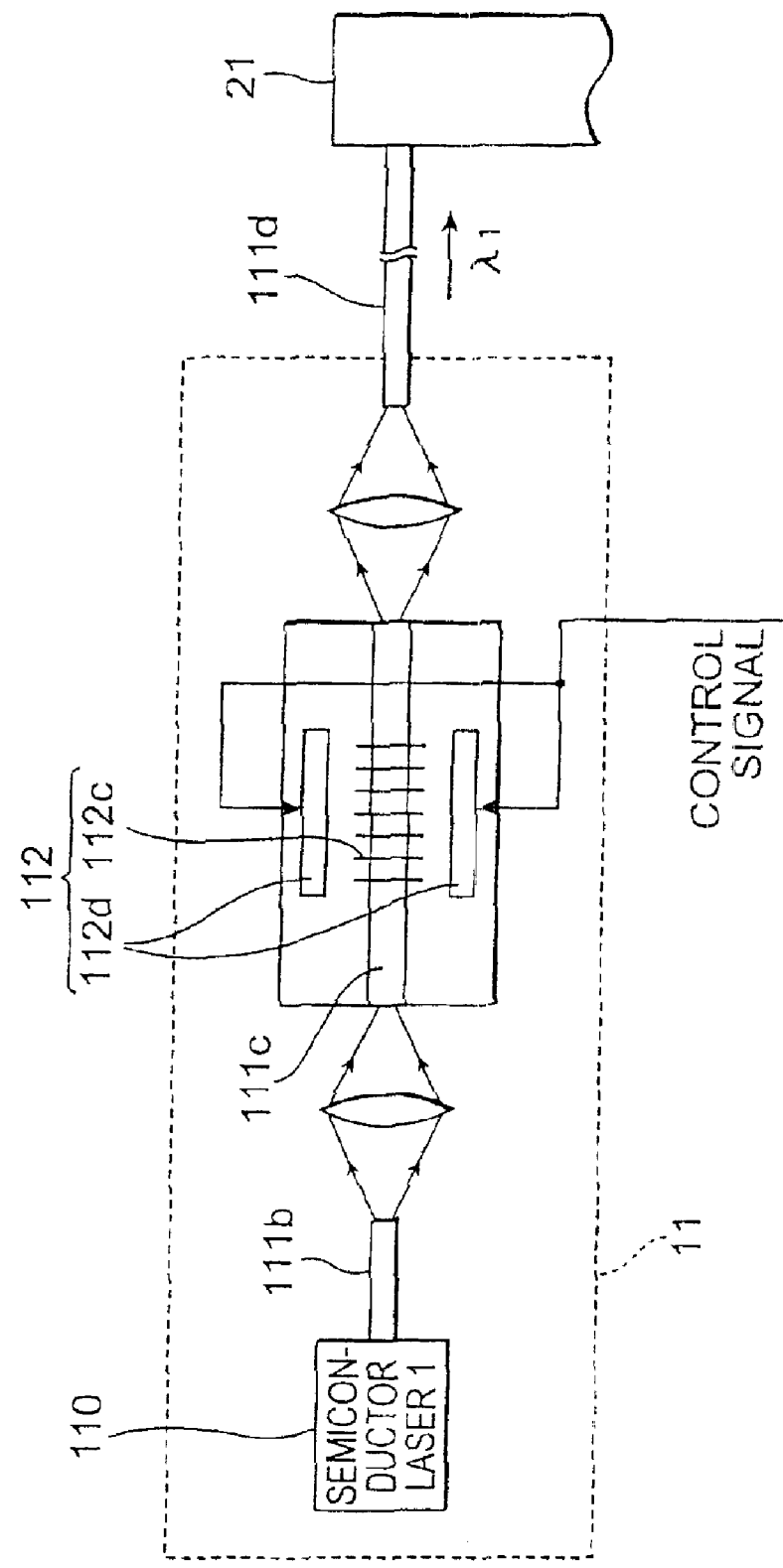
FIG. 8 is a diagram showing a second configuration of the wavelength variable pumping light source.

FIG. 8 is a diagram showing a second configuration of wavelength variable pumping light source employable in the pumping light source unit shown in FIG. 4. In this case, the wavelength variable pumping light source 11 comprises a first semiconductor laser 110, a resonance grating 112 disposed on an optical waveguide 111, and a channel wavelength adjusting system as an electric field applying means 112d, whereas the wavelength variable pumping light source 11 is an external resonator wavelength variable laser unit generating the channel wavelength $\lambda_1'$ of pumping light due to the external resonance utilizing the first semiconductor laser 110 and resonance grating 112.

In FIG. 8, as the optical waveguide 111 for guiding the pumping light outputted from the pumping light source 11 to the wavelength multiplexer 21, an optical fiber 111b, an optical waveguide 111c, and an optical fiber 111d are disposed successively from the semiconductor laser 110 toward the wavelength multiplexer 21.

Among these optical waveguides, the optical waveguide 111c is an optical waveguide formed on a predetermined substrate from a material having an electrooptic effect. Also, a predetermined part of the optical waveguide 111c is formed with a Bragg grating 112c as a resonance grating 112.

The electric field applying means acting as a channel wavelength adjusting system comprises a pair of electrodes 112d disposed on the same substrate across the Bragg grating 112c. The electrodes 112d are controlled by a control signal from the outside. As a consequence, the reflection wavelength in the resonance grating 112 yielding the channel wavelength $\lambda_1$ of pumping light is variably controlled. Namely, when the electrodes 112d acting as the electric field applying means applies an electric field having a predetermined intensity to the optical waveguide having an electrooptic effect, the reflection wavelength of Bragg grating 112c changes. This can variably control the channel wavelength $\lambda_1$ of pumping light supplied from the pumping light source 11.

In a simple configuration, such a grating can also realize both a configuration of external resonance in the pumping light source 11, which is a wavelength variable laser unit, and a configuration of the optical waveguide 111 for outputting pumping light from the pumping light source 11 to the pumping light multiplexer 21.

Figure 9:
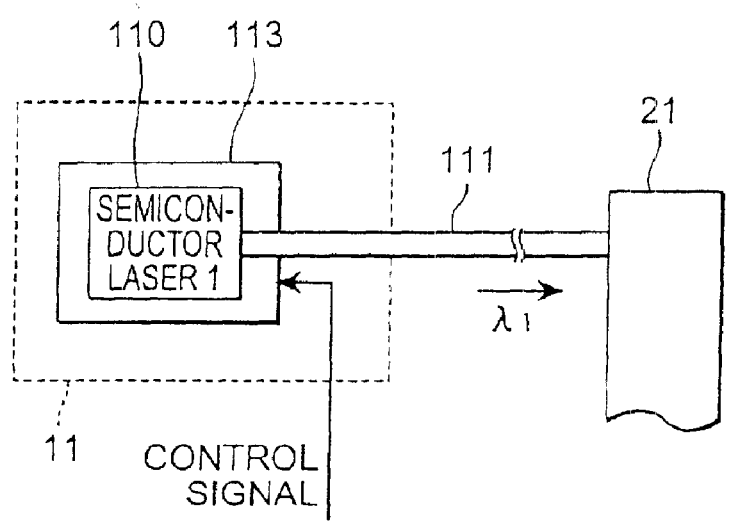
FIG. 9 is a diagram showing a third configuration of the wavelength variable pumping light source.

FIG. 9 is a diagram showing a third configuration of wavelength variable pumping light source employable in the pumping light source unit shown in FIG. 4. This wavelength variable pumping light source 11 comprises a first semiconductor laser 110, and a heating means 113 for adjusting the temperature of a chip of the semiconductor laser 110 as a channel wavelength adjusting system. The heating means 113 is controlled by a control signal from the outside. As a consequence, the oscillation wavelength in the semiconductor laser 110 yielding the channel wavelength $\lambda_1$ of pumping light is variably controlled.

Figure 10:
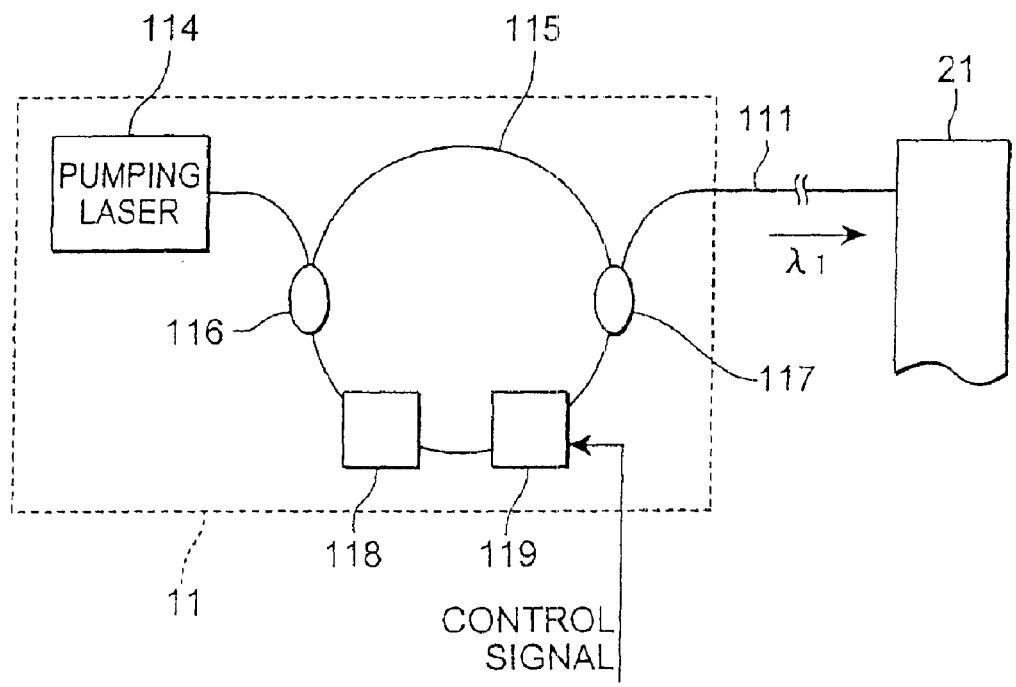
FIG. 10 is a diagram showing a fourth configuration of the wavelength variable pumping light source.

FIG. 10 is a diagram showing a fourth configuration of wavelength variable pumping light source employable in the pumping light source unit shown in FIG. 4. This wavelength variable pumping light source 11 is a fiber ring wavelength variable laser unit generating the channel wavelength $\lambda_1$ of pumping light by utilizing a first pumping laser 114 and a ring-shaped optical fiber 115.

The ring-shaped optical fiber 115 includes a rare-earth-doped optical fiber having an optically amplifying function. A wavelength multiplexer 116 is placed at a predetermined position of the ring-shaped optical fiber 115 on the pumping laser 114 side. The light outputted from the pumping laser 114 is supplied to the ring-shaped optical fiber 115 by way of the wavelength multiplexer 116, and is amplified in the ring-shaped optical fiber 115, which is a rare-earth-doped optical fiber. At predetermined positions on the ring-shaped optical fiber 115, an optical isolator 118 and a bandpass filter 119 are placed, whereby the channel wavelength $\lambda_1$ of pumping light generated in the pumping light source 11 is determined according to the transmission wavelength characteristic of the bandpass filter 119.

At a predetermined position of the ring-shaped optical fiber 115 on the wavelength multiplexer 21 side, a branching device 117 for branching light at a predetermined ratio is placed. The channel wavelength $\lambda_1$ of light amplified by the ring-shaped optical fiber 115 is branched by the branching device 117 to an optical waveguide 111, so as to be outputted to the wavelength multiplexer 21 as pumping light.

In the wavelength variable pumping light source 11 of FIG. 10, a wavelength variable bandpass filter (included in a channel wavelength adjusting system) adapted to change its transmission wavelength is utilized as the bandpass filter 119 for determining the channel wavelength $\lambda_1$ of light amplified by the ring-shaped optical fiber 115. The bandpass filter 119 is controlled by a control signal from the outside. As a consequence, the channel wavelength $\lambda_1$ of pumping light is variably controlled in the ring-shaped optical fiber 115.

As the bandpass filter 119 having a variable transmission wavelength characteristic, an optical filter made of a dielectric multilayer film is utilizable. The dielectric multilayer film filter can control its transmission wavelength characteristic variably and easily by rotating the angle of filter with respect to the optical path of the light to be transmitted therethrough. Bandpass filters other than the dielectric multilayer film filters can also be utilized.

Embodiments of the pumping light source unit will further be explained.

Figure 11:
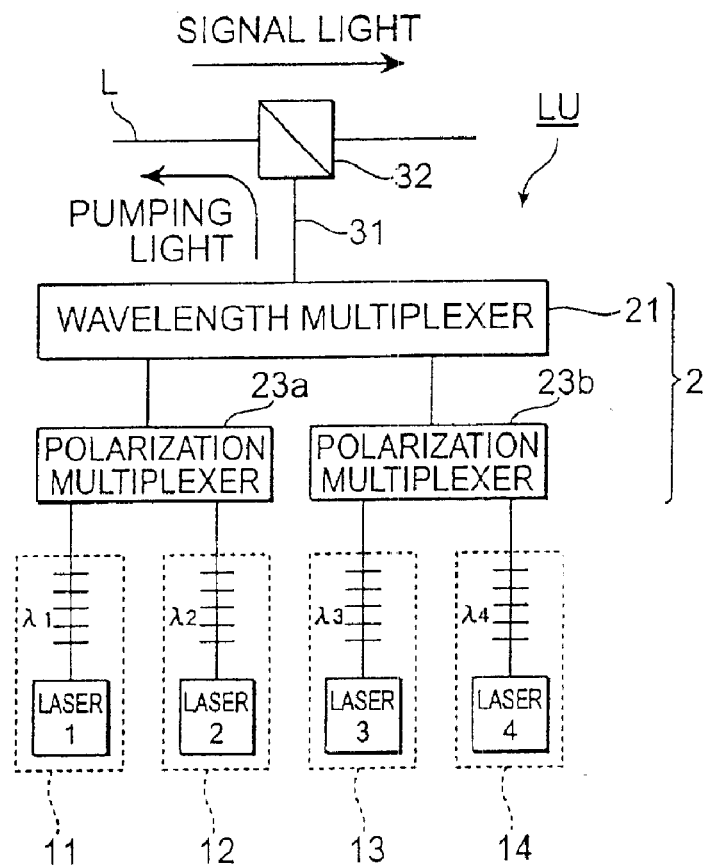
FIG. 11 is a diagram showing the configuration of a fourth embodiment of the pumping light source unit according to the present invention.

FIG. 11 is a diagram showing the configuration of a third embodiment of the pumping light source unit according to the present invention. The pumping light source unit LU according to the third embodiment comprises four wavelength variable pumping light sources 11 to 14 for outputting respective channel wavelengths $\lambda_1$ to $\lambda_4$ ($\lambda_1<\lambda_2<\lambda_3<\lambda_4$) of pumping light as a plurality of pumping light sources constituting a pumping light supply system. The configuration of each of the pumping light sources 11 to 14 is the same as that of the second embodiment shown in FIG. 4.

A pumping light multiplexer 2 for multiplexing respective pumping light components outputted from the pumping light sources 11 to 14 is constituted by two polarization multiplexers 23a, 23b each multiplexing two channels of pumping light having respective wavelengths adjacent each other, and a wavelength multiplexer 21 for multiplexing the pumping light in terms of wavelength.

The channel wavelengths $\lambda_1, \lambda_2$ of pumping light adjacent each other outputted from the pumping light sources 11, 12 among the four wavelength variable pumping light sources 11 to 14 are polarization-multiplexed by the polarization multiplexer 23a. The channel wavelengths $\lambda_3, \lambda_4$ of pumping light adjacent each other outputted from the pumping light sources 13, 14 among the four wavelength variable pumping light sources 11 to 14 are polarization-multiplexed by the polarization multiplexer 23b.

The pumping light having the channel wavelengths $\lambda_1, \lambda_2$ outputted from the polarization multiplexer 23a and the pumping light having the channel wavelengths $\lambda_3, \lambda_4$ outputted from the polarization multiplexer 23b are multiplexed by the wavelength multiplexer 21, whereby pumping light having a predetermined pumping light spectrum as a whole is outputted from the wavelength multiplexer 21. Thus multiplexed pumping light is outputted to an optical transmission line L by way of an output structure constituted by an output optical waveguide 31 and an output multiplexer 32.

In the case where the polarization multiplexers 23a, 23b are employed in the pumping light multiplexer 2 for multiplexing the pumping light as such, it is unnecessary to adjust transmission characteristics in the polarization multiplexing of pumping light effected by the polarization multiplexers 23a, 23b even-when the respective channel wavelengths of pumping light supplied from the individual pumping light sources 11 to 14 have changed. As a consequence, pumping light can easily be multiplexed when the pumping light multiplexer 2 is constituted by a combination of a plurality of polarization multiplexers 23a, 23b and the wavelength multiplexer 21.

Figure 12:
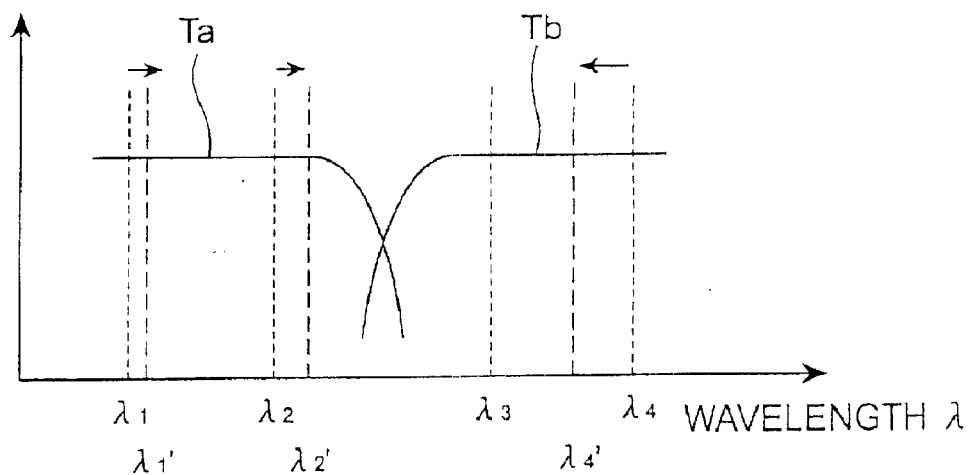
FIG. 12 shows spectra of pumping light supplied from the pumping light source unit shown in FIG. 11.

FIG. 12 shows power spectra of pumping light supplied from the pumping light source unit LU shown in FIG. 11. As with FIG. 5, FIG. 12 shows an example in which the channel wavelengths $\lambda_1$, $\lambda_2$, and $\lambda_4$ in the channel wavelengths $\lambda_1$ to $\lambda_4$ are adjusted to $\lambda_1'$, $\lambda_2'$, and $\lambda_4'$ when the power of channel wavelength $\lambda_3$ comes down. FIG. 12 also shows respective transmission wavelength characteristics $T_a$, $T_b$ of the wavelength multiplexer 21 with respect to the pumping light components outputted from the polarization multiplexers 23a, 23b.

Preferably, the transmission wavelength characteristics $T_a$, $T_b$ of the wavelength multiplexer 21 extend over a relatively large wavelength range as shown in FIG. 12, since the pumping light is polarization-multiplexed in the polarization multiplexers 23a, 23b in its upstream stage. In this case, a sufficient transmission characteristic is obtained even when channel wavelength of pumping light fluctuates greatly to a certain extent.

Figure 13:
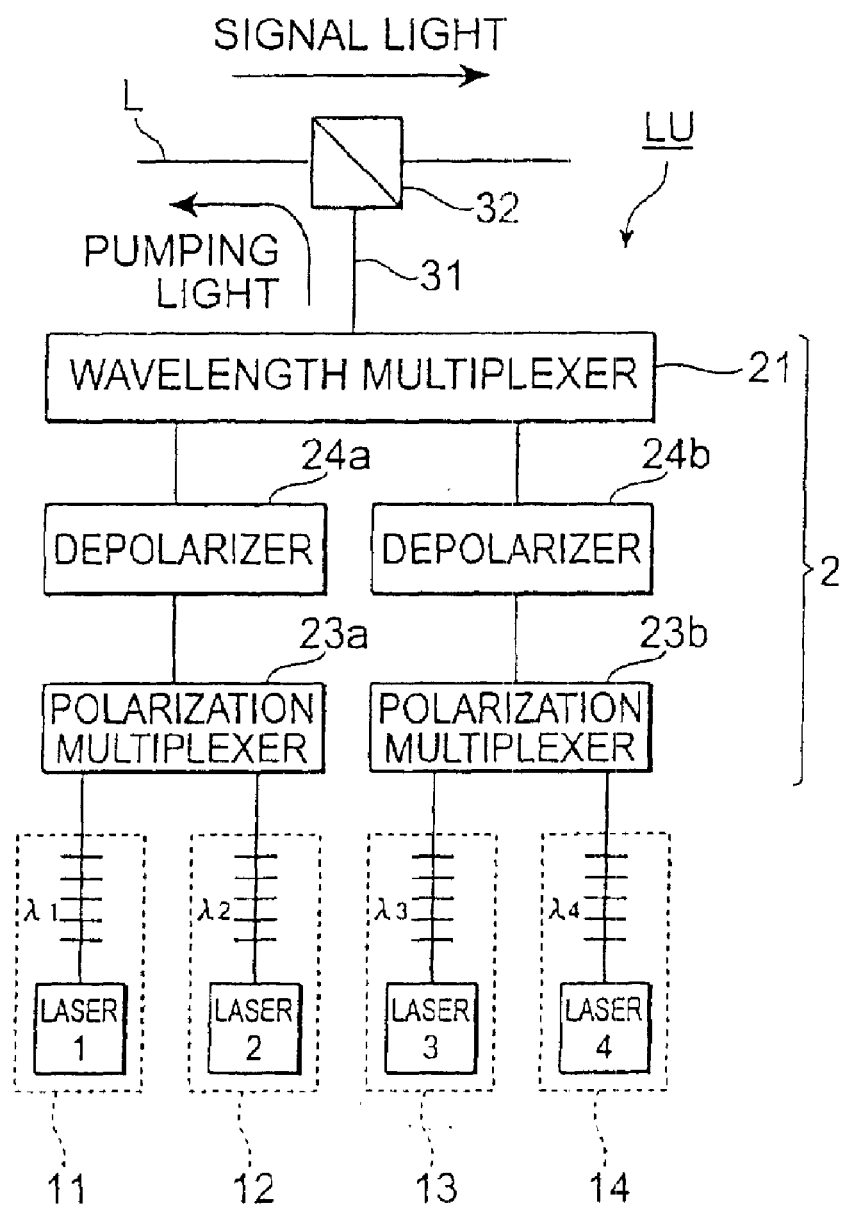
FIG. 13 is a diagram showing the configuration of a fourth embodiment of the pumping light source unit according to the present invention.

FIG. 13 is a diagram showing the configuration of a fourth embodiment of the pumping light source unit according to the present invention. The pumping light source unit LU according to the fourth embodiment comprises four wavelength variable pumping light sources 11 to 14 for outputting respective channel wavelengths $\lambda_1$ to $\lambda_4$ ($\lambda_1<\lambda_2<\lambda_3<\lambda_4$) of pumping light as a plurality of pumping light sources constituting a pumping light supply system. The configuration of each of the pumping light sources 11 to 14 is the same as that of the second embodiment shown in FIG. 4.

A pumping light multiplexer 2 for multiplexing respective pumping light components outputted from the pumping light sources 11 to 14 comprises two polarization multiplexers 23a, 23b each multiplexing two channels of pumping light having respective wavelengths adjacent each other, and a wavelength multiplexer 21 for multiplexing the pumping light in terms of wavelength. The pumping light multiplexer 2 according to the fourth embodiment further comprises depolarizers 24a, 24b placed between the respective polarization multiplexers 23a, 23b and the wavelength multiplexer 21.

The channel wavelengths $\lambda_1$, $\lambda_2$ of pumping light adjacent each other outputted from the pumping light sources 11, 12 among the four wavelength variable pumping light sources 11 to 14 are polarization-multiplexed by the polarization multiplexer 23a, and thus multiplexed light is depolarized by the depolarizer 24a. The channel wavelengths $\lambda_3$, $\lambda_4$ of pumping light adjacent each other outputted from the pumping light sources 13, 14 are polarization-multiplexed by the polarization multiplexer 23b, and thus multiplexed light is depolarized by the depolarizer 24b.

The pumping light having the channel wavelengths $\lambda_1$, $\lambda_2$ outputted from the polarization multiplexer 23a by way of the polarizer 24a and the pumping light having the channel wavelengths $\lambda_3$, $\lambda_4$ outputted from the polarization multiplexer 23b by way of the polarizer 24b are multiplexed by the wavelength multiplexer 21, whereby pumping light having a predetermined pumping light spectrum as a whole is outputted from the wavelength multiplexer 21. Thus multiplexed pumping light is outputted to an optical transmission line L byway of an output structure constituted by an output optical waveguide 31 and an output multiplexer 32.

In the configuration employing the polarization multiplexers 23a, 23b in the pumping light multiplexer 2, polarization multiplexing is carried out for two different channels of pumping light, whereby the state of polarization may differ between the pumping light polarization-multiplexed by the polarization multiplexer 23a and the pumping light polarization-multiplexed by the polarization multiplexer 23b. In this case, there is a possibility of Raman amplification gain varying under the influence of the state of polarization of pumping light. By contrast, a configuration in which the depolarizers 24a, 24b are placed in the downstream stage of the polarization multiplexers 23a, 23b as in the pumping light source unit according to the fourth embodiment effectively reduces the influence of polarization dependence of Raman amplification gain.

Figure 14:
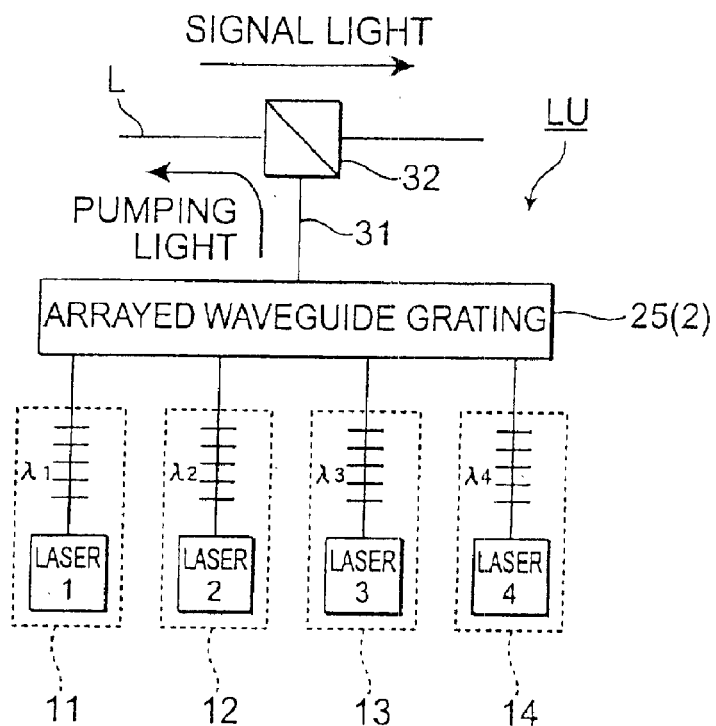
FIG. 14 is a diagram showing the configuration of a fifth embodiment of the pumping light source unit according to the present invention.

FIG. 14 is a diagram showing the configuration of a fifth embodiment of the pumping light source unit according to the present invention. The pumping light source unit LU according to the fifth embodiment comprises four wavelength variable pumping light sources 11 to 14 for outputting respective channel wavelengths $\lambda_1$ to $\lambda_4$ ($\lambda_1<\lambda_2<\lambda_3<\lambda_4$) of pumping light as a plurality of pumping light sources constituting a pumping light supply system. The configuration of each of the pumping light sources 11 to 14 is the same as that of the second embodiment shown in FIG. 4.

Also, in the fifth embodiment, an arrayed waveguide grating (AWG) 25 is provided as a pumping light multiplexer 2 for multiplexing respective pumping light components outputted from the pumping light sources 11 to 14.

The channel wavelengths $\lambda_1$ to $\lambda_4$ of pumping light outputted from the four wavelength variable pumping light sources 11 to 14 are multiplexed by the AWG 25 acting as the pumping light multiplexer 2, whereby pumping light having a predetermined pumping light spectrum as a whole is outputted from the pumping light multiplexer 2. Thus multiplexed pumping light is outputted to an optical transmission line L by way of an output structure constituted by an output optical waveguide 31 and an output multiplexer 32.

Figure 15:
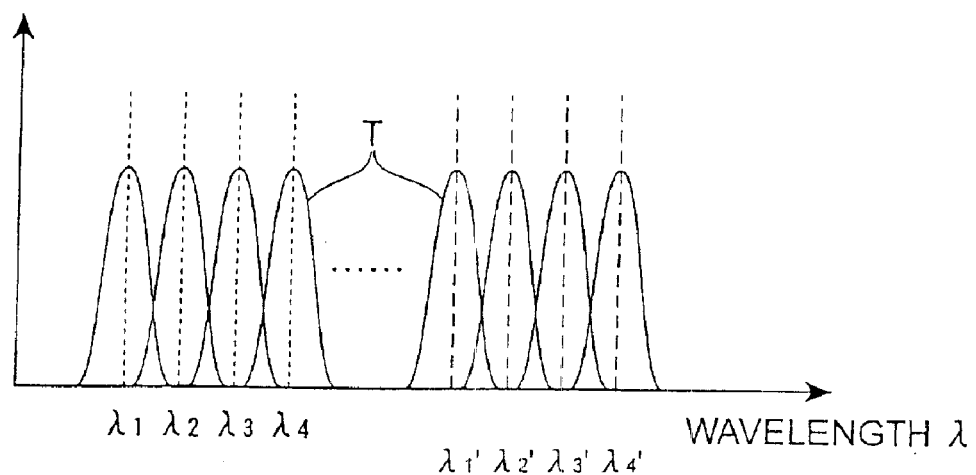
FIG. 15 shows spectra of pumping light supplied from the pumping light source unit shown in FIG. 14.

FIG. 15 shows power spectra of pumping light supplied from the pumping light source unit LU shown in FIG. 14. FIG. 15 shows an example in which the channel wavelengths $\lambda_1$ to $\lambda_4$ of pumping light are changed to wavelengths $\lambda_1'$ to $\lambda_4'$ shifted as a whole. FIG. 15 also shows the transmission wavelength characteristic T of the AWG 25.

The AWG 25 has a periodic transmission wavelength characteristic T with respect to channel wavelength $\lambda$. Therefore, if the channel interval (wavelength interval) of respective channel wavelengths $\lambda_1$ to $\lambda_4$ of pumping light supplied from the pumping light sources 11 to 14 or the amount of change in channel wavelength upon changing the channel wavelengths to wavelengths $\lambda_1'$ to $\lambda_4'$, respectively, coincides with the wavelength period of transmission characteristic T in the AWG 25, the respective pumping light components from the pumping light sources 11 to 14 can be multiplexed favorably even when the channel wavelengths of pumping light are changed as a whole. Such a multiplexing characteristic is effective in particular when individual channel wavelengths of pumping light are shifted as a whole as shown in FIG. 15, so as to shift the amplification wavelength band in a Raman amplifier.

Figure 16:
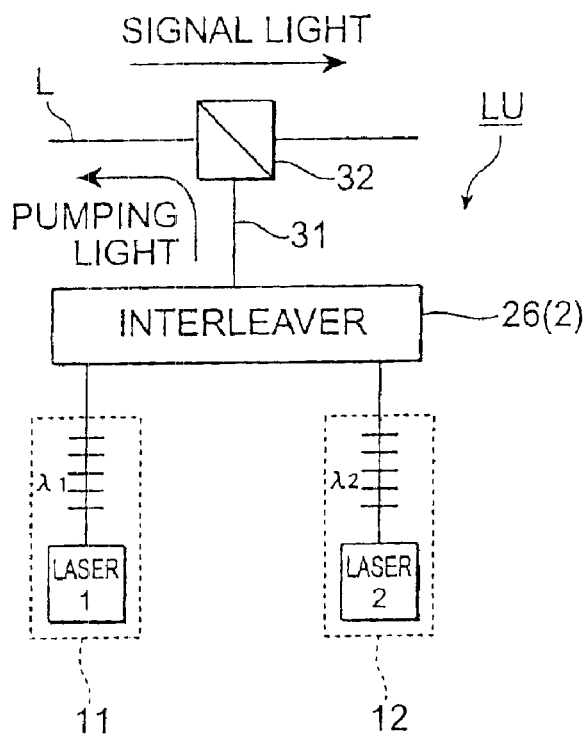
FIG. 16 is a diagram showing the configuration of a sixth embodiment of the pumping light source unit according to the present invention.

FIG. 16 is a diagram showing the configuration of a sixth embodiment of the pumping light source unit according to the present invention. The pumping light source unit LU according to the sixth embodiment comprises two wavelength variable pumping light sources 11, 12 for outputting respective channel wavelengths $\lambda_1$, $\lambda_2$ ($\lambda_1 < \lambda_2$) of pumping light as a plurality of pumping light sources constituting a pumping light supply system. The configuration of each of the pumping light sources 11, 12 is the same as that of the second embodiment shown in FIG. 4.

In the sixth embodiment, an interleaver 26 is provided as a pumping light multiplexer 2 for multiplexing respective pumping light components outputted from the pumping light sources 11, 12.

The channel wavelengths $\lambda_1$, $\lambda_2$ of pumping light respectively outputted from the two wavelength variable pumping light sources 11, 12 are multiplexed by the interleaver 26 acting as the pumping light multiplexer 2, whereby pumping light having a predetermined pumping light spectrum as a whole is outputted from the interleaver 26. Thus multiplexed pumping light is outputted to an optical transmission line L by way of an output structure constituted by an output optical waveguide 31 and an output multiplexer 32.

Figure 17:
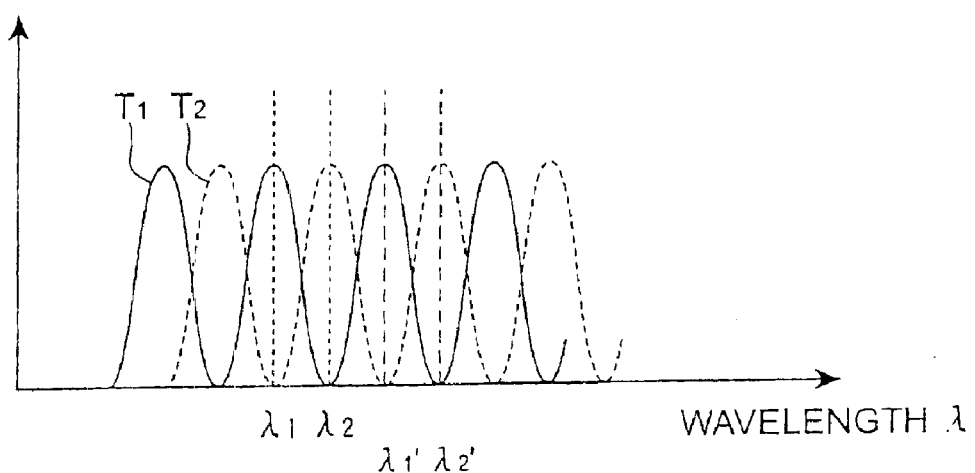
FIG. 17 shows spectra of pumping light supplied from the pumping light source unit shown in FIG. 16.

FIG. 17 shows power spectra of pumping light supplied from the pumping light source unit LU shown in FIG. 16. FIG. 17 shows an example in which the channel wavelengths $\lambda_1$, $\lambda_2$ of two-channel pumping light are shifted to wavelengths $\lambda_1'$, $\lambda_2'$ as a whole. FIG. 17 also shows transmission characteristics $T_1$ (solid line), $T_2$ (broken line) of the interleaver 26 with respect to respective pumping light components outputted from the pumping light sources 11, 12.

As shown in FIG. 17, the interleaver 26 has periodic transmission wavelength characteristics $T_1$, $T_2$ with respect to channel wavelength $\lambda$. Also, the transmission wavelength characteristics $T_1$, $T_2$ have a shorter wavelength period as compared with those of AWG. Therefore, the interleaver 26 can respond to a shorter channel interval (wavelength interval) of pumping light or a smaller shift amount (amount of change) in channel wavelengths as compared with the case where AWG is employed as the pumping light multiplexer 2.

Figure 18:
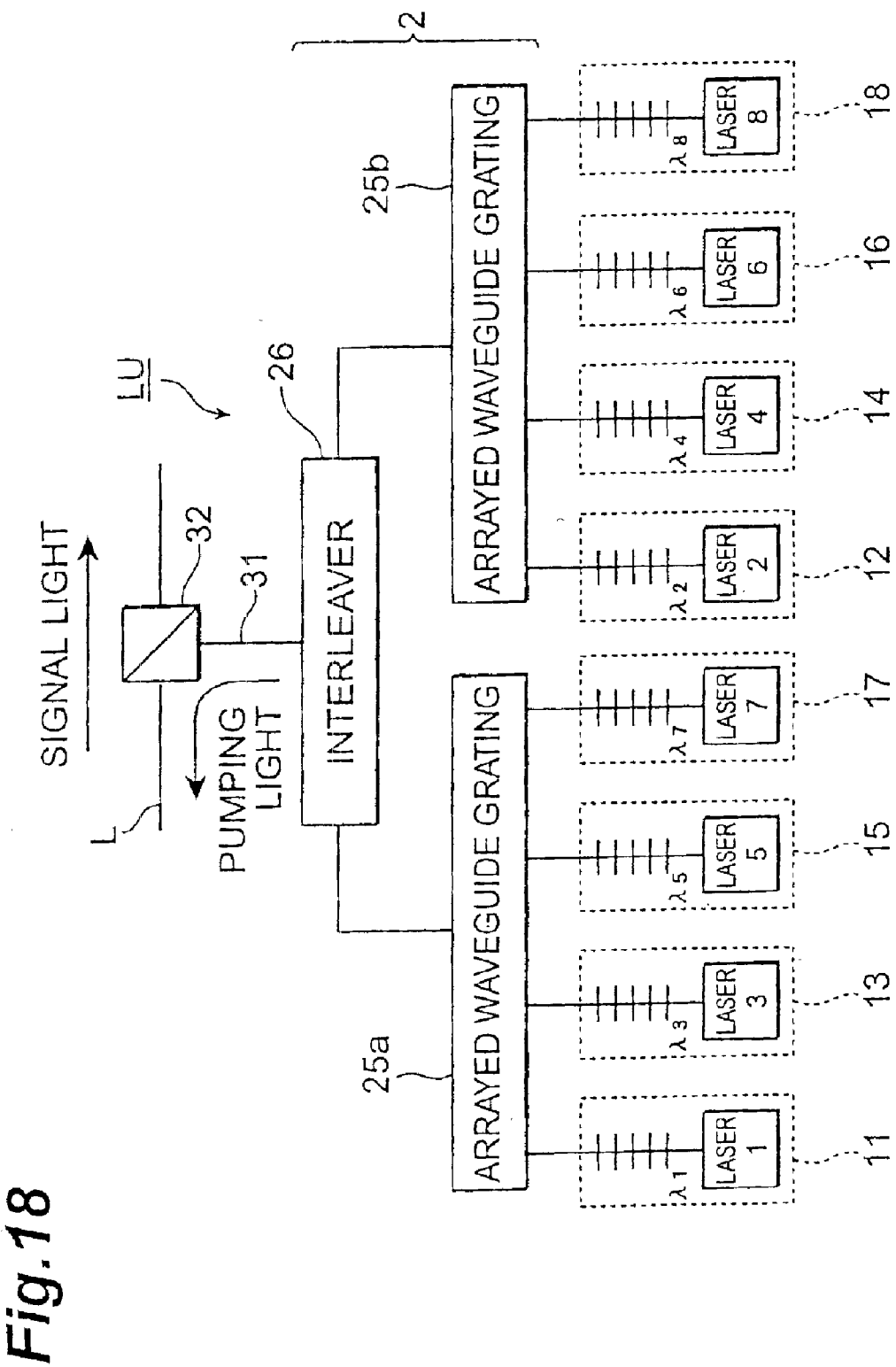
FIG. 18 is a diagram showing the configuration of a seventh embodiment of the pumping light source unit according to the present invention.

FIG. 18 is a diagram showing the configuration of a seventh embodiment of the pumping light source unit according to the present invention. The pumping light source unit LU according to the seventh embodiment comprises eight wavelength variable pumping light sources 11 to 18 for outputting respective channel wavelengths $\lambda_1$ to $\lambda_8$ ($\lambda_1 < \lambda_2 < \lambda_3 < \lambda_4 < \lambda_5 < \lambda_6 < \lambda_7 < \lambda_8$) of pumping light as a plurality of pumping light sources constituting a pumping light supply system. The configuration of each of the pumping light sources 11 to 18 is the same as that of the second embodiment shown in FIG. 4.

Also, in the seventh embodiment, two arrayed waveguide gratings (AWGs) 25a, 25b and an interleaver 26 are provided as a pumping light multiplexer 2 for multiplexing respective pumping light components outputted from the pumping light sources 11 to 18.

Every other channel wavelengths $\lambda_1$, $\lambda_3$, $\lambda_5$, $\lambda_7$ of pumping light outputted from the pumping light sources 11, 13, 15, 17 among the eight wavelength variable pumping light sources 11 to 18 are multiplexed by the AWG 25a. Every other channel wavelengths $\lambda_2$, $\lambda_4$, $\lambda_6$, $\lambda_8$ of pumping light outputted from the pumping light sources 12, 14, 16, 18 are multiplexed by the AWG 25b.

Further, the pumping light having channel wavelengths $\lambda_1$, $\lambda_3$, $\lambda_5$, $\lambda_7$ outputted from the AWG 25a and the pumping light having channel wavelengths $\lambda_2$, $\lambda_4$, $\lambda_6$, $\lambda_8$ outputted from the AWG 25b are multiplexed by the interleaver 26, whereby pumping light having a predetermined pumping light spectrum as a whole is out putted from the interleaver 26. Thus multiplexed pumping light is outputted to an optical transmission line L by way of an output structure constituted by an output optical waveguide 31 and an output multiplexer 32.

When a single interleaver is employed as the pumping light multiplexer 2 as shown in FIG. 16, the number of pumping light components which can be multiplexed is limited to 2. In the configuration in which the AWGs 25a, 25b in the upstream stage and the interleaver 26 in the downstream stage are combined with each other as shown in FIG. 18, a given number of channels of pumping light can be multiplexed while utilizing a multiplexing characteristic of the interleaver adapted to respond to pumping light exhibiting a shorter channel interval (wavelength interval) or a smaller amount of wavelength change.

Figure 19:
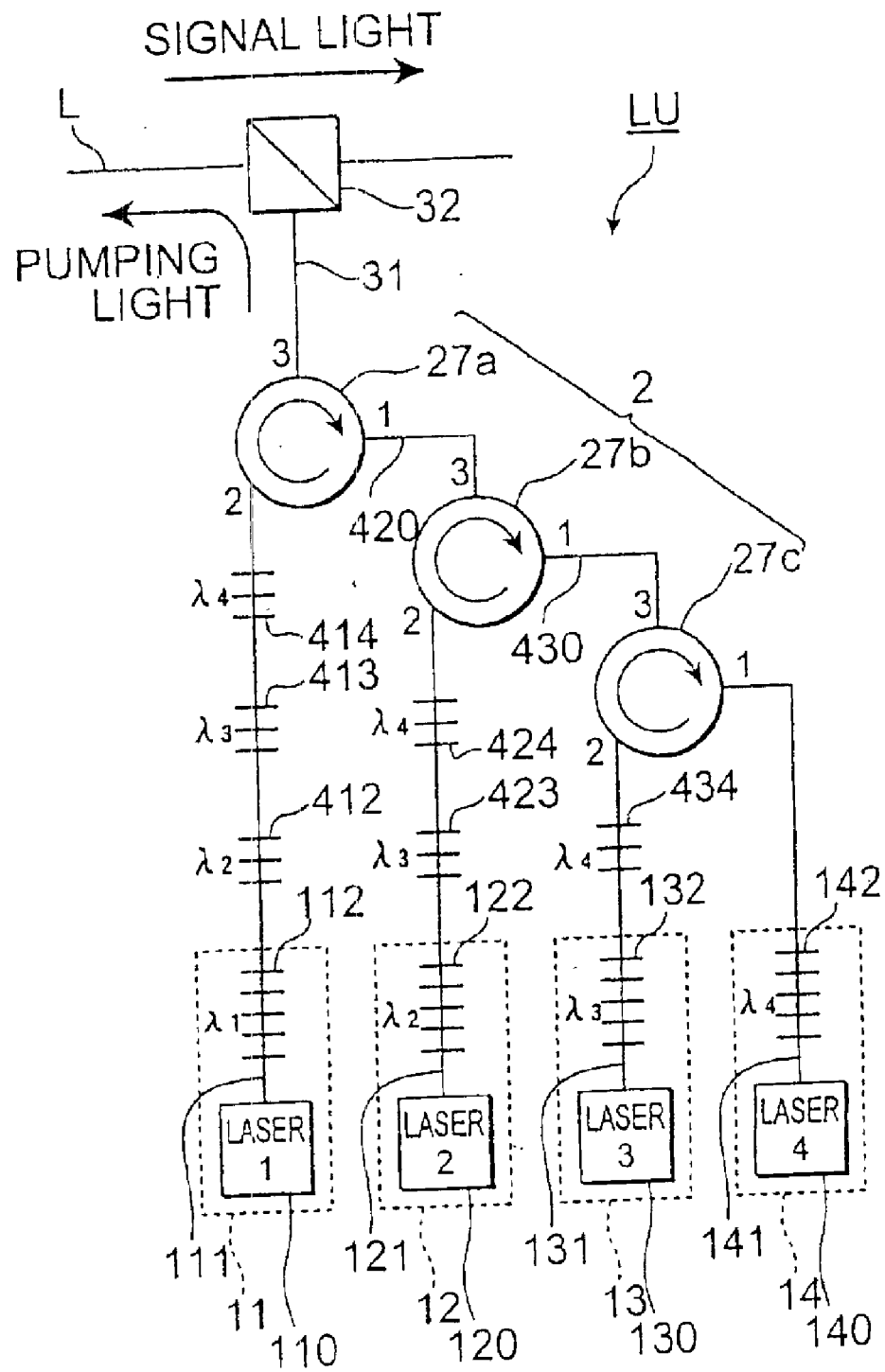
FIG. 19 is a diagram showing the configuration of an eighth embodiment of the pumping light source unit according to the present invention.

FIG. 19 is a diagram showing the configuration of an eighth embodiment of the pumping light source unit according to the present invention. The pumping light source unit LU according to the eighth embodiment comprises four (N) wavelength variable pumping light sources 11 to 14 for outputting respective channel wavelengths $\lambda_1$ to $\lambda_4$ ($\lambda_1 < \lambda_2 < \lambda_3 < \lambda_4$) of pumping light as a plurality of pumping light sources constituting a pumping light supply system. The configuration of each of the pumping light sources 11 to 14 is the same as that of the second embodiment shown in FIG. 4.

Also, in the eighth embodiment, three (N−1) 3-port optical circulators 27a, 27b, 27c are provided as a pumping light multiplexer 2 for multiplexing respective pumping light source components outputted from the pumping light sources 11 to 14. These optical circulators 27a, 27b, 27c are connected in three stages (N−1 stages) so that the respective pumping light components outputted from the pumping light sources 11 to 14, which are four (N) external resonator type laser units, are multiplexed successively.

Namely, in the optical circulator 27c in the first stage, an optical waveguide 141 from the pumping light source 14 is connected to the first port, an optical waveguide 131 from the pumping light source 13 is connected to the second port, and an optical waveguide 430 is connected to the third port. In the optical circulator 27b in the second stage, the optical waveguide 430 from the optical circulator 27c is connected to the first port, an optical waveguide 121 from the pumping light source 12 is connected to the second port, and an optical waveguide 420 is connected to the third port. In the optical circulator 27a in the third stage, the optical waveguide 420 from the optical circulator 27b is connected to the first port, an optical waveguide 111 from the pumping light source 11 is connected to the second port, and an output optical waveguide 31 is connected to the third port.

Placed between the resonance grating 112 of the pumping light source 11 and the optical circulator 27a are a reflection grating 412 for reflecting the channel wavelength $\lambda_2$ of pumping light, a reflection grating 413 for reflecting the channel wavelength $\lambda_3$ of pumping light, and a reflection grating 414 for reflecting the channel wavelength $\lambda_4$ of pumping light. Placed between the resonance grating 122 of the pumping light source 12 and the optical circulator 27b are a reflection grating 423 for reflecting the channel wavelength $\lambda_3$ of pumping light and a reflection grating 424 for reflecting the channel wavelength $\lambda_4$ of pumping light. Placed between the resonance grating 132 of the pumping light source 13 and the optical circulator 27c is a reflection grating 434 for reflecting the channel wavelength $\lambda_4$ of pumping light. Preferably, each reflection grating is a Bragg grating reflecting its corresponding channel wavelength of light by substantially 100%.

In the foregoing configuration, the channel wavelength $\lambda_1$ of pumping light supplied from the pumping light source 11 is outputted to the output optical waveguide 31 by way of the optical circulator 27a.

The channel wavelength $\lambda_2$ of pumping light supplied from the pumping light source 12 is outputted to the optical waveguide 31 by way of the optical circulator 27b, optical waveguide 420, and optical circulator 27a. Then, the channel wavelength $\lambda_2$ of pumping light is reflected by the reflection grating 412, so as to be fed into the optical circulator 27a again, and is outputted to the output optical waveguide 31 by way of the optical circulator 27a.

The channel wavelength $\lambda_3$ of pumping light supplied from the pumping light source 13 is outputted to the optical waveguide 121 by way of the optical circulator 27c, optical waveguide 430, and optical circulator 27b. Then, the channel wavelength $\lambda_3$ of pumping light is reflected by the reflection grating 423, so as to be fed into the optical circulator 27b again, and is outputted to the optical waveguide 111 by way of the optical circulator 27b, optical waveguide 420, and optical circulator 27a. Further, the channel wavelength $\lambda_3$ of pumping light is reflected by the reflection grating 413, so as to be fed into the optical circulator 27a again, and is outputted to the output optical waveguide 31 by way of the optical circulator 27a.

The channel wavelength $\lambda_4$ of pumping light supplied from the pumping light source 14 is outputted to the optical waveguide 131 by way of the optical circulator 27c. The channel wavelength $\lambda_4$ of pumping light is reflected by the reflection grating 434, so as to be fed into the optical circulator 27c again, and is outputted to the optical waveguide 121 by way of the optical circulator 27c, optical waveguide 430, and optical circulator 27b. Further, the channel wavelength $\lambda_4$ of pumping light is reflected by the reflection grating 424, so as to be fed into the optical circulator 27b again, and is outputted to the optical waveguide 111 by way of the optical circulator 27b, optical waveguide 420, and optical circulator 27a. Thereafter, the channel wavelength $\lambda_4$ of pumping light is reflected by the reflection grating 414, so as to be fed into the optical circulator 27a again, and is outputted to the output optical waveguide 31 by way of the optical circulator 27a.

As in the foregoing, the respective channel wavelengths $\lambda_1$ to $\lambda_4$ of pumping light outputted from four wavelength variable pumping light sources 11 to 14 are multiplexed by three 3-port optical circulators 27a, 27b, 27c constituting the pumping light multiplexer 2, whereby pumping light having a predetermined pumping light spectrum as a whole is outputted from the pumping light multiplexer 2. Thus multiplexed pumping light is outputted to an optical transmission line L by way of an output structure 3 constituted by the output optical waveguide 31 and an output multiplexer 32.

Thus, a configuration employing (N−1) 3-port optical circulators as the pumping light multiplexer 2 with respect to N pumping light sources can favorably multiplex respective pumping light components from the pumping light sources as well. As the reflection gratings, various gratings are employable as with the resonance gratings in pumping light sources.

Preferably, the wavelength of light reflected by each reflection grating is variably controlled in synchronization with the reflection wavelength of the respective resonance grating when its corresponding pumping light source is a wavelength variable pumping light source. In the eighth embodiment, since all of the pumping light sources 11 to 14 are wavelength variable pumping light sources, a channel wavelength adjusting system variably controlling all the reflection gratings as mentioned above is provided. As a consequence, the respective pumping light source components supplied from the pumping light sources 11 to 14 can efficiently be guided to the output optical waveguide 31.

Specifically, it is preferred that the reflection grating 412 for reflecting the channel wavelength $\lambda_2$ of pumping light be controlled in synchronization with the resonance grating 122 of the pumping light source 12. Preferably, the reflection gratings 413, 423 for reflecting the channel wavelength $\lambda_3$ of pumping light are controlled in synchronization with the resonance grating 132 of the pumping light source 13. Preferably, the reflection gratings 414, 424, 434 for reflecting the channel wavelength $\lambda_4$ of pumping light are controlled in synchronization with the resonance grating 142 of the pumping light source 14.

Figure 20A:
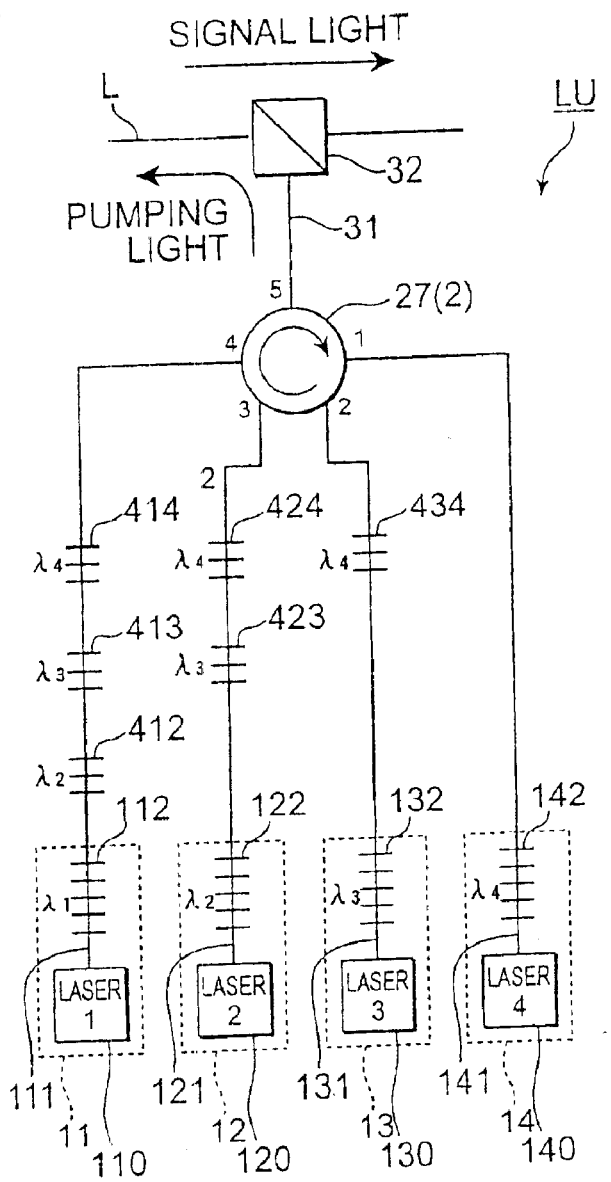
FIGS. 20A and 20B are diagrams showing configurations of a ninth embodiment of the pumping light source unit according to the present invention.

FIG. 20A is a diagram showing the configuration of a ninth embodiment of the pumping light source unit according to the present invention. The pumping light source unit LU according to the ninth embodiment comprises four (N) wavelength variable pumping light sources 11 to 14 for outputting respective channel wavelengths $\lambda_1$ to $\lambda_4$ ($\lambda_1 < \lambda_2 < \lambda_3 < \lambda_4$) of pumping light as a plurality of pumping light sources constituting a pumping light supply system. The configuration of each of the pumping light sources 11 to 14 is the same as that of the second embodiment shown in FIG. 4.

As a pumping light multiplexer 2 for multiplexing respective pumping light components outputted from the pumping light sources 11 to 14, a single 5-port ((N+1)-port) optical circulator 27 is provided. The optical circulator 27 is connected to the pumping light sources 11 to 14, which are four (N) external resonator type laser units, so as to multiplex the respective pumping light components outputted therefrom.

Namely, in the optical circulator 27, an optical waveguide 141 from the pumping light source 14 is connected to the first port, an optical waveguide 131 from the pumping light source 13 is connected to the second port, an optical waveguide 121 from the pumping light source 12 is connected to the third port, an optical waveguide 111 from the pumping light source 11 is connected to the fourth port, and an output optical waveguide 31 is connected to the fifth port.

Disposed between the resonance grating 112 of the pumping light source 11 and the optical circulator 27 are a reflection grating 412 for reflecting the channel wavelength $\lambda_2$ of pumping light, a reflection grating 413 for reflecting the channel wavelength $\lambda_3$ of pumping light, and a reflection grating 414 for reflecting the channel wavelength $\lambda_4$ of pumping light. Disposed between the resonance grating 122 of the pumping light source 12 and the optical circulator 27 are a reflection grating 423 for reflecting the channel wavelength $\lambda_3$ of pumping light, and a reflection grating 424 for reflecting the channel wavelength $\lambda_4$ of pumping light. Disposed between the resonance grating 132 of the pumping light source 13 and the optical circulator 27 is a reflection grating 434 for reflecting the channel wavelength $\lambda_4$ of pumping light.

In the foregoing configuration, the channel wavelength $\lambda_1$ of pumping light supplied from the pumping light source 11 is outputted to the output optical waveguide 31 by way of the optical circulator 27.

The channel wavelength $\lambda_2$ of pumping light supplied from the pumping light source 12 is outputted to the optical waveguide 111 by way of the optical circulator 27. Then, the channel wavelength $\lambda_2$ of pumping light is reflected by the reflection grating 412, so as to be fed into the optical circulator 27 again, and is outputted to the output optical waveguide 31 by way of the optical circulator 27.

The channel wavelength $\lambda_3$ of pumping light supplied from the pumping light source 13 is outputted to the optical waveguide 121 by way of the optical circulator 27. Then, the channel wavelength $\lambda_3$ of pumping light is reflected by the reflection grating 423, so as to be fed into the optical circulator 27 again, and is outputted to the optical waveguide 111 by way of the optical circulator 27. Further, the channel wavelength $\lambda_3$ of pumping light is reflected by the reflection grating 413, so as to be fed into the optical circulator 27 again, and is outputted to the output optical waveguide 31 by way of the optical circulator 27.

The channel wavelength $\lambda_4$ of pumping light supplied from the pumping light source 14 is outputted to the optical waveguide 131 by way of the optical circulator 27. Then, the channel wavelength $\lambda_4$ of pumping light is reflected by the reflection grating 434, so as to be fed into the optical circulator 27 again, and is outputted to the optical waveguide 121 byway of the optical circulator 27. Further, the channel wavelength $\lambda_4$ of pumping light is reflected by the reflection grating 424, so as to be fed into the optical circulator 27 again, and is outputted to the optical waveguide 111 by way of the optical circulator 27. Thereafter, the channel wavelength $\lambda_4$ of pumping light is reflected by the reflection grating 414, so as to be fed into the optical circulator 27 again, and is outputted to the output optical waveguide 31 by way of the optical circulator 27.

As in the foregoing, the respective channel wavelengths $\lambda_1$ to $\lambda_4$ of pumping light outputted from four wavelength variable pumping light sources 11 to 14 are multiplexed by the single 5-port optical circulator 27 constituting the pumping light multiplexer 2, whereby pumping light having a predetermined pumping light spectrum as a whole is outputted from the 5-port optical circulator 27. Thus multiplexed pumping light is outputted to an optical transmission line L by way of an output structure 3 constituted by the output optical waveguide 31 and an output multiplexer 32. Thus, as with the configuration employing (N−1) 3-port optical circulators, a configuration employing a single (N+1)-port optical circulator as the pumping light multiplexer 2 with respect to N pumping light sources can favorably multiplex the respective pumping light components from the pumping light sources.

Figure 20B:
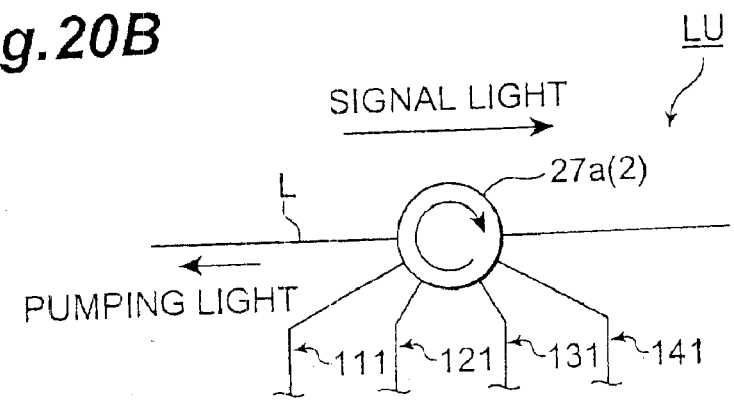

Without being restricted to the embodiments shown in FIGS. 19 and 20A, various configurations are possible in the pumping light multiplexer 2 employing optical circulators. For example, FIG. 20B shows an (N+2)-port optical circulator 27a in place of the (N+1)-port optical circulator 27 and output structure (including the output optical waveguide 31 and output multiplexer 32) shown in FIG. 20A. This (N+2)-port optical circulator 27a can function as the output optical waveguide 31 and output multiplexer 32 constituting an output structure, while realizing the pumping light multiplexing function of the (N+1)-port optical circulator 27 in FIG. 20A.

Figure 21:
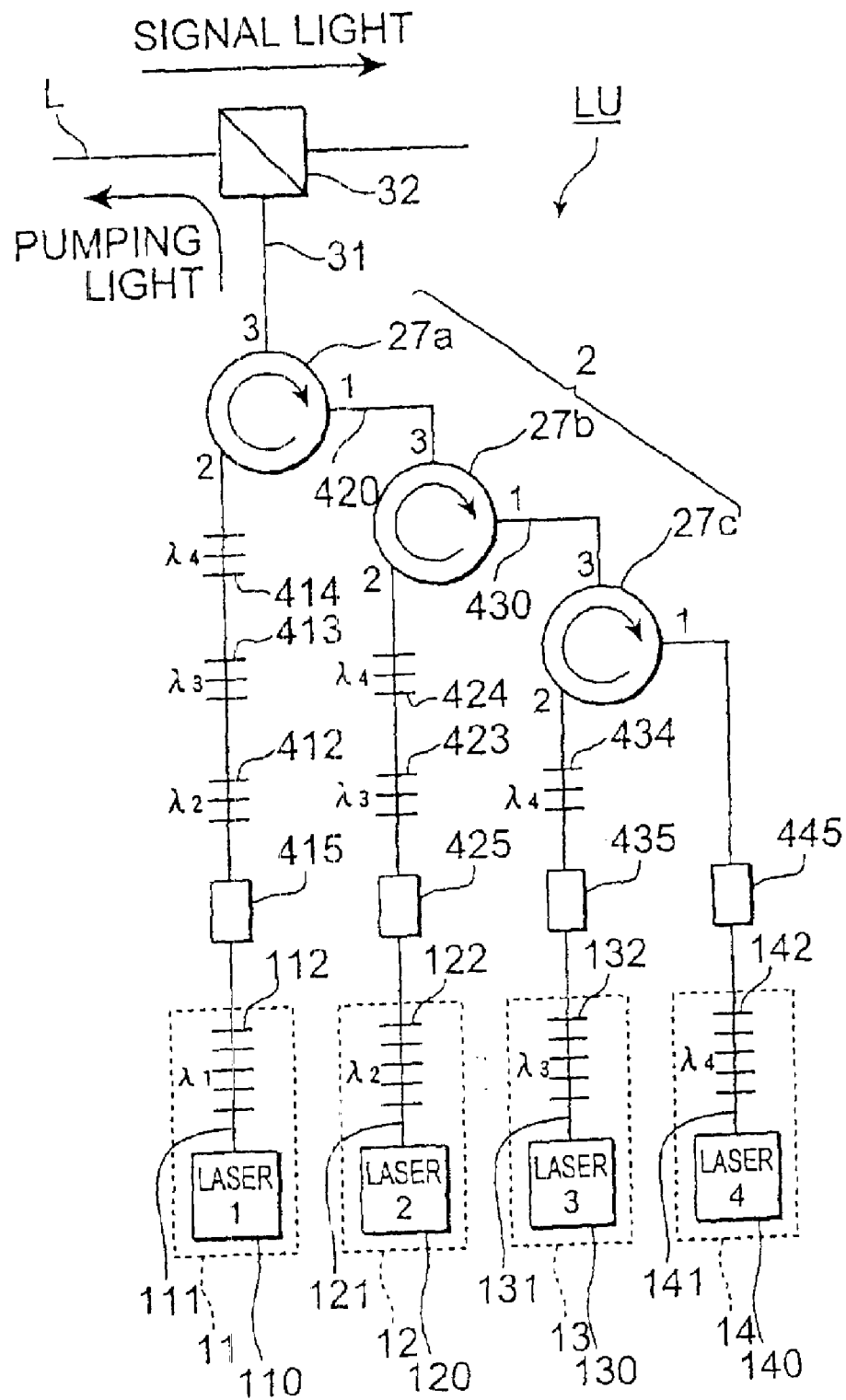
FIG. 21 is a diagram showing the configuration of a tenth embodiment of the pumping light source unit according to the present invention.

FIG. 21 is a diagram showing the configuration of a tenth embodiment of the pumping light source unit according to the present invention. The pumping light source unit LU according to the tenth embodiment has substantially the same structure as that of the eighth embodiment shown in FIG. 19 but differs therefrom in that an optical isolator is placed between a resonance grating and a reflection grating.

Namely, on an optical waveguide 111 connecting a pumping light source 11 and an optical circulator 27a to each other, an optical isolator 415 is placed between a resonance grating 112 and reflection gratings 412, 413, 414. On an optical waveguide 121 connecting a pumping light source 12 and an optical circulator 27b to each other, an optical isolator 425 is placed between a resonance grating 122 and reflection gratings 423, 424. On an optical waveguide 131 connecting a pumping light source 13 and an optical circulator 27c to each other, an optical isolator 435 is placed between a resonance grating 132 and a reflection gratings 434. On an optical waveguide 141 connecting a pumping light source 14 and the optical circulator 27c to each other, an optical isolator 445 is placed between a resonance grating 142 and the optical circulator 27c.

Figure 22:
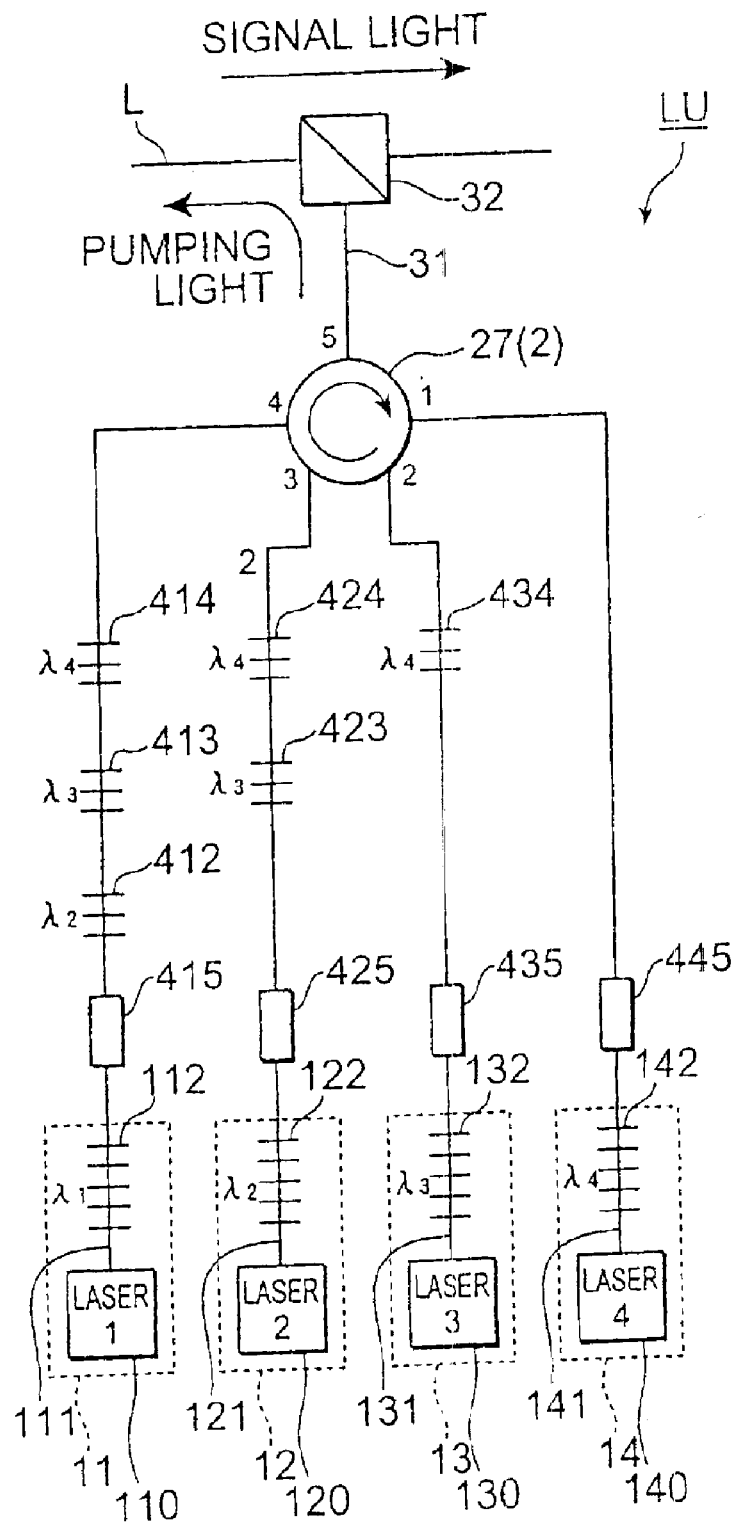
FIG. 22 is a diagram showing the configuration of an eleventh embodiment of the pumping light source unit according to the present invention.

FIG. 22 is a diagram showing the configuration of an eleventh embodiment of the pumping light source unit according to the present invention. The pumping light source unit LU according to the eleventh embodiment has substantially the same structure as that of the ninth embodiment shown in FIGS. 20A and 20B but differs therefrom in that an optical isolator is placed between a resonance grating and a reflection grating as in the above-mentioned tenth embodiment.

Namely, on an optical waveguide 111 connecting a pumping light source 11 and an optical circulator 27 to each other, an optical isolator 415 is placed between a resonance grating 112 and reflection gratings 412, 413, 414. On an optical waveguide 121 connecting a pumping light source 12 and the optical circulator 27 to each other, an optical isolator 425 is placed between a resonance grating 122 and reflection gratings 423, 424. On an optical waveguide 131 connecting a pumping light source 13 and the optical circulator 27 to each other, an optical isolator 435 is placed between a resonance grating 132 and a reflection grating 434. On an optical waveguide 141 connecting a pumping light source 14 and the optical circulator 27 to each other, an optical isolator 445 is placed between a resonance grating 142 and the optical isolator 445.

When the optical isolators 415 to 445 a replaced between the resonance gratings of the pumping light sources 11 to 14 acting as external resonator type laser units and the reflection gratings disposed on their corresponding optical waveguides 111 to 141 as such, a plurality of wavelengths of light are prevented from externally resonating in external resonator type laser units under the influence of reflection gratings.

The above-mentioned pumping light source units according to the first to eleventh embodiments, for maintaining a flatness of power spectrum (gain spectrum of Raman amplifier) of pumping light outputted even when the output of any one of the plurality of pumping light sources remarkably decreases, comprises a structure for adjusting a pumping light spectrum by changing the channel wavelengths of the remaining pumping light sources. By this structure, the controllability of pumping light spectrum can be improved, and a power spectrum of outputted signal light in an amplification wavelength band of Raman amplifier can be adjusted. However, the above-mentioned structure can not be prevent a degradation of pumping light spectrum to a certain level. To overcome this problem, the pumping light source unit according to the present invention preferably comprises, together with a pumping light supply system outputting a plurality of channels of pumping light under steady condition, a backup pumping light supply system for preventing a degradation of pumping light spectrum caused by the output decrease of any one of the pumping light sources included in the main pumping light supply system.

Figure 23:
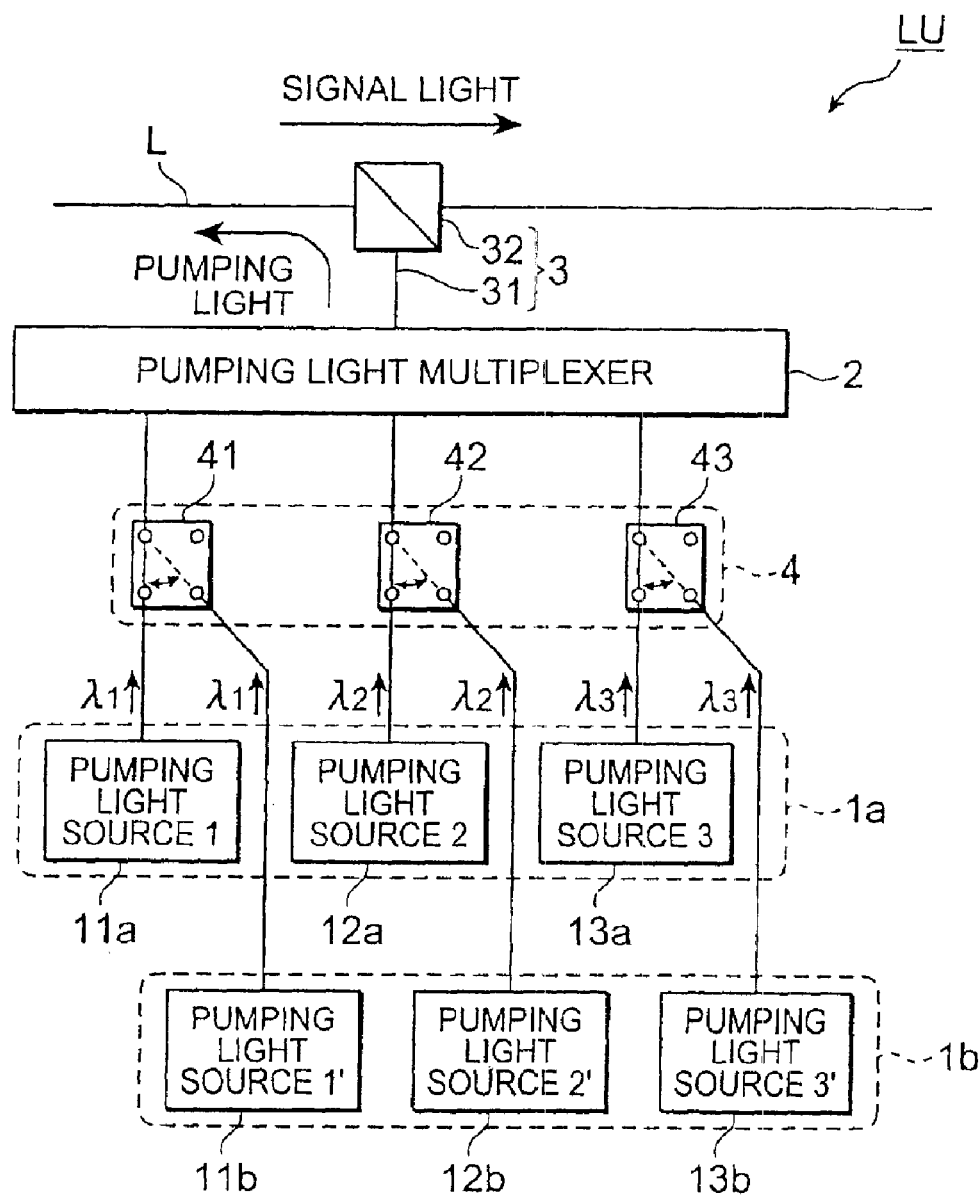
FIG. 23 is a diagram showing the configuration of the pumping light source unit having a pumping light supply system of a dual structure.

FIG. 23 is a diagram showing the configuration of a pumping light source unit having a dual structure of pumping light supply system. This pumping light source unit LU, as in the case of the tenth embodiment shown in FIG. 1, has a main pumping light supply system 1a outputting a plurality of channels of pumping light under steady condition, a pumping light multiplexer 2 multiplexing the plurality of channels of pumping light from the main pumping light supply system 1a, an output structure 3 for outputting the multiplexed light outputted from the pumping light multiplexer 2 to an optical transmission line L. The output structure 3 includes an output optical waveguide 31 and an output multiplexer 32. The pumping light source unit LU further comprises a backup pumping light supply system 1b for outputting pumping light including the same channel wavelengths as the output channel wavelengths $\lambda_1$ to $\lambda_3$ from the pumping light sources 11a–13a included in the main pumping light supply system 1a, and an optical switch 4 for switching between the output from the main pumping light supply system 1a and the output from the backup pumping light supply system 1b every channel. The backup pumping light supply system 1b includes backup pumping light sources 11b–13b outputting pumping light of the channels respectively corresponding to the pumping light sources 11a–13a included in the main pumping light supply system 1a. The optical switch 4 includes a plurality of channel switches 41–43 prepared so as to switch between the output of the main pumping light supply system 1a and the output of the backup pumping light supply system 1b.

In the pumping light source unit LU, under steady condition, the pumping light of channel wavelengths $\lambda_1$ to $\lambda_3$ is outputted from the pumping light sources 11a–13a included in the main pumping light supply system 1a. The pumping light from the pumping light sources 11a–13a is outputted to the pumping light multiplexer 2 through the optical switch 4 and is multiplexed in the pumping light multiplexer 2. And, the multiplexed light outputted from the pumping light multiplexer 2 is introduced to the optical transmission line L through the output optical waveguide 31 and the output multiplexer 32 included in the output structure 3.

On the other hand, if one, for example the pumping light source 12a, of the pumping light sources 11a–13a included in the main pumping light supply system 1a is failed, the optical switch 4 performs an input switching of the associated channel switch 42 in order to switch pumping light to be introduced to the pumping light multiplexer 2. As described above, in the pumping light source unit LU under emergency condition that the pumping light source 12a is failed, the optical switch 4 controls the channel switches 41–43 in order to introduce pumping light of channel wavelength $\lambda_1$ from the pumping light source 11a, pumping light of channel wavelength $\lambda_2$ from the backup pumping light source 12b and pumping light of channel wavelength $\lambda_3$ from the pumping light source 13a to the pumping light multiplexer 2.

The pumping light source unit LU comprises the main pumping light supply system 1a including the pumping light sources 11a–13a respectively outputting the channel wavelengths $\lambda_1$ to $\lambda_3$ of pumping light under steady condition and a backup pumping light supply system 1b including the backup pumping light sources 11b–13b prepared so as to correspond to these pumping light sources 11a–13a, and has a structure for output switching between the main pumping light supply system 1a and the backup pumping light supply system 1b every channel according to the operation condition of the main pumping light supply system 1a. However, when pumping light supply systems which respectively have the same number of pumping light sources are prepared, it's fabrication cost increases. Therefore, embodiments capable of reducing the number of pumping light sources included in a backup pumping light supply system will be explained as follows.

Figure 24:
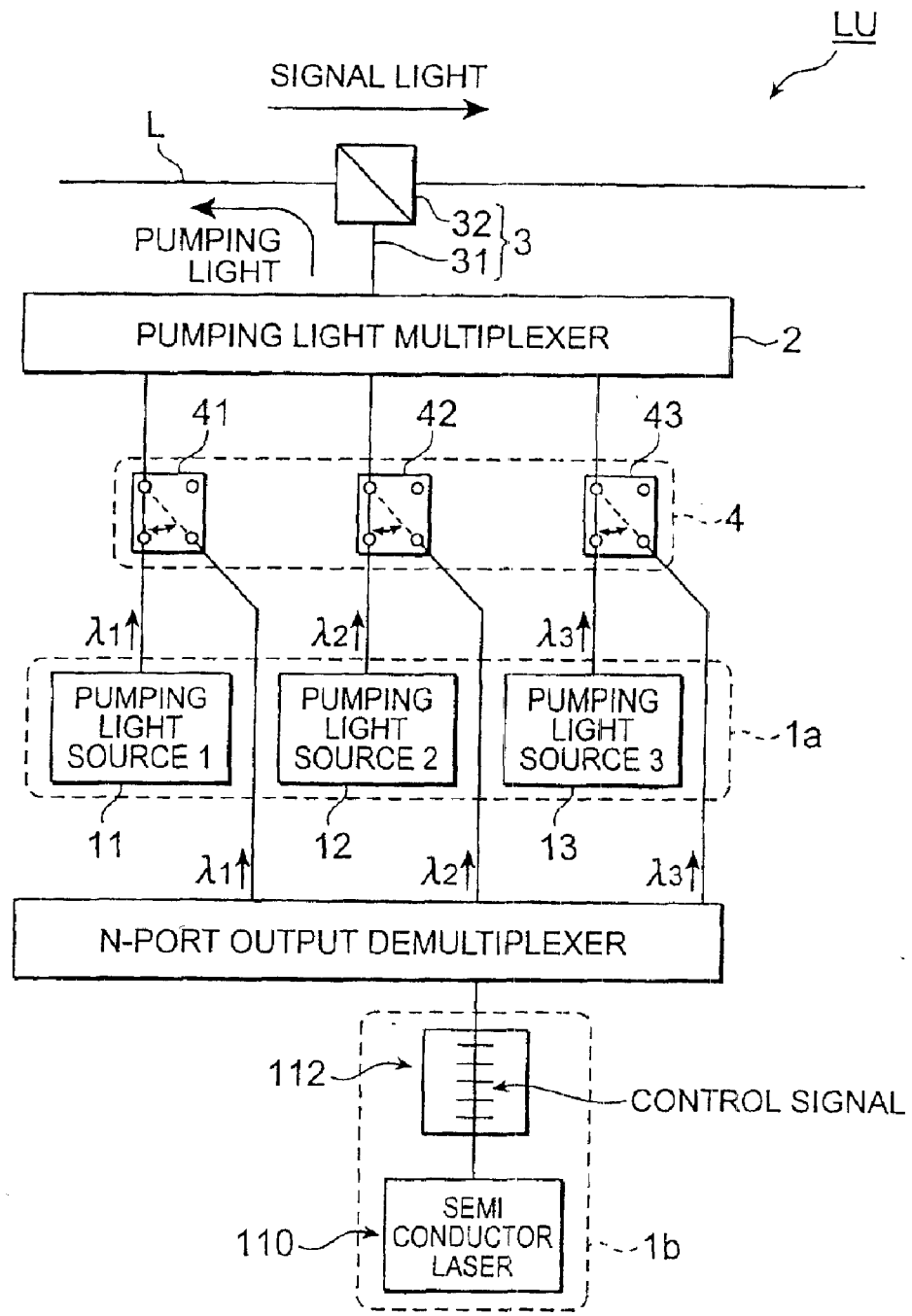
FIG. 24 is a diagram showing the configuration of a twelfth embodiment of the pumping light source unit according to the present invention.

FIG. 24 is a diagram showing the configuration of a twelfth embodiment of the pumping light source unit according to the present invention. As the structure for supplying a plurality of channels of pumping light to an optical transmission line L under steady condition, the twelfth embodiment comprises, as in the case of the pumping light source unit shown in FIG. 23, a main pumping light supply system 1a outputting the plurality of channels of pumping light, a pumping light multiplexer 2 multiplexing the plurality of channels of pumping light from the pumping light supply system 1a, and an output structure 3 for outputting the multiplexed light outputted from the pumping light multiplexer 2 to the optical transmission line L. The main pumping light supply system 1a includes pumping light sources 11–13 respectively outputting channel wavelengths $\lambda_1$ to $\lambda_3$ of pumping light. Also, the output structure 3 includes an output optical waveguide 31 and an output multiplexer 32.

In particular, the pumping light source unit LU according to the twelfth embodiment further comprises a backup pumping light supply system 1b outputting pumping light of the same channel wavelengths as the output channel wavelengths $\lambda_1$ to $\lambda_3$ from the pumping light sources 11–13 included in the main pumping light supply system 1a, an optical switch 4 switching between the output of the main pumping light supply system 1a and the output of the backup pumping light supply system 1b every channel, and a 1×M ($\geq$2)-port output demultiplexer 45 arranged on an optical path between the backup pumping light supply system 1b and the optical switch 4. The backup pumping light supply system 1b, for outputting pumping light of channel wavelengths respectively corresponding to the pumping light sources 11–13 in the main pumping light supply system 1a, includes a wavelength variable pumping light source as a backup pumping light source. The configuration of a wavelength variable pumping light source included in the backup pumping light supply system 1b, as shown in FIG. 8, comprises a semiconductor laser 110 a channel wavelength adjusting system 112 for adjusting the reflection wavelength of the resonance grating. The 1×M ($\geq$2)-port output demultiplexer 45 receives pumping light from the backup pumping light supply system 1b, and outputs the pumping light through the associated output port every channel wavelength of the inputted pumping light.

The channel wavelength adjusting system 112 may include stress applying means for changing a grating period by applying a predetermined stress to the resonance grating. The channel wavelength adjusting system 112 may include heating means for changing a refractive index within the core region by heating the resonance grating. When the resonance grating is formed within an optical waveguide made of a material having an electrooptic effect, the channel wavelength adjusting system 112 may include electric field applying means for changing a refractive index of the optical waveguide by applying an electric field having a predetermined intensity to the optical waveguide formed with the resonance grating.

In the pumping light source unit LU according to the twelfth embodiment, the pumping light of channel wavelengths $\lambda_1$ to $\lambda_3$ from the pumping light sources 11–13 included in the main pumping light supply system 1a. The pumping light from the pumping light sources 11–13 is outputted to the pumping light multiplexer 2 through the optical switch 4 and multiplexed in the pumping light multiplexer 2. The multiplexed light outputted from the pumping light multiplexer 2 is introduced, through the output optical waveguide 31 and the output multiplexer 32 which are included in the output structure 3, to the optical transmission line L.

On the other hand, when one, for example the pumping light source 12, of the pumping light sources 11–13 is failed, the backup pumping light supply system 1b outputs the pumping light, which has the substantially same channel wavelength as the channel wavelength to be outputted from the failed pumping light source 12, to the 1×M ($\geq$2)-port output demultiplexer 45. The pumping light inputted into the 1×M ($\geq$2)-port output demultiplexer 45 is outputted through the output port corresponding to the channel wavelength of the inputted pumping light, and is introduced to the associated channel switch 42. The channel switch 42 performs input switching in order to output the pumping light from the 1×M ($\geq$2)-port output demultiplexer 45. Thus, in the pumping light source unit LU under emergency condition that the pumping light source 12 is failed, the optical switch 4 controls the channel switches 41–43 so as to introduce the pumping light of channel wavelength $\lambda_1$ from the pumping light source 11, the pumping light of channel wavelength $\lambda_2$ from the backup pumping light supply system 1b (wavelength variable pumping light source), and the pumping light of channel wavelength $\lambda_3$ from the pumping light source 13. Each of the pumping light sources 41–43 is preferably a switch using an interferometric effect in order to prevent an instant breaking of pumping light caused by the pumping light switching between the main pumping light supply system 1a and the backup pumping light supply system 1b.

Figure 25A:
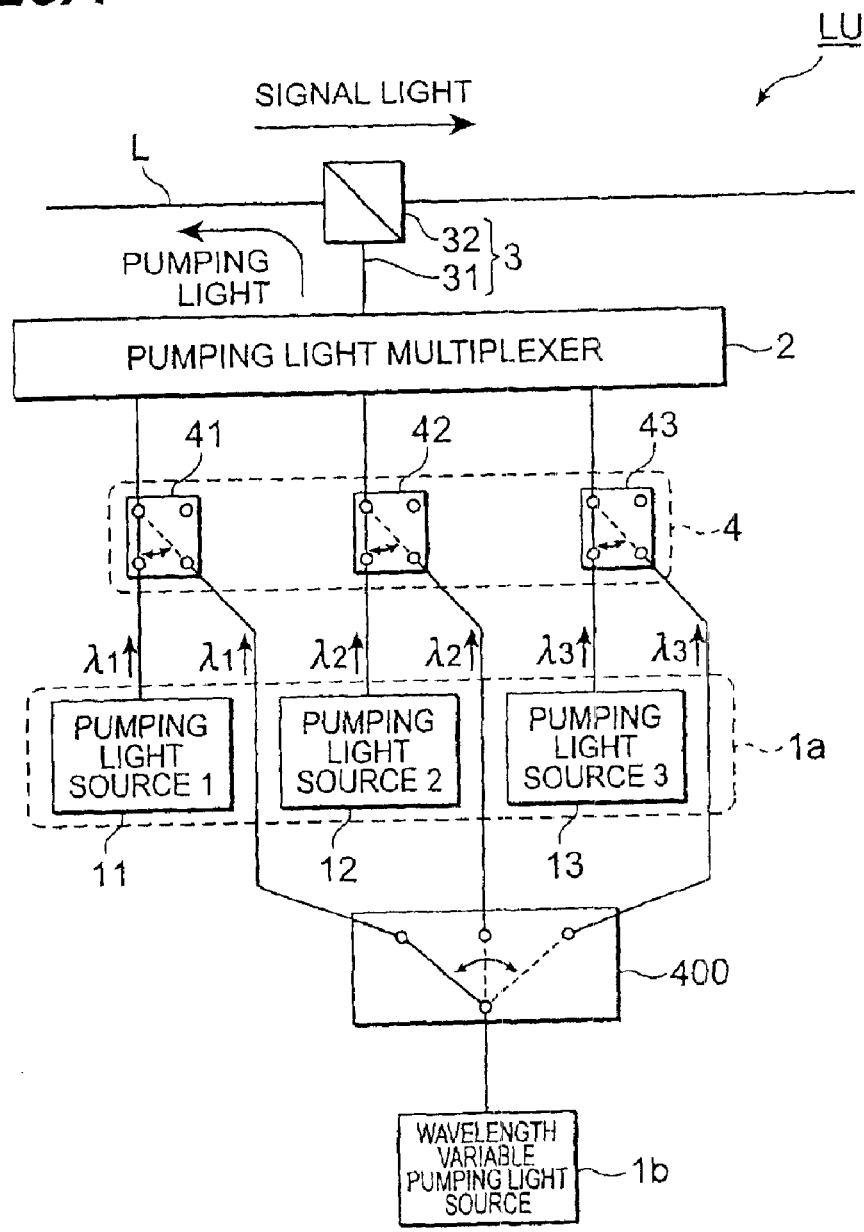
FIGS. 25A and 25B are diagrams showing the configurations of a thirteenth embodiment of the pumping light source unit according to the present invention and an optical switch.
Figure 25B:
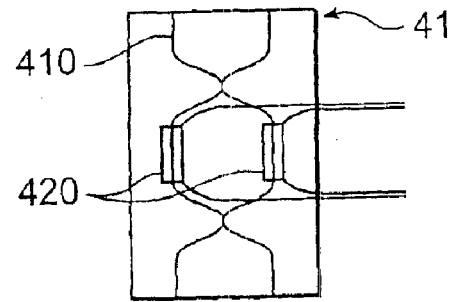

FIG. 25 is a diagram showing the configuration of a thirteenth embodiment of the pumping light source unit according to the present invention. As a structure for supplying a plurality of channels of pumping light under steady condition, the thirteenth embodiment of FIG. 25A, as in the case of the pumping light source unit shown in FIG. 23, also comprises a main pumping light supply system 1a outputting a plurality of channels of pumping light, a pumping light multiplexer 2 multiplexing the plurality of channels of pumping light from the pumping light supply system 1a, and an output structure 3 for outputting the multiplexed light outputted from the pumping light multiplexer 2 to the optical transmission line L. The main pumping light supply system 1a includes pumping light sources 11–13 respectively outputting channel wavelengths $\lambda_1$ to $\lambda_3$ of pumping light. Also, the output structure 3 includes an output optical waveguide 31 and an output multiplexer 32.

In particular, the pumping light source unit LU according to the thirteen embodiment, as described in FIG. 25A, further comprises a backup pumping light supply system 1b outputting pumping light of the same channel wavelengths as the output channel wavelengths $\lambda_1$ to $\lambda_3$ from the pumping light sources 11–13 included in the main pumping light supply system 1a, an optical switch 4 switching between the output of the main pumping light supply system 1a and the output of the backup pumping light supply system 1b every channel, and an optical switch 400 arranged on an optical path between the backup pumping light supply system 1b and the optical switch 4. The backup pumping light supply system 1b, for outputting pumping light of channel wavelengths respectively corresponding to the pumping light sources 11–13 in the main pumping light supply system 1a, includes a wavelength variable pumping light source as a backup pumping light source. The configuration of a wavelength variable pumping light source included in the backup pumping light supply system 1b, as shown in FIG. 8, comprises a semiconductor laser 110 a channel wavelength adjusting system 112 for adjusting the reflection wavelength of the resonance grating. The optical switch 400 introduces pumping light from the backup pumping light supply system 1b to the channel switch 41–43 corresponding to respective channel wavelengths.

Both of the optical switch 4 (channel switches 41–43) and optical switch 400 are preferably a switch using an interferometric effect in order to prevent an instant breaking of pumping light caused by mechanically switching between the main pumping light supply system 1a and the backup pumping light supply system 1b. The switching time of a mechanical switch, such as Micro Electro Mechanical Systems (MEMS) and the like, is usually millisecond-order, whereas the bit rate of optical transmission signals increases to about 10 Gbps, recently, and therefore when the mechanical switch is applied, loss of about ten billion bits will causes. Thus, as an optical switch applied to the pumping light source unit LU according to the present invention, the optical switches 4, 400 are preferably thermal optic switch or optoelectric switch of Mach-Zehnder type as shown in for example FIG. 25B.

In the pumping light source unit LU according to the thirteenth embodiment, the pumping light of channel wavelengths $\lambda_1$ to $\lambda_3$ from the pumping light sources 11–13 included in the main pumping light supply system 1a. The pumping light from the pumping light sources 11–13 is outputted to the pumping light multiplexer 2 through the optical switch 4 and multiplexed in the pumping light multiplexer 2. The multiplexed light outputted from the pumping light multiplexer 2 is introduced, through the output optical waveguide 31 and the output multiplexer 32 which are included in the output structure 3, to the optical transmission line L.

On the other hand, when one, for example the pumping light source 12, of the pumping light sources 11–13 is failed, the backup pumping light supply system 1b outputs the pumping light having the substantially same channel wavelength as the channel wavelength to be outputted from the failed pumping light source 12. The optical switch 400 performs output switching in order to introduce the pumping light to the channel switch 42 corresponding to the channel wavelength of pumping light outputted from the backup pumping light supply system 1b, and the optical switch 4 performs input switching the associated channel switch 42 for switching age pumping light to be introduced from the optical switch 400 to the pumping light multiplexer 2. Thus, in the pumping light source unit LU under emergency condition that the pumping light source 12 is failed, the optical switch 4 controls the channel switches 41–43 so as to introduce the pumping light of channel wavelength $\lambda_1$ from the pumping light source 11, the pumping light of channel wavelength $\lambda_2$ from the backup pumping light supply system 1b (wavelength variable pumping light source), and the pumping light of channel wavelength $\lambda_3$ from the pumping light source 13.

Figure 26:
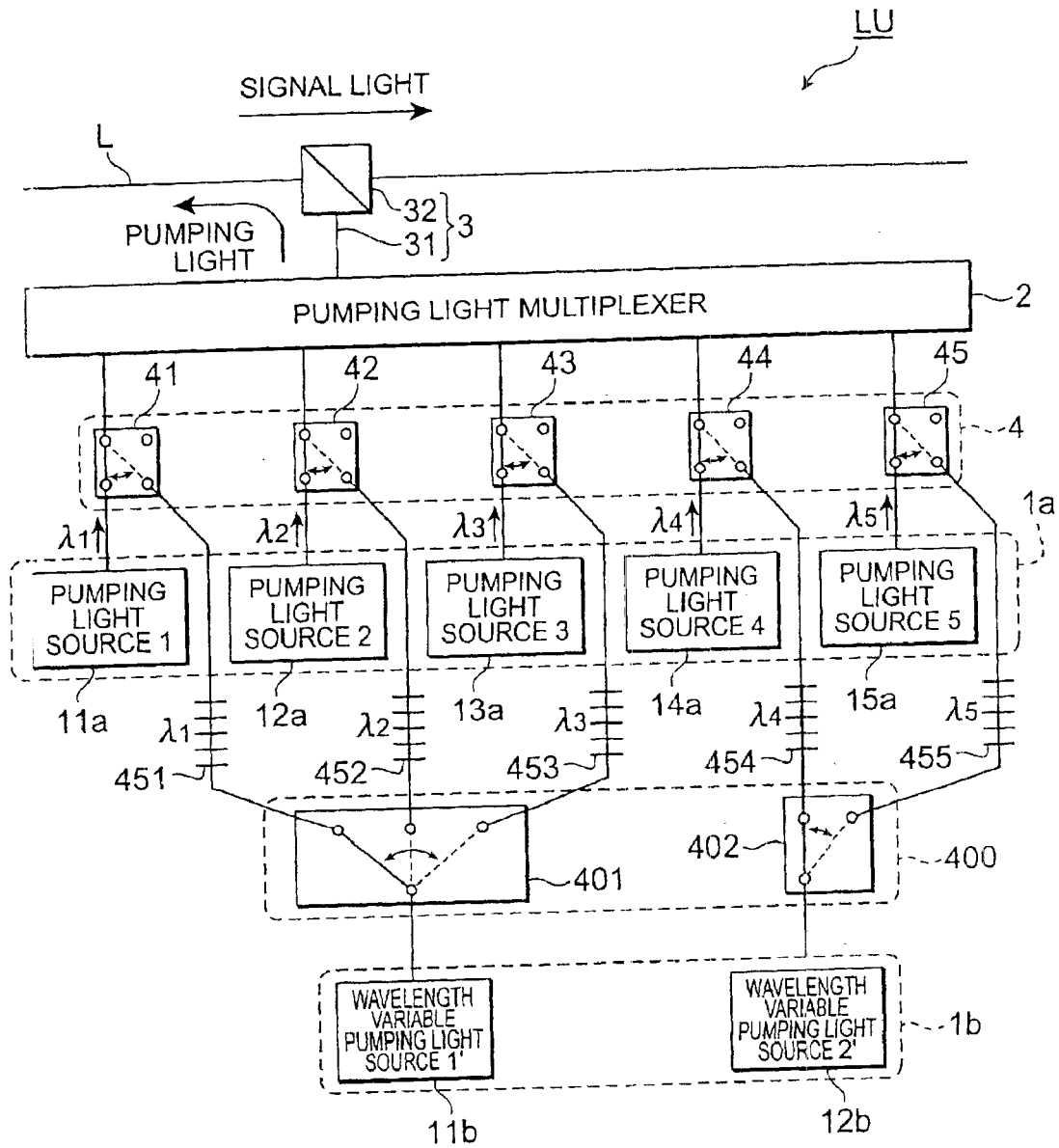
FIG. 26 is a diagram showing the configuration of a fourteenth embodiment of the pumping light source unit according to the present invention.

FIG. 26 is a diagram showing the configuration of a fourteenth embodiment of the pumping light source unit according to the present invention. In this fourteenth embodiment, in order to ensure a broader amplification band, the main pumping light supply system 1*a* has five light sources of the pumping light sources 11*a*–15*a*, whereas the backup pumping light supply system 1*b*, for Raman amplification in the amplification band covered by the main pumping light supply system 1*a*, comprises wavelength variable pumping light sources 11*b*, 12*b*. The pumping light source unit LU according to the fourteenth embodiment, for switching between the output of the main pumping light supply system 1*a* including the pumping light sources 11*a*–15*a* and the output of the backup pumping light supply system 1*b* including the backup pumping light sources 11*b*, 12*b*, comprises an optical switch 4 arranged on an optical path between the main pumping light supply system 1*a* and the pumping light multiplexer 2 and an optical switch 400 arranged on an optical path between the optical switch 4 and the backup pumping light supply system 1*b*, and resonance gratings 451–455, which respectively have reflection wavelengths $\lambda_1$ to $\lambda_5$, on optical paths between the output ports of the channel switches 41–45 in the optical switch 4 and those of the channel switches 401, 402 in the optical switch 400.

The optical switch 4 comprises a plurality of channel switch 41–45 for input switching every channel wavelength of pumping light. Also, the optical switch 400 comprises the channel switches 401, 402 output switching in order to for introduce the pumping light from the backup pumping light supply system 1*b* to the associated one of channel switches 41–45 respectively. The output structure 3 includes an output optical waveguide 31 and an output multiplexer 32. The configuration of a wavelength variable pumping light source included in the backup pumping light supply system 1*b*, as shown in FIG. 8, comprises a semiconductor laser 110 a channel wavelength adjusting system 112 for adjusting the reflection wavelength of the resonance grating. The optical switches 4, 400 is preferably a switch using interferometric effect in order to prevent an instant breaking of pumping light caused by the pumping light switching between the main pumping light supply system 1*a* and the backup pumping light supply system 1*b*.

In the pumping light source unit LU according to the fourteenth embodiment, the pumping light of channel wavelengths $\lambda_1$–$\lambda_5$ are respectively outputted from the pumping light sources 11*a*–15*a* included in the main pumping light supply system 1*a*. The pumping light from the pumping light sources 11*a*–15*a* is outputted to the pumping light multiplexer 2 through the optical switch 4, and is multiplexed in the pumping light multiplexer 2. The multiplexed light outputted from the pumping light multiplexer 2 is introduced to the optical transmission line L through the output optical waveguide 31 and the output multiplexer 32 included in the output structure 3.

On the other hand, when one, for example the pumping light source 12*a*, of the pumping light sources 11*a*–13*a* is failed, the backup pumping light supply system 1*b* outputs the pumping light having the substantially same channel wavelength as the channel wavelength to be outputted from the failed pumping light source 12*a*. At this time, the channel switch 401 performs output switching in order to introduce the pumping light to the channel switch 42 corresponding to the channel wavelength of pumping light outputted from the backup pumping light supply system 1*b*, and the optical switch 4 performs input switching the associated channel switch 42 for switching pumping light to be introduced from the optical switch 401 to the pumping light multiplexer 2. Thus, in the pumping light source unit LU under emergency condition that the pumping light source 12*a* is failed, the optical switch 4 controls the channel switches 41–45 so as to introduce the pumping light of channel wavelength $\lambda_1$ from the pumping light source 11*a*, the pumping light of channel wavelength $\lambda_2$ from the wavelength variable pumping light source 11*b* included in the backup pumping light supply system 1*b*, and the pumping light of channel wavelengths $\lambda_3$–$\lambda_5$ from the pumping light sources 13*a*–15*a*.

Figure 27:
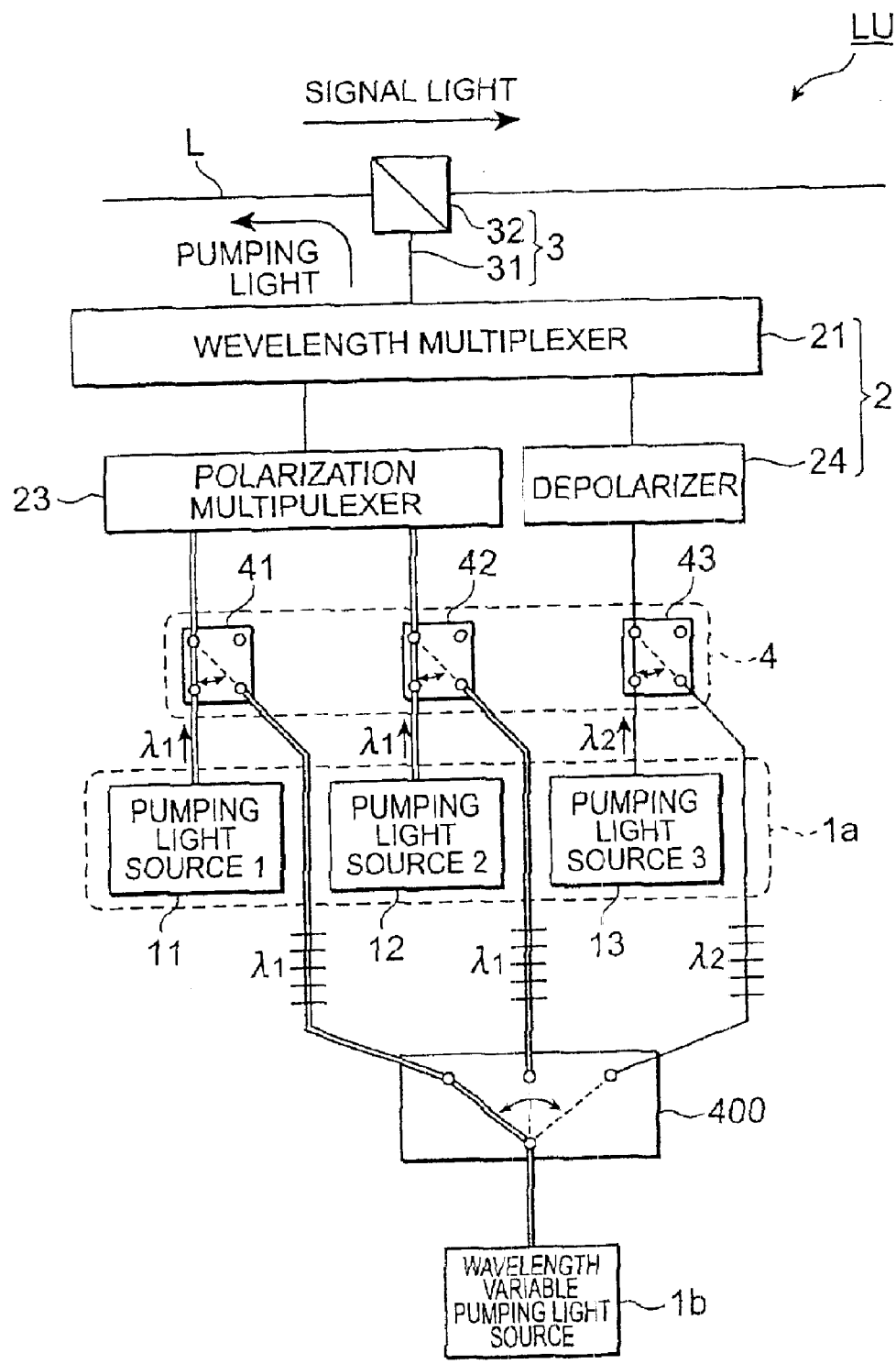
FIG. 27 is a diagram showing the configuration of a fifteenth embodiment of the pumping light source unit according to the present invention.

FIG. 27 is a diagram showing the configuration of a fifteenth embodiment of the pumping light source unit according to the present invention. In the fifteenth embodiment, the pumping light multiplexer 2 comprises a wavelength multiplexer 21, a polarization multiplexer 23 polarization-multiplexing the channel wavelength $\lambda_1$ of pumping light having polarization conditions different from each other, and a depolarizer 24 depolarizing the pumping light of the channel wavelength $\lambda_2$ from the pumping light source 13 included in the main pumping light supply system 1*a*. The configuration for switching between the output of the backup pumping light supply system 1*b* and the output of the main pumping light supply system 1*a* is similar to that of the thirteenth embodiment. The pumping light sources 11, 12 included in the main pumping light supply system 1*a* and the polarization multiplexer 23 are preferably connected through a polarization maintaining fiber in order to maintain the polarization conditions of pumping light outputted from the pumping light sources 11, 12. Similarly, the backup pumping light supply system 1*b* and the polarization multiplexer 23 are also preferably connected through a polarization maintaining fiber in order to maintain polarization conditions of pumping light outputted from the backup pumping light supply system 1*b*.

On an optical path between the optical switch 400 and the channel switches 41–43 in the optical switch 4, it is preferably that resonance gratings are preferably arranged for improving its reliability.

Raman amplifiers employing the above-mentioned pumping light source units (Raman amplifiers according to the present invention) will now be explained.

Figure 28:
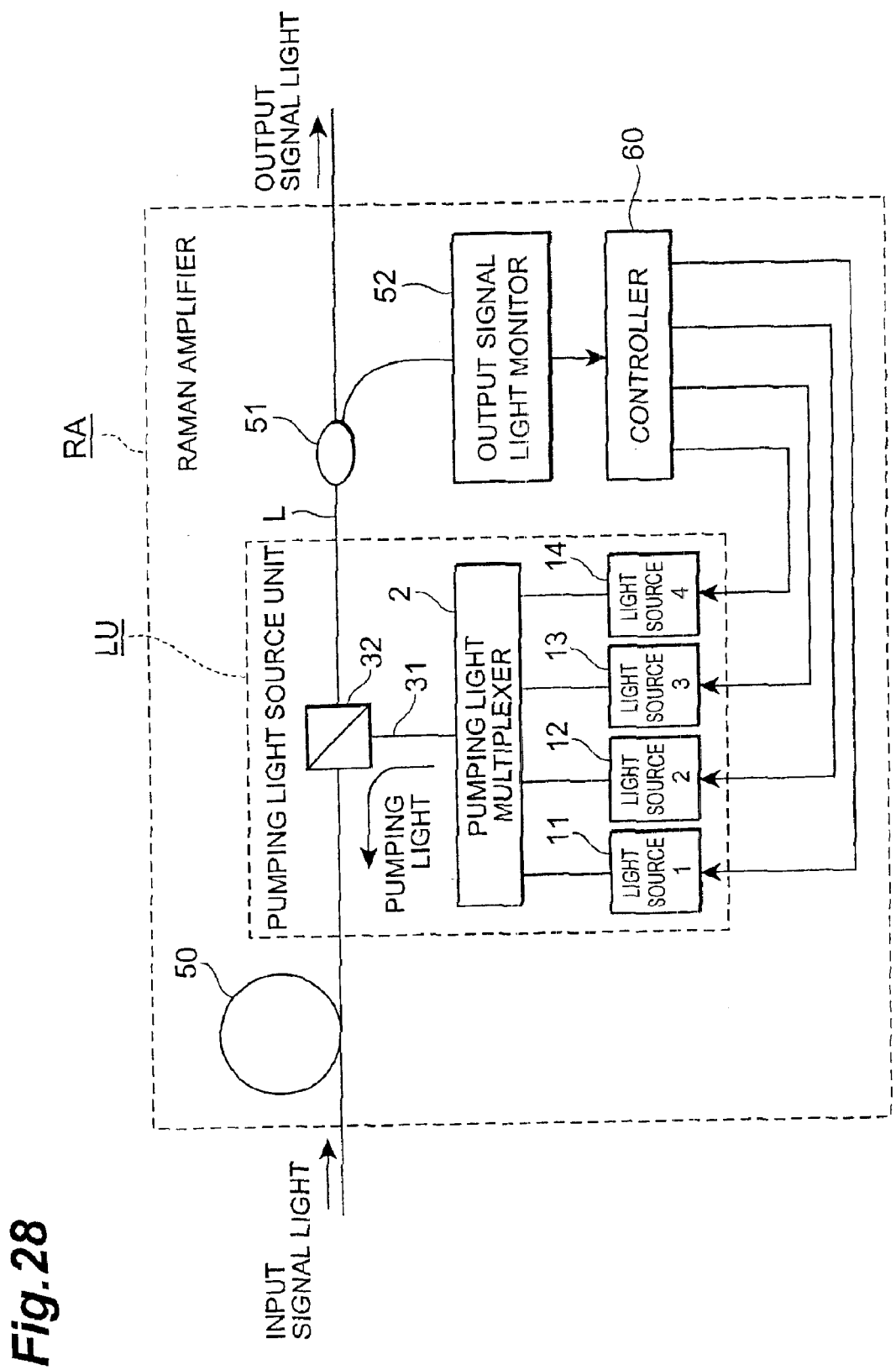
FIG. 28 is a diagram showing the configuration of a first embodiment of the Raman amplifier according to the present invention.

FIG. 28 is a diagram showing the configuration of a first embodiment of the Raman amplifier according to the present invention. The Raman amplifier RA according to the first embodiment comprises a Raman amplification optical fiber 50 and a pumping light source unit LU. The pumping light source unit LU is a pumping light source unit shown in FIG. 1 (first embodiment); and comprises four wavelength variable pumping light sources 11 to 14, a pumping light multiplexer 2, and an output structure 3 (including an output optical waveguide 31 and an output multiplexer 32).

The pumping light source unit LU supplies pumping light to the Raman amplification optical fiber 50. The pumping light source unit LU is connected to an optical transmission line L within the Raman amplifier RA by way of an output multiplexer 32 placed downstream the Raman amplification optical fiber 50 in the signal light propagating direction.

The output multiplexer 32 sends the pumping light supplied from the pumping light source unit LU toward its upstream Raman amplification optical fiber 50 in the direction opposite from the signal light propagating direction. To the downstream side in the forward direction, the output multiplexer 32 transmits therethrough signal light having arrived from the Raman amplification optical fiber 50. As a consequence, the Raman amplifier RA according to the first embodiment functions as a counterpropagating pumping (backward pumping) optical amplifier.

An optical branching device 51 is placed at a predetermined position on the optical transmission line L downstream the pumping light source unit LU. The optical branching device 51 branches a part of the output signal light forwardly propagating through the optical transmission line L after being amplified by the Raman amplification optical fiber 50 into an output signal light monitor 52 (included in an output power measuring system) at a predetermined ratio. The output signal light monitor 52 is constituted by an optical spectrum analyzer, an optical performance monitor, or the like, and measures a state of output signal such as an output signal light spectrum concerning the output signal from the optical branching device 51.

Results of measurement of output signal light effected by the output signal light monitor 52 are sent to a controller 60. According to the results of measurement effected by the output signal light monitor 52, the controller 60 controls respective channel powers or channel wavelengths $\lambda_1$ to $\lambda_4$ of pumping light outputted from a plurality of pumping light sources 11 to 14 included in the pumping light source unit LU.

Thus, since the above-mentioned pumping light source unit LU (the pumping light source unit according to the present invention) including wavelength variable pumping light sources is employed in the Raman amplifier RA, output signal light spectra within an amplification wavelength band can fully be adjusted. This realizes the Raman amplifier RA whose amplification gain controllability is improved so as to be able to respond sufficiently to various changes including those in cases where the output signal light spectrum greatly changes due to the power down in any of the pumping light sources 11 to 14 and the like.

Also, when the pumping light is controlled according to results of measurement of output signal light, both the power spectrum of the whole pumping light supplied from the pumping light source unit LU and the power spectrum of signal light outputted from the Raman amplifier RA are favorably regulated in response to the state of signal light.

Preferably, as a specific method of controlling the pumping light in this case, the controller 60 controls the individual channel powers or channel wavelengths of pumping light so that the output signal light spectrum becomes substantially flat. As a consequence, the state of signal light transmitted through the optical transmission line L can be held favorably.

Preferably, the controller 60 controls a channel wavelength of pumping light such that a frequency yielding substantially the lowest signal light power in the output signal light spectrum approaches a frequency higher by 13 THz to 15 THz (corresponding to a wavelength shorter by about 100 nm to 120 nm) than the former frequency. This can enhance the amplification gain in a wavelength band yielding a lower signal light power, thereby efficiently flattening the output signal light spectrum.

Figure 29:
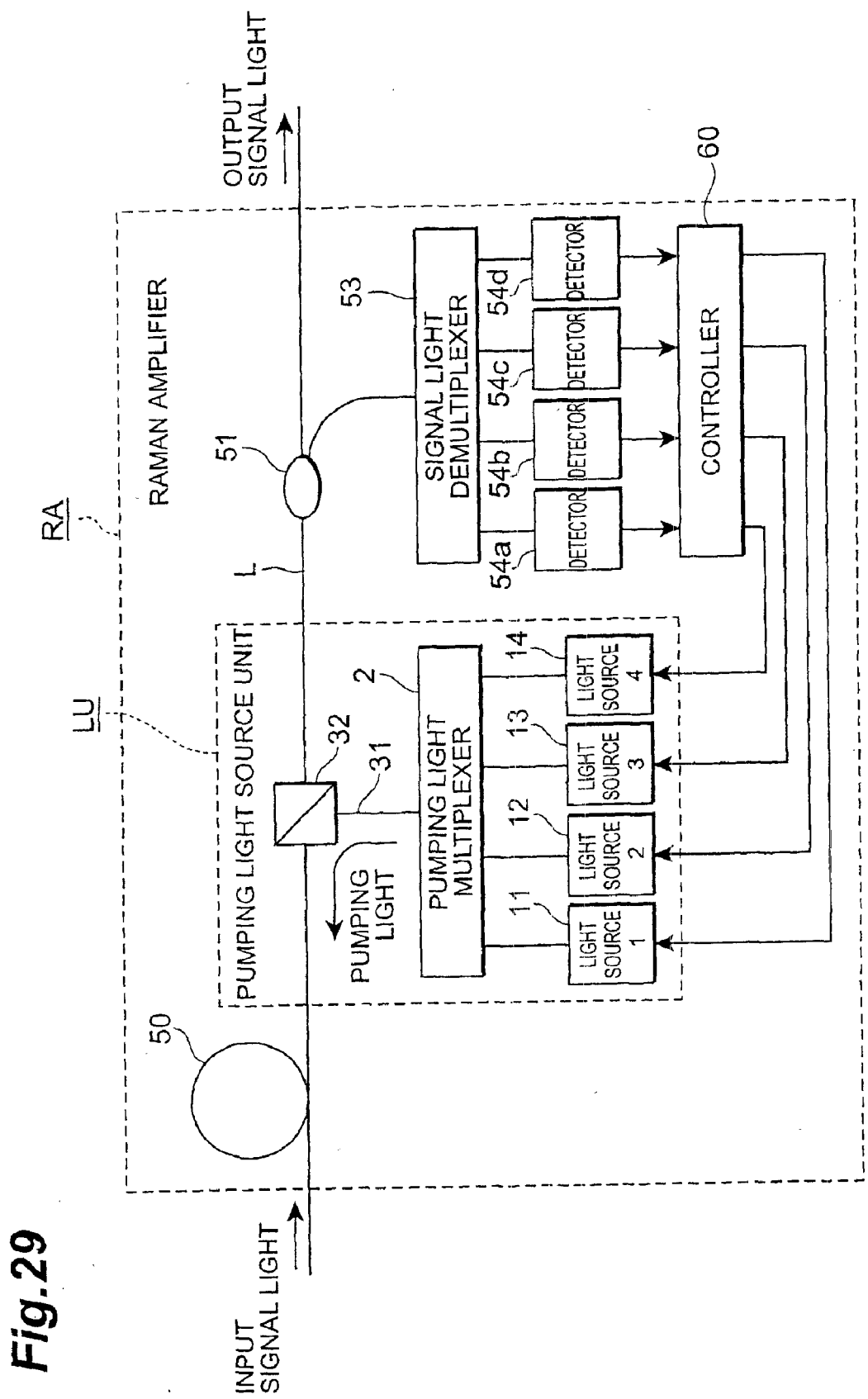
FIG. 29 is a diagram showing the configuration of a second embodiment of the Raman amplifier according to the present invention.

FIG. 29 is a diagram showing the configuration of a second embodiment of the Raman amplifier according to the present invention. The Raman amplifier RA according to the second embodiment comprises a Raman amplification optical fiber 50, and a pumping light source unit LU. The pumping light source unit LU is connected to an optical transmission line L within the Raman amplifier RA by way of an output multiplexer 32 placed downstream the Raman amplification optical fiber 50 in the signal light propagating direction.

The output multiplexer 32 sends the pumping light supplied from the pumping light source unit LU toward its upstream Raman amplification optical fiber 50 in the direction opposite from the signal light propagating direction. To the downstream side in the forward direction, the output multiplexer 32 transmits therethrough signal light having arrived from the Raman amplification optical fiber 50. As a consequence, the Raman amplifier RA functions as a counterpropagating pumping optical amplifier.

An optical branching device 51 is placed at a predetermined position on the optical transmission line L downstream the pumping light source unit LU. The optical branching device 51 branches a part of the output signal light forwardly propagating through the optical transmission line L after being amplified by the Raman amplification optical fiber 50 into a signal light demultiplexer 53 at a predetermined ratio, whereas thus branched output signal light is demultiplexed by the signal light demultiplexer 53 into individual channel wavelengths. The individual channels of output signal light components demultiplexed by the signal light demultiplexer 53 are fed into respective output signal light detectors 54a to 54d, which measure states of output signal light such as an output signal light spectrum. The output power measuring system includes the signal light demultiplexer 53 and output signal light detectors 54a to 54d.

Results of measurement of output signal light effected by the output signal light detectors 54a to 54d are sent to a controller 60. According to the results of measurement effected by the output signal light detectors 54a to 54d, the controller 60 controls respective channel powers or channel wavelengths $\lambda_1$ to $\lambda_4$ of pumping light outputted from a plurality of pumping light sources 11 to 14 included in the pumping light source unit LU.

Both the power spectrum of the whole pumping light supplied from the pumping light source unit LU and the power spectrum of signal light outputted from the Raman amplifier RA are favorably regulated in response to the state of signal light in such a configuration as in the configuration shown in FIG. 28 (first embodiment).

Figure 30:
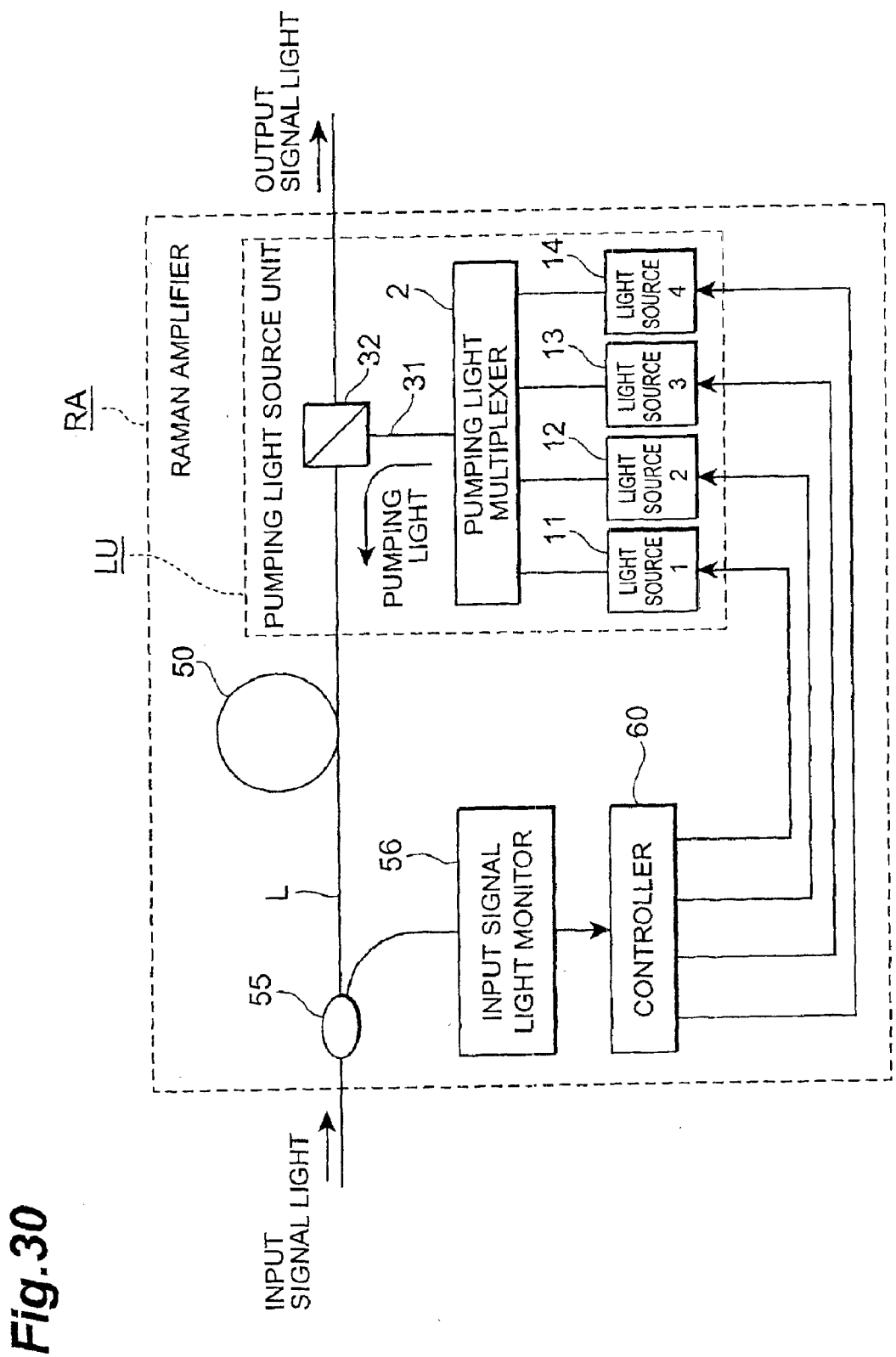
FIG. 30 is a diagram showing the configuration of a third embodiment of the Raman amplifier according to the present invention.

FIG. 30 is a diagram showing the configuration of a third embodiment of the Raman amplifier according to the present invention. The Raman amplifier RA according to the third embodiment comprises a Raman amplification optical fiber 50, and a pumping light source unit LU. The pumping light source unit LU is connected to an optical transmission line L within the Raman amplifier RA by way of an output multiplexer 32 placed downstream the Raman amplification optical fiber 50 in the signal light propagating direction.

The output multiplexer 32 sends the pumping light supplied from the pumping light source unit LU toward its upstream Raman amplification optical fiber 50 in the direction opposite from the signal light propagating direction. To the downstream side in the forward direction, the output multiplexer 32 transmits there through signal light having arrived from the Raman amplification optical fiber 50. As a consequence, the Raman amplifier RA functions as a counterpropagating pumping optical amplifier.

An optical branching device 55 is placed at a predetermined position on the optical transmission line L upstream the Raman amplification optical fiber 50. The optical branching device 55 branches a part of the input signal light forwardly propagating through the optical transmission line L as signal light to be amplified by the Raman amplification optical fiber 50 into an input signal light monitor 56 at a predetermined ratio. The input signal light monitor 56 (included in an input power measuring system) is constituted by an optical spectrum analyzer, an optical performance monitor, or the like, and measures states of input signal light such as an input signal light spectrum.

Results of measurement of input signal light effected by the input signal light monitor 56 are sent to a controller 60. According to the results of measurement effected by the input signal light monitor 56, the controller 60 controls respective channel powers or channel wavelengths $\lambda_1$ to $\lambda_4$ of pumping light outputted from a plurality of pumping light sources 11 to 14 included in the pumping light source unit LU.

Both the power spectrum of the whole pumping light supplied from the pumping light source unit LU and the power spectrum of signal light outputted from the Raman amplifier RA are favorably regulated in response to the state of signal light also when the pumping light is controlled according to the results of measurement of input signal light as such.

Figure 31:
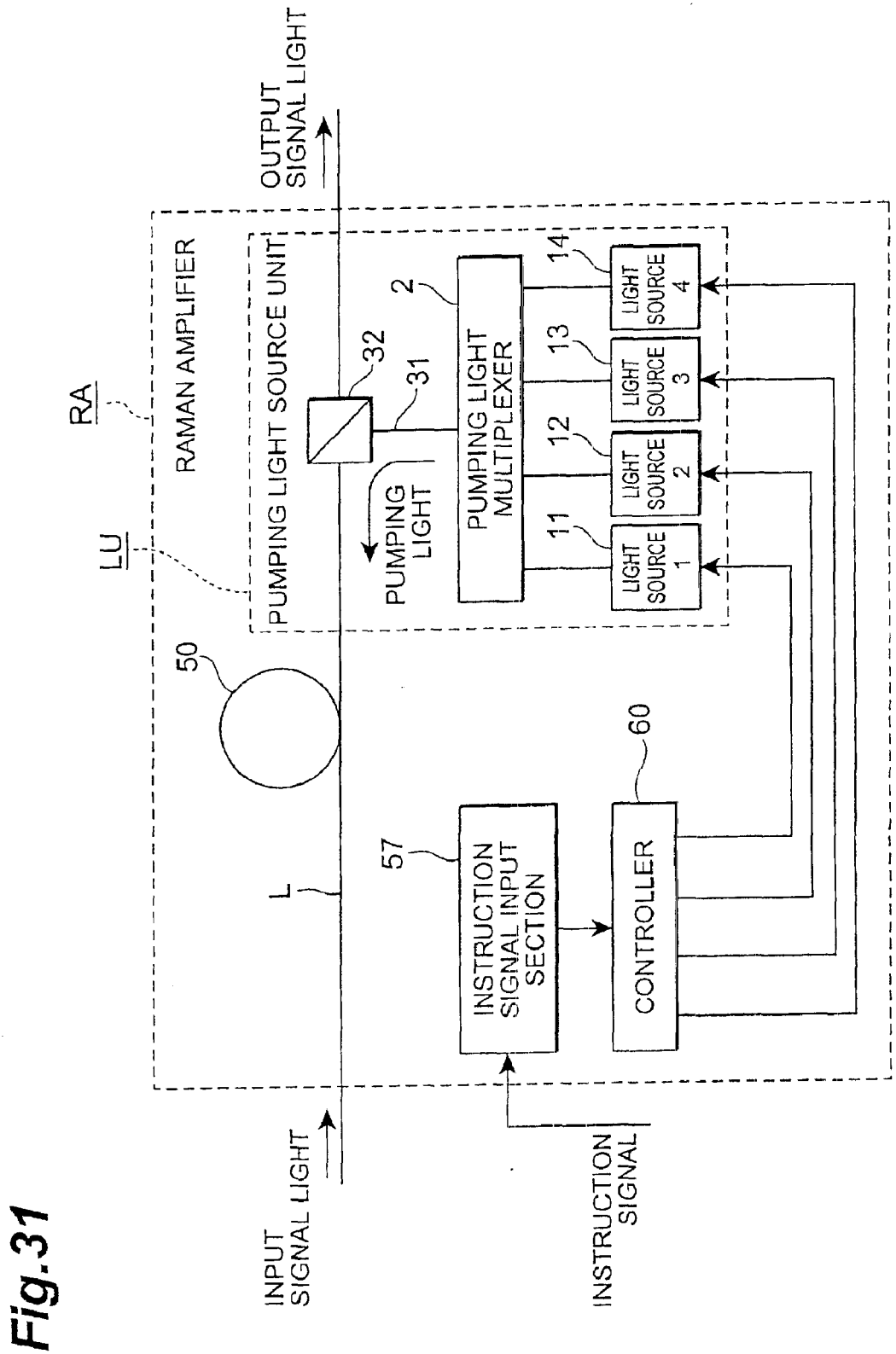
FIG. 31 is a diagram showing the configuration of a fourth embodiment of the Raman amplifier according to the present invention.

FIG. 31 is a diagram showing the configuration of a fourth embodiment of the Raman amplifier according to the present invention. The Raman amplifier RA according to the fourth embodiment comprises a Raman amplification optical fiber 50, and a pumping light source unit LU. The pumping light source unit LU is connected to an optical transmission line L within the Raman amplifier RA by way of an output multiplexer 32 placed downstream the Raman amplification optical fiber 50 in the signal light propagating direction.

The output multiplexer 32 sends the pumping light supplied from the pumping light source unit LU toward its upstream Raman amplification optical fiber 50 in the direction opposite from the signal light propagating direction. To the downstream side in the forward direction, the output multiplexer 32 transmits therethrough signal light having arrived from the Raman amplification optical fiber 50. As a consequence, the Raman amplifier RA functions as a counterpropagating pumping optical amplifier.

Also, the Raman amplifier RA according to the fourth embodiment is provided with an instruction signal input section 57 (included in an instruction signal input system) for inputting an instruction signal from the outside. The instruction signal fed from the instruction signal input section 57 is sent to a controller 60. According to the instruction signal, the controller 60 controls respective channel powers or channel wavelengths $\lambda_1$ to $\lambda_4$ of pumping light outputted from a plurality of pumping light sources 11 to 14 included in the pumping light source unit LU.

Both the power spectrum of the whole pumping light supplied from the pumping light source unit LU and the power spectrum of signal light outputted from the Raman amplifier RA are favorably regulated in response to the state of signal light also when the pumping light is controlled according to the instruction signal from the outside.

Each of the Raman amplifiers shown in FIGS. 28 to 31 is in a counterpropagating pumping configuration in which the pumping light supplied from the pumping light source unit LU propagates through the optical transmission line L in the direction opposite from the signal light propagating direction by way of the output multiplexer 32. However, optical amplifier configurations similar to those of FIGS. 28 to 31 are also applicable to copropagating pumping (forward pumping) configurations in which the pumping light is forwardly multiplexed into the optical transmission line L by way of an output multiplexer.

While Raman amplifiers are used in the mode of distributed constant type or lumped constant type as will be explained later, each of the above-mentioned configurations can be employed in any mode.

Optical transmission systems employing the above-mentioned Raman amplifiers (optical transmission systems according to the present invention) will now be explained.

Figure 32:
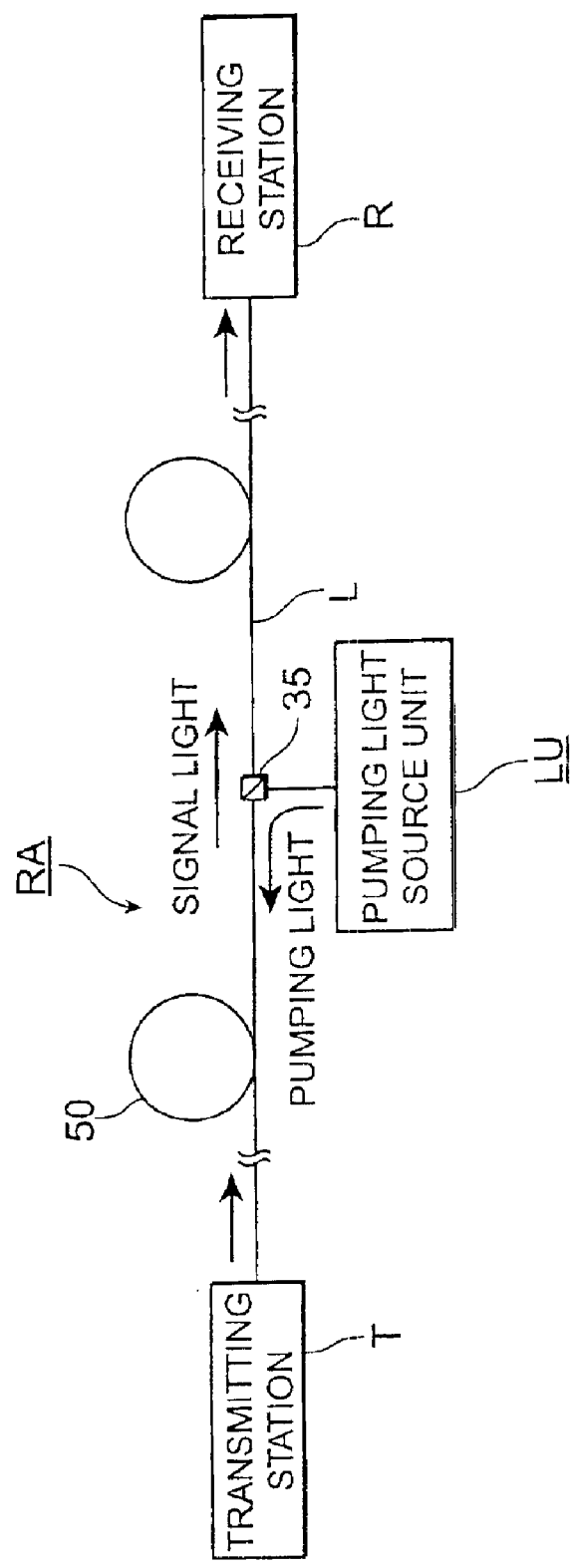
FIG. 32 is a diagram showing the configuration of a first embodiment of the optical transmission system according to the present invention.

FIG. 32 is a diagram showing the configuration of a first embodiment of the optical transmission system according to the present invention. The optical transmission system according to the first embodiment comprises a transmitting station (transmitter) T for transmitting a plurality of channels of signal light within a predetermined signal light wavelength band, an optical fiber transmission line L which is an optical transmission line for propagating the signal light from the transmitting station T, and a receiving station (receiver) R for receiving the signal light propagated through the optical fiber transmission line L.

A multiplexer 35 is disposed at a predetermined position on the optical fiber transmission line L. By way of the multiplexer 35, the above-mentioned pumping light source unit LU (pumping light source unit according to the present invention) is optically coupled to the optical fiber transmission line L. To the upstream side in the backward direction, the multiplexer 35 sends the pumping light supplied from the pumping light source unit LU. The pumping light source unit LU is pumping light supplying means for constituting a Raman amplifier RA for optically amplifying the signal light transmitted through the optical fiber transmission line L.

When the pumping light source unit LU comprises an output multiplexer 32, the latter functions as the multiplexer 35. Alternatively, the pumping light source unit LU may be connected to a separate multiplexer disposed on the optical fiber transmission line L side.

The optical transmission system according to the first embodiment is one in which the Raman amplifier RA including the pumping light source unit LU functions as a distributed constant type optical amplifier. In such a distributed constant type optical amplifier RA, the optical fiber constituting a part of the optical fiber transmission line L is utilized as a Raman amplification optical fiber 50 as shown in FIG. 32.

Placing the distributed constant type Raman amplifier RA employing the pumping light source unit LU at a predetermined position on the optical fiber transmission line L as such can realize an optical transmission system which restrains the transmission quality of signal light from deteriorating, thereby being able to transmit the signal light reliably from the transmitting station T to the receiving station R.

Figure 33:
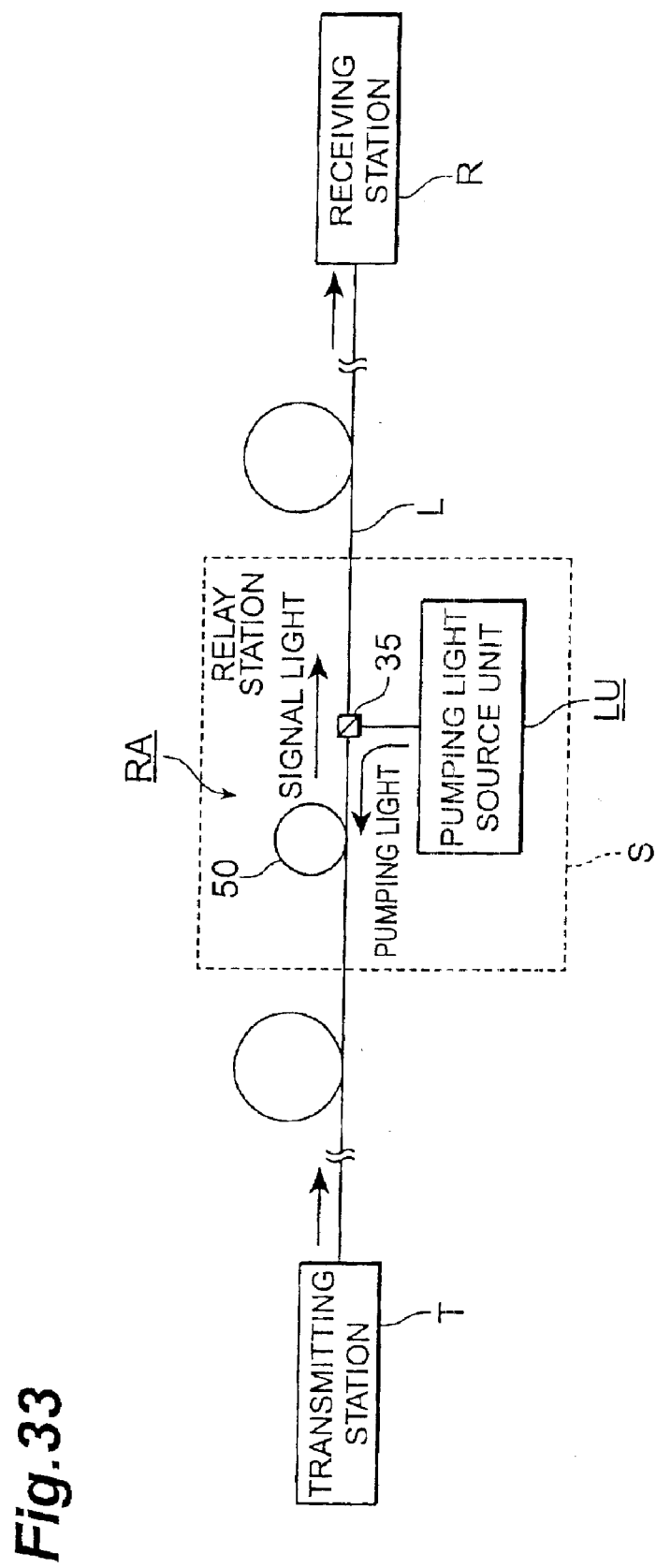
FIG. 33 is a diagram showing the configuration of a second embodiment of the optical transmission system according to the present invention.

FIG. 33 is a diagram showing the configuration of a second embodiment of the optical transmission system according to the present invention. The optical transmission system according to the second embodiment comprises a transmitting station (transmitter) T for transmitting a plurality of channels of signal light within a predetermined signal light wavelength band, an optical fiber transmission line L which is an optical transmission line for propagating the signal light from the transmitting station T, and a receiving station (receiver) R for receiving the signal light propagated through the optical fiber transmission line L. Also, a relay station S for relaying the signal light propagating through the optical fiber transmission line L is disposed at a predetermined position between the transmitting station T and the receiving station R.

A multiplexer 35 is disposed at a predetermined position on the optical fiber transmission line L within the relay station S. By way of the multiplexer 35, the above-mentioned pumping light source unit (pumping light source unit according to the present invention) is optically coupled to the optical fiber transmission line L. To the upstream side in the direction opposite from the signal propagating direction, the multiplexer 35 sends the pumping light supplied from the pumping light source unit LU. The pumping light source unit LU is pumping light supplying means for constituting a Raman amplifier RA for optically amplifying the signal light transmitted through the optical fiber transmission line L.

The optical transmission system according to the second embodiment is one in which the Raman amplifier RA including the pumping light source unit LU functions as a lumped constant type optical amplifier placed within the relay station S. In such a lumped constant type optical amplifier A, a separate optical fiber inserted in the optical fiber transmission line L is utilized as a Raman amplification optical fiber 50 as shown in FIG. 33.

Placing the lumped constant type Raman amplifier employing the pumping light source unit LU having the above-mentioned configuration at a predetermined position on the optical fiber transmission line L as such can realize an optical transmission system which restrains the transmission quality of signal light from deteriorating, thereby being able to transmit the signal light reliably from the transmitting station T to the receiving station R.

Figure 34:
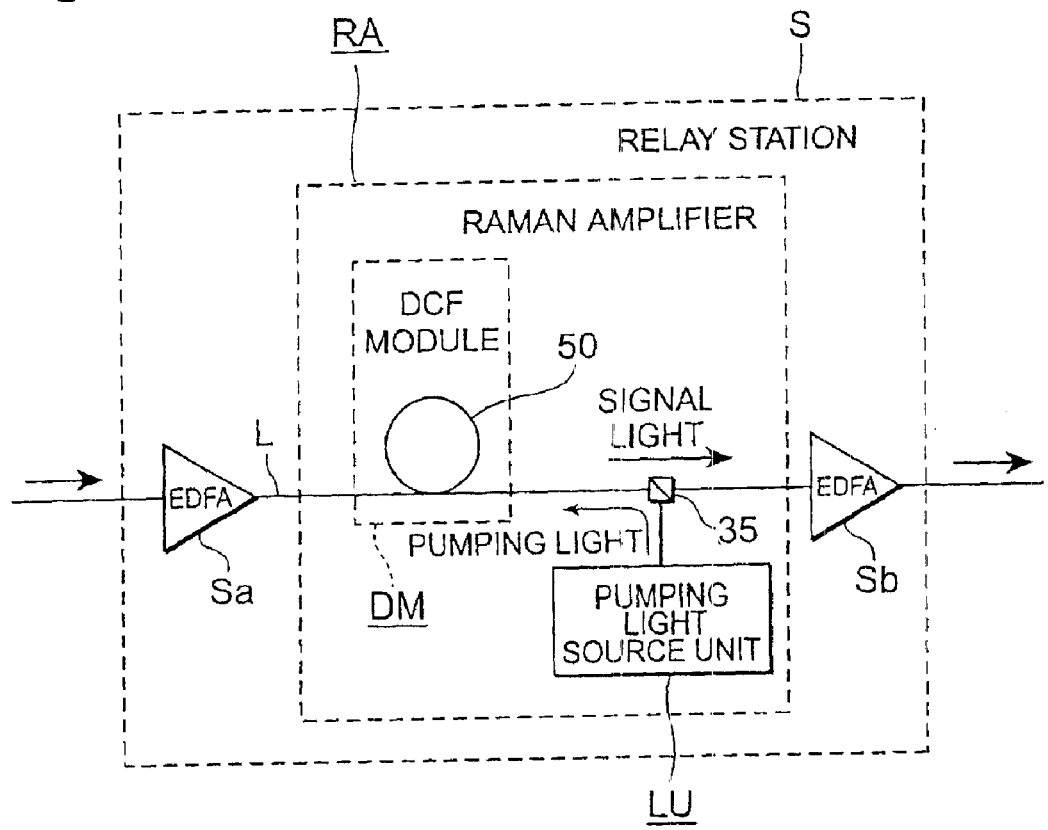
FIG. 34 is a block diagram showing the configuration of a relay station in the optical transmission system shown in FIG. 33.

FIG. 34 is a diagram showing the configuration of relay station in the optical transmission system shown in FIG. 33.

In the relay station S, the multiplexer 35 is disposed at a predetermined position on the optical fiber transmission line L, whereas the pumping light source unit LU is optically coupled to the optical fiber transmission line L by way of the multiplexer 35. Also, a dispersion-compensating module DM having a dispersion-compensating fiber (DCF) for compensating for the dispersion generated in signal light while being transmitted through the optical fiber transmission line L is disposed within the relay station S.

In the configuration of FIG. 34, the multiplexer 35 and pumping light source unit LU are placed downstream the dispersion-compensating module DM. This configuration is one in which the dispersion-compensating fiber included in the dispersion-compensating module DM is utilized as the Raman amplification optical fiber 50.

Namely, byway of the multiplexer 35, the pumping light supplied from the pumping light source unit LU is sent to the optical fiber transmission line L in the direction opposite from the signal light propagating direction. Thus sent pumping light is supplied to the optical fiber within the dispersion-compensating module DM acting as the Raman amplification optical fiber 50. As a consequence, the lumped constant type Raman amplifier RA for amplifying the signal light is constructed within the relay station S.

Various configurations can be attained within the relay station S without being restricted to an example thereof shown in FIG. 34. For example, separately from the optical fibers such as the dispersion-compensating fiber, a dedicated optical fiber for Raman amplification may be utilized for Raman amplification. Also, as shown in FIG. 34, additional optical amplifiers (e.g., EDFA) Sa, Sb may be provided in addition to the Raman amplifier RA.

Figure 35:
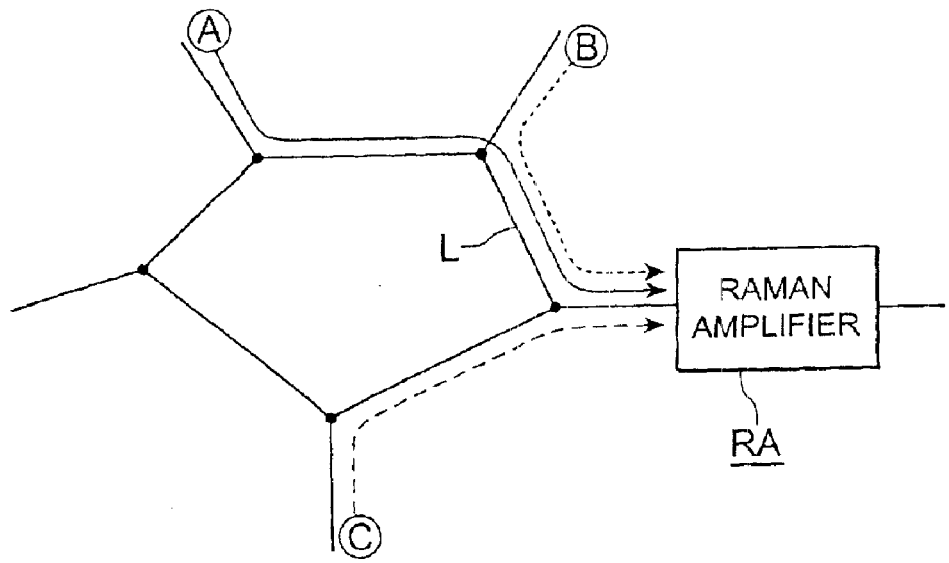
FIG. 35 is a diagram showing the configuration of a third embodiment of the optical transmission system according to the present invention.

FIG. 35 is a diagram showing the configuration of a third embodiment of the optical transmission system according to the present invention. The optical transmission system according to the third embodiment is one in which a plurality of communication users transmit signal light components A, B, C (each being WDM signal light having a plurality of channels) using signal light wavelength bands different from each other by way of the same optical transmission line L. When the above-mentioned Raman amplifier RA (Raman amplifier according to the present invention) is placed on the optical transmission line L in such an optical transmission system, the signal light components A, B, C are amplified favorably.

Here, respective signal light wavelength bands of signal light components A, B, C fall within the following wavelength ranges:
(A) 1530 nm to 1570 nm
(B) 1535 nm to 1575 nm
(C) 1540 nm to 1580 nm The amplification gain of Raman amplifier RA is controlled so as to flatten the output signal light spectrum in the wavelength band of each signal light component. The pumping light source unit of the Raman amplifier RA has three wavelength variable pumping light sources as a plurality of pumping light sources.

Figure 36:
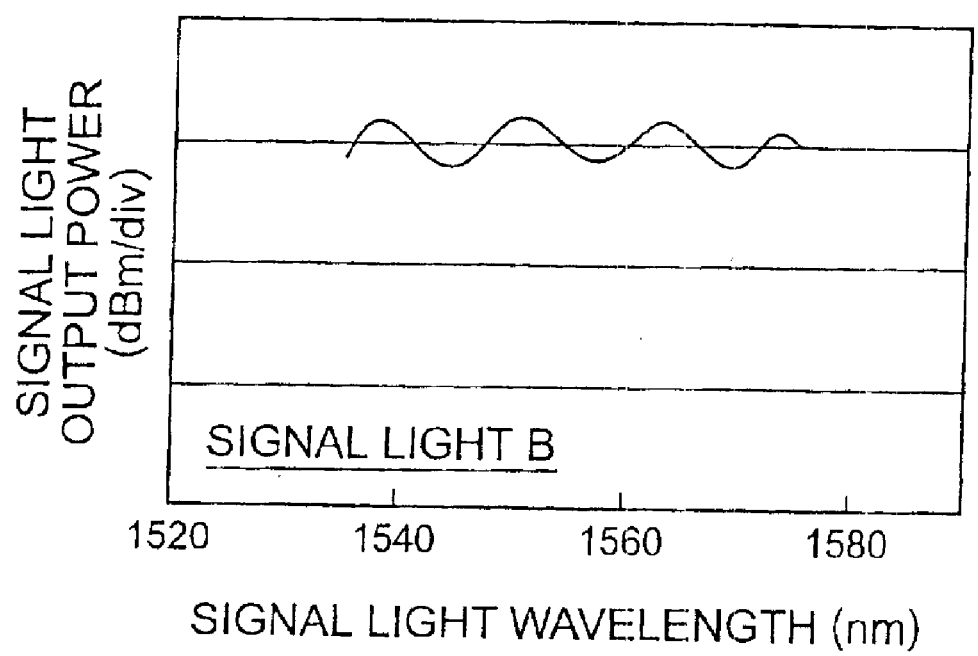
FIG. 36 shows a power spectrum obtained after Raman amplification concerning signal light B.

First, the flattening of output signal light spectrum for the signal light component B having a medium signal light wavelength band among the three signal light components will be considered. FIG. 36 shows a power spectrum concerning signal light B after Raman amplification. Here, channel wavelengths of pumping light supplied from the pumping light source unit are set to three channels at wavelengths of 1428 nm, 1439 nm, and 1460 nm so as to respond to the signal light wavelength bands of 1535 nm to 1575 nm of signal light B. The setting of these pumping light channels and optimization of their respective powers sufficiently flatten the output signal light spectrum with respect to the wavelength band of signal light B as shown in FIG. 36.

Figure 37A:
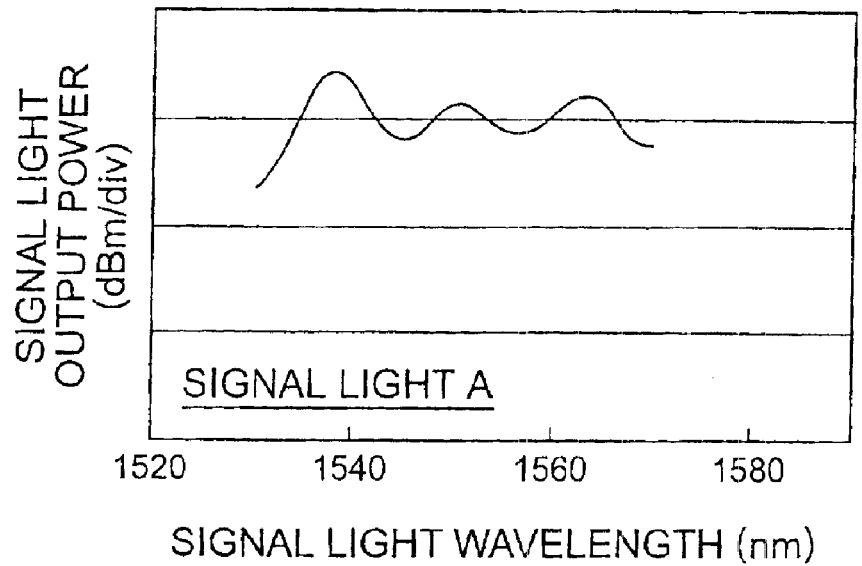
FIGS. 37A and 37B show respective power spectra obtained after Raman amplification concerning signal light A.
Figure 37B:
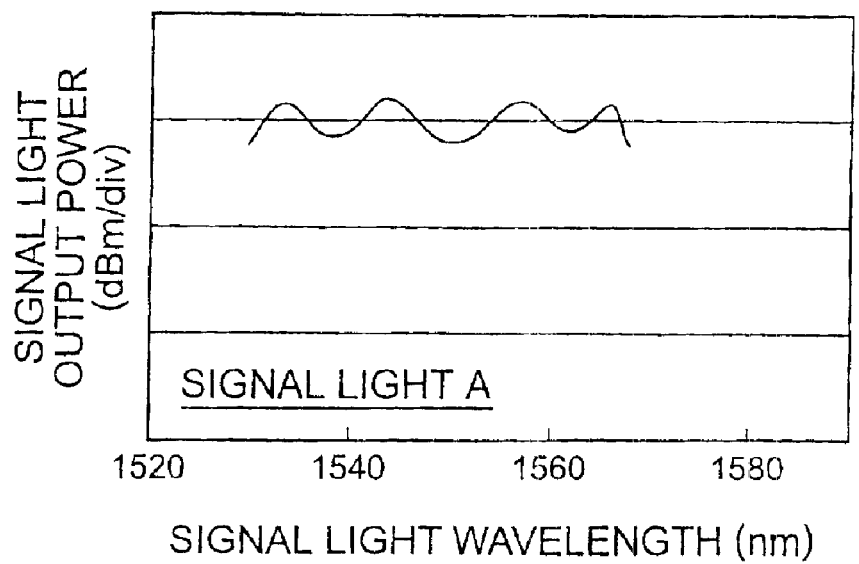

Next, the flattening of output signal light spectrum for the signal light component A having a signal wavelength band on the shorter wavelength side will be considered. Each of FIGS. 37A and 37B shows a power spectrum concerning signal light A after Raman amplification. FIG. 37A shows an output signal light spectrum obtained when three-channel pumping light having pumping light wavelengths 1428 nm, 1439 nm, and 1460 nm set for the signal light B is utilized as it is. In this case, since pumping light channels are not optimized, the spectrum is not sufficiently flattened, whereby the flatness deteriorates on the shorter wavelength side in particular.

On the other hand, FIG. 37B shows a power spectrum obtained when pumping light is set to three channels at 1424 nm, 1434 nm, and 1455 nm so as to respond to the signal light wavelength band of 1530 nm to 1570 nm of signal light A. When the individual channel wavelengths of pumping light supplied from the pumping light source unit are adjusted optimally as such, the output signal light spectrum can fully be flattened in the wavelength band of signal light A as well.

Figure 38A:
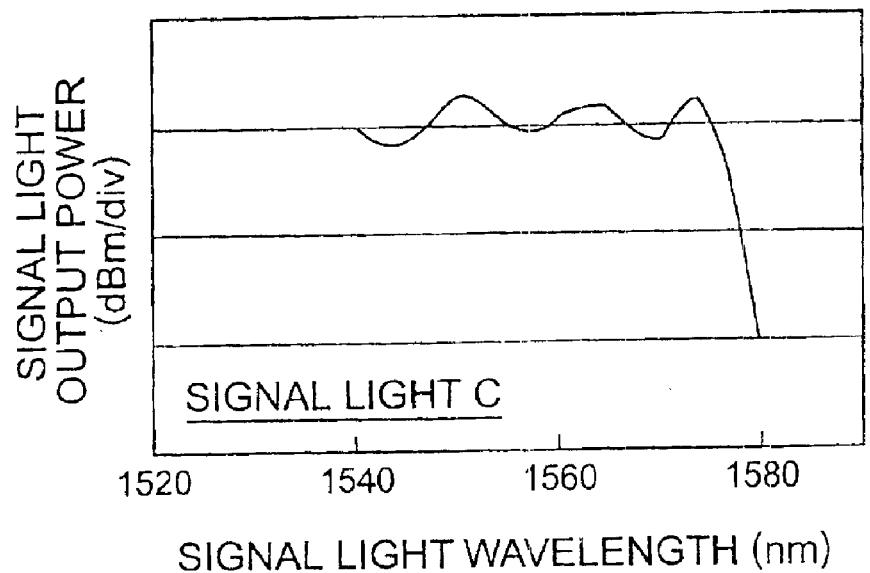
FIGS. 38A and 38B show respective power spectra obtained after Raman amplification concerning signal light C.
Figure 38B:
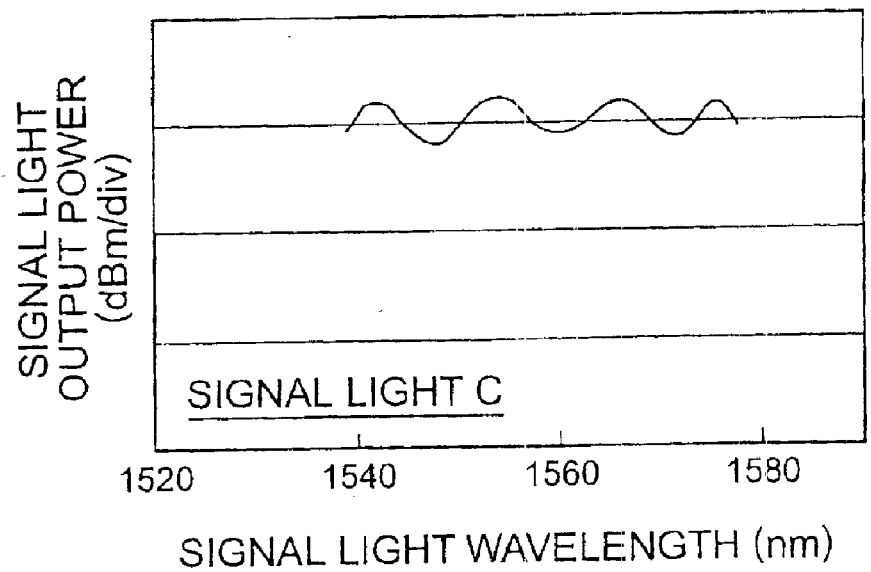

Next, the flattening of output signal light spectrum for the signal light component C having a signal wavelength band on the longer wavelength side will be considered. Each of FIGS. 38A and 38B shows a power spectrum concerning signal light C after Raman amplification. FIG. 38A shows an output signal light spectrum obtained when three-channel pumping light having pumping light wavelengths 1428 nm, 1439 nm, and 1460 nm set for the signal light B is utilized as it is. In this case, since pumping light channels are not optimized, the spectrum is not sufficiently flattened, whereby the flatness deteriorates on the longer wavelength side in particular.

On the other hand, FIG. 38B shows a power spectrum obtained when pumping light is set to three channels at 1432 nm, 1443 nm, and 1464 nm so as to respond to the signal light wavelength band of 1540 nm to 1580 nm of signal light C. When the individual channel wavelengths of pumping light supplied from the pumping light source unit are adjusted optimally as such, the output signal light spectrum can fully be flattened in the wavelength band of signal light C as well.

As in the foregoing, the optical transmission system employing a pumping light source unit including a wavelength variable pumping light source is also applicable to cases where signal light having a plurality of wavelength bands different from each other (WDM signal light) propagates. Namely, when channel wavelengths of pumping light supplied from the pumping light source unit are controlled variably, the amplification wavelength band in which the power spectrum of Raman-amplified output signal light is flattened can be changed in conformity to the wavelength band of signal light to be amplified.

In accordance with the above-mentioned Raman amplifier, when placing an optical fiber transmission line including the Raman amplifier or introducing the Raman amplifier into an optical fiber transmission line which has already been placed, channel wavelengths and channel powers of pumping light can be adjusted while measuring the output signal light spectrum, whereby the optical amplification controllability in the Raman amplifier can be improved. Also, as mentioned above, even when any of a plurality of pumping light sources included in the pumping light source unit fails, channel wavelengths of pumping light from the other pumping light sources can be adjusted, so as to compensate for the failed pumping light, thereby keeping the power spectrum of output signal light as flat as possible.

Without being restricted to the above-mentioned embodiments, the pumping light source unit, Raman amplifier, and optical transmission system according to the present invention can be modified in various manners. For example, the number of a plurality of pumping light sources included in the pumping light source unit is not limited to 4 as in the configuration shown in the above-mentioned embodiments, and the like. The number and configuration thereof are preferably set according to the width of the amplification wavelength band, the controllability of optical amplification gain, and the like.

As in the foregoing, the present invention provides a pumping light source unit in which at least one of a plurality of pumping light sources outputting a plurality of channels of pumping light having respective wavelengths different from each other is a wavelength variable pumping light source, a Raman amplifier employing the same, and an optical transmission system, thereby being able to adjust not only the respective channel powers of pumping light but also the wavelength of pumping light outputted from the wavelength variable pumping light source as necessary when regulating the power spectrum of pumping light supplied from the pumping light source unit and the power spectrum of its corresponding output signal light.

This realizes a pumping light source unit, a Raman amplifier, and an optical transmission system, whose controllability is improved so as to be able to respond sufficiently to various changes including those in cases where the pumping light spectrum or output signal light spectrum greatly changes.

What is claimed is:

1. A pumping light source unit for Raman amplification, said pumping light source unit comprising:
    a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;
    a multiplexer for multiplexing said N channels of pumping light respectively outputted from said N pumping light sources; and
    an output structure for outputting said pumping light multiplexed by said multiplexer,
    wherein said wavelength variable pumping light source includes an external resonator type wavelength variable laser unit comprising a pumping light laser, a resonance grating, and a channel wavelength adjusting system for changing a wavelength of light reflected by said resonance grating.

2. A pumping light source unit according to claim 1 wherein said resonance grating includes a Bragg grating for reflecting light having a Bragg wavelength.

3. A pumping light source unit according to claim 2, wherein said Bragg grating includes a fiber Bragg grating having a periodic refractive index change formed within at least a core region of an optical fiber along a longitudinal direction of said optical fiber.

4. A pumping light source unit according to claim 3, wherein said channel wavelength adjusting system includes stress applying means for changing a grating period by applying a predetermined stress to said fiber Bragg grating.

5. A pumping light source unit according to claim 3, wherein said channel wavelength adjusting system includes heating means for changing a refractive index within said core region by heating said fiber Bragg grating.

6. A pumping light source unit according to claim 2, wherein said Bragg grating is formed within an optical waveguide made of a material having an electrooptic effect; and
    wherein said channel wavelength adjusting system includes electric field applying means for changing a refractive index of said optical waveguide by applying an electric field having a predetermined intensity to said optical waveguide formed with said Bragg grating.

7. A pumping light source unit for Raman amplification, said pumping light source unit comprising:
    a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;
    a multiplexer for multiplexing said N channels of pumping light respectively outputted from said N pumping light sources; and
    an output structure for outputting said pumping light multiplexed by said multiplexer,
    wherein said wavelength variable pumping light source includes a wavelength variable laser unit comprising a pumping laser and a variable length bandpass filter adapted to change a wavelength of light transmitted therethrough.

8. A pumping light source unit for Raman amplification, said pumping light source unit comprising:
    a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;
    a multiplexer for multiplexing said N channels of pumping light respectively outputted from said N pumping light sources; and
    an output structure for outputting said pumping light multiplexed by said multiplexer, wherein said multiplexer includes transmission characteristic adjusting means for adjusting a transmission wavelength characteristic thereof.

9. A pumping light source unit for Raman amplification, said pumping light source unit comprising:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer, wherein said multiplexer includes a plurality of polarization multiplexers each polarization-multiplexing a pair of channels of pumping light having respective wavelengths adjacent each other, and a wavelength multiplexer for wavelength-multiplexing a plurality of pumping light components outputted from the respective polarization multiplexers.

10. A pumping light source unit according to claim 9, wherein said multiplexer further comprises a depolarizer disposed between said polarization multiplexer and said wavelength multiplexer.

11. A pumping light source unit for Raman amplification, said pumping light source unit comprising:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer, wherein said multiplexer includes an arrayed waveguide grating multiplexing said N channels of pumping light, a channel spacing between at least two channels of said N channels being set at one or more periods each corresponding to a free spectrum range of said arrayed waveguide grating.

12. A pumping light source unit for Raman amplification, said pumping light source unit comprising:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer, wherein said multiplexer includes an interleaver grating multiplexing said N channels of pumping light, a channel spacing between at least two channels of said N channels being set at one or more periods each corresponding to a free spectrum range of said interleaver.

13. A pumping light source unit for Raman amplification, said pumping light source unit comprising:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer, wherein said multiplexer has a structure combining an arrayed waveguide grating and an interleaver with each other, each of said arrayed waveguide grating and said interleaver multiplexing said N channels of pumping light, a channel spacing between at least two channels of said N channels being set at one or more periods each corresponding to a free spectrum range thereof.

14. A pumping light source unit for Raman amplification, said pumping light source unit comprising:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer, wherein each of said N pumping light sources includes an external resonator type laser unit comprising a pumping laser and a resonance grating, at least one of said external resonator type laser units including an external resonator type wavelength variable laser unit further comprising a channel wavelength adjusting system for changing a wavelength of light reflected by said resonance grating; and wherein said multiplexer comprises:

at least one optical circulator device for multiplexing N channels of pumping light respectively outputted from said N external resonator type laser units; and a reflection grating disposed between said resonance grating included in each of said N pumping light sources and said optical circulator device, each of said reflection gratings having a reflection characteristic for reflecting one of channels of pumping light outputted from said optical circulator device to said resonance grating toward said optical circulator device.

15. A pumping light source unit according to claim 14, wherein said optical circulator device includes (N–1) 3-port optical circulators connected in (N–1) stages so as to successively multiplex said N channels of pumping light outputted from respective external resonator type laser units included in said N pumping light sources.

16. A pumping light source unit according to claim 14, wherein said optical circulator device includes a single (N+1)-port optical circulator for multiplexing said N channels of pumping light outputted from respective external resonator type laser units included in said N pumping light sources.

17. A pumping light source unit according to claim 14, wherein said multiplexer further comprises an optical isolator disposed between said resonance grating and said reflection grating.

18. A pumping light source unit according to claim 14, wherein said optical circulator device includes a single (N+2)-port optical circulator for multiplexing said N channels of pumping light outputted from respective external resonator type laser units included in said N pumping light sources.

19. A pumping light source unit according to claim 14, wherein said channel wavelength adjusting system changes a reflection wavelength of the reflection grating for reflecting pumping light from said external resonator type wavelength variable laser unit in said reflection gratings in synchronization with a reflection wavelength of the resonance grating included in said external resonator type wavelength variable laser unit.

20. A pumping light source unit according to claim 14, wherein each of said resonance grating and said reflection grating includes a Bragg grating for reflecting light having a Bragg wavelength.

21. A pumping light source unit according to claim 20, wherein said Bragg grating includes a fiber Bragg grating having a periodic refractive index change formed within at least a core region of an optical fiber along a longitudinal direction of said optical fiber.

22. A pumping light source unit according to claim 21, wherein said channel wavelength adjusting system includes stress applying means for changing a grating period by applying a predetermined stress to said fiber Bragg grating.

23. A pumping light source unit according to claim 21, wherein said channel wavelength adjusting system includes heating means for changing a refractive index within said core region by heating said fiber Bragg grating.

24. A pumping light source unit according to claim 20, wherein said Bragg grating is formed within an optical waveguide made of a material having an electrooptic effect; and wherein said channel wavelength adjusting system includes electric field applying means for changing a refractive index of said optical waveguide by applying an electric field having a predetermined intensity to said optical waveguide formed with said Bragg grating.

25. A Raman amplifier comprising:

a Raman amplification optical fiber for Raman-amplifying signal light within a predetermined amplification wavelength band with pumping light;

a pumping light source unit for supplying said Raman amplification optical fiber with said pumping light, said pumping light source unit having:

a pumping light supply system including N ($\geq$2) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer;

an input power measuring system for measuring a power of signal light fed therein; and a controller for controlling, according to a result of measurement effected by said input power measuring system, a power or wavelength of said N channels of pumping light respectively outputted from said N pumping light sources included in said pumping light source unit so as to attain a substantially flat output signal light spectrum, wherein said controller controls at least one of channel wavelengths of said pumping light so that a frequency yielding the lowest signal light power in said output signal light spectrum approaches a frequency higher by 13 THz to 15 THz than the former frequency.

26. A Raman amplifier comprising:

a Raman amplification optical fiber for Raman-amplifying signal light within a predetermined amplification wavelength band with pumping light;

a pumping light source unit for supplying said Raman amplification optical fiber with said pumping light, said pumping light source unit having:

a pumping light supply system including N ($\geq$2) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer;

an input power measuring system for measuring a power of Raman amplified output signal light; and a controller for controlling, according to a result of measurement effected by said input power measuring system, a power or wavelength of said N channels of pumping light respectively outputted from said N pumping light sources included in said pumping light source unit so as to attain a substantially flat output signal light spectrum, wherein said controller controls at least one of channel wavelengths of said pumping light so that a frequency yielding the lowest signal light power in said output signal light spectrum approaches a frequency higher by 13 THz to 15 THz than the former frequency.

27. A Raman amplifier comprising:

a Raman amplification optical fiber for Raman-amplifying signal light within a predetermined amplification wavelength band with pumping light;

a pumping light source unit for supplying said Raman amplification optical fiber with said pumping light, said pumping light source unit having:

a pumping light supply system including N ($\geq$2) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer;

an instruction signal input system for introducing an instruction signal from outside; and a controller for controlling, according to said instruction signal introduced from said instruction signal input system, a power or wavelength of said N channels of pumping light respectively outputted from said N pumping light sources included in said pumping light source unit so as to attain a substantially flat output signal light spectrum.

28. A Raman amplifier according to claim 27, wherein said controller controls at least one of channel wavelengths of said pumping light so that a frequency yielding the lowest signal light power in said output signal light spectrum approaches a frequency higher by 13 THz to 15 THz than the former frequency.

29. A Raman amplifier comprising:

a Raman amplification optical fiber for Raman-amplifying signal light within a predetermined amplification wavelength band with pumping light;

a pumping light source unit for supplying said Raman amplification optical fiber with said pumping light, said pumping light source unit having:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer; and a controller for controlling, when a power of pumping light outputted from at least one of said N pumping light sources included in said pumping light source unit decreases to a level failing to contribute to Raman amplification, a power of pumping light outputted from a pumping light source other than said power-decreased pumping light source so as to yield a power fluctuation of 2 dB or less per channel of Raman-amplified signal light.

30. A Raman amplifier according to claim 29, wherein said controller detects, among said N pumping light sources included in said pumping light source unit, the pumping light source with a power of pumping light outputted therefrom having decreased to a level failing to contribute to Raman amplification, and controls a power of pumping light outputted from the pumping light source other than said power-decreased pumping light source so that a channel wavelength of pumping light outputted therefrom approaches a channel wavelength of pumping light to be outputted from said power-decreased pumping light source.

31. A Raman amplifier comprising:

a Raman amplification optical fiber for Raman-amplifying signal light within a predetermined amplification wavelength band with pumping light;

a pumping light source unit for supplying said Raman amplification optical fiber with said pumping light, said pumping light source unit having:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer; and a controller for controlling, when a power of pumping light outputted from at least one of said N pumping light sources included in said pumping light source unit decreases to a level failing to contribute to Raman amplification, a power of pumping light outputted from a pumping light source other than said power-decreased pumping light source so as to yield a power fluctuation of 2 dB or less per channel of Raman-amplified signal light.

32. A Raman amplifier according to claim 31, wherein said controller detects, among said N pumping light sources included in said pumping light source unit, the pumping light source with a power of pumping light outputted therefrom having decreased to a level failing to contribute to Raman amplification, and controls a power of pumping light outputted from the pumping light source other than said power-decreased pumping light source so that a channel wavelength of pumping light outputted therefrom approaches a channel wavelength of pumping light to be outputted from said power-decreased pumping light source.

33. A pumping light source unit for Raman amplification, said pumping light source unit comprising:

a main pumping light supply system including N ($\geq 2$) pumping light sources for outputting N channels of pumping light having respective wavelengths different from each other;

a multiplexer for multiplexing said N channels of pumping light respectively outputted from said N pumping light sources;

an output structure for outputting said pumping light multiplexed by said multiplexer;

a backup pumping light supply system including one or more backup pumping light sources, at least one of said backup pumping light sources including a wavelength variable pumping light source adapted to change a channel wavelength of pumping light outputted therefrom; and an optical switch, arranged in an optical path between said main pumping light supply system and said demultiplexer, for switching between output from one of said N pumping light sources includes in said main pumping light supply system and output from one of said backup pumping light sources.

34. A pumping light source unit according to claim 33, wherein said optical switch includes an optic interferometric switch.

35. A pumping light source unit according to claim 33, further comprising a 1×M ($\geq 2$)-port optical switch arranged between said optical switch and said backup pumping light supply system.

36. A pumping light source unit according to claim 35, further comprising a resonance grating arranged between said optical switch and said 1×M-port optical switch, said resonance grating having a central reflection wavelength approximately equal to a wavelength of the pumping light outputted from the associated one to be switched by said optical switch within said N pumping light sources.

37. A pumping light source unit according to claim 33, further comprising a M ($\geq 2$)-port output demultiplexer arranged between said optical switch and said backup pumping light supply system.

38. A pumping light source unit according to claim 33, further comprising:
a resonance grating arranged between said backup pumping light supply system and said M-port output demultiplexer; and
a channel wavelength adjusting system for changing a wavelength of light reflected by said resonance grating.

39. A pumping light source unit according to claim 38, wherein said channel wavelength adjusting system includes stress applying means for changing a grating period by applying a predetermined stress to said resonance grating.

40. A pumping light source unit according to claim 38, wherein said channel wavelength adjusting system includes heating means for changing a refractive index within said core region by heating said resonance grating.

41. A pumping light source unit according to claim 38, wherein said resonance grating is formed within an optical waveguide made of a material having an electrooptic effect; and
wherein said channel wavelength adjusting system includes electric field applying means for changing a refractive index of said optical waveguide by applying an electric field having a predetermined intensity to said optical waveguide formed with said resonance grating.

42. A Raman amplifier according to claim 33, further comprising:
an input power measuring system for measuring a power of signal light fed therein; and
a controller for controlling, according to a result of measurement effected by said input power measuring system, a power or wavelength of said N channels of pumping light respectively outputted from said N pumping light sources included in said pumping light source unit so as to attain a substantially flat output signal light spectrum.

43. A Raman amplifier according to claim 42, wherein said controller controls at least one of channel wavelengths of said pumping light so that a frequency yielding the lowest signal light power in said output signal light spectrum approaches a frequency higher by 13 THz to 15 THz than the former frequency.

44. A Raman amplifier according to claim 33, further comprising:
an output power measuring system for measuring a power of Raman-amplified output signal light; and
a controller for controlling, according to a result of measurement effected by said output power measuring system, a power or wavelength of said N channels of pumping light respectively outputted from said N pumping light sources included in said pumping light source unit so as to attain a substantially flat output signal light spectrum.

45. A Raman amplifier according to claim 44, wherein said controller controls at least one of channel wavelengths of said pumping light so that a frequency yielding the lowest signal light power in said output signal light spectrum approaches a frequency higher by 13 THz to 15 THz than the former frequency.

46. A Raman amplifier comprising:
a Raman amplification optical fiber for Raman-amplifying signal light within a predetermined amplification wavelength band with pumping light;
a pumping light source unit for supplying said Raman amplification optical fiber with said pumping light, said pumping light source unit having:
a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;
a multiplexer for multiplexing said N channels of pumping light respectively outputted from said N pumping light sources; and
an output structure for outputting said pumping light multiplexed by said multiplexer;
an instruction signal input system for introducing an instruction signal from outside; and
a controller for controlling, according to said instruction signal introduced from said instruction signal input system, a power or wavelength of said N channels of pumping light respectively outputted from said N pumping light sources included in said pumping light source unit so as to attain a substantially flat output signal light spectrum.

47. A Raman amplifier according to claim 46, wherein said controller controls at least one of channel wavelengths of said pumping light so that a frequency yielding the lowest signal light power in said output signal light spectrum approaches a frequency higher by 13 THz to 15 THz than the former frequency.

48. A Raman amplifier comprising:
a Raman amplification optical fiber for Raman-amplifying signal light within a predetermined amplification wavelength band with pumping light;
a pumping light source unit for supplying said Raman amplification optical fiber with said pumping light, said pumping light source unit having:
a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;
a multiplexer for multiplexing said N channels of pumping light respectively outputted from said N pumping light sources; and
an output structure for outputting said pumping light multiplexed by said multiplexer; and
a controller for controlling, when a power of pumping light outputted from at least one of said N pumping light sources included in said pumping light source unit decreases to a level failing to contribute to Raman amplification, a power of pumping light outputted from a pumping light source other than said power-decreased pumping light source so as to yield a power fluctuation of 2 dB or less per channel of Raman-amplified signal light.

49. A Raman amplifier according to claim 48, wherein said controller detects, among said N pumping light sources included in said pumping light source unit, the pumping light source with a power of pumping light outputted therefrom having decreased to a level failing to contribute to Raman amplification, and controls a power of pumping light outputted from the pumping light source other than said power-decreased pumping light source so that a channel wavelength of pumping light outputted therefrom approaches a channel wavelength of pumping light to be outputted from said power-decreased pumping light source.

50. A Raman amplifier comprising:

a Raman amplification optical fiber for Raman-amplifying signal light within a predetermined amplification wavelength band with pumping light;

a pumping light source unit for supplying said Raman amplification optical fiber with said pumping light, said pumping light source unit having:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer;

a pumping light source unit according claim 33 for supplying N ($\geq 2$) channels of pumping light having respective wavelengths different from each other;

an optical waveguide for propagating a plurality of channels of signal light having respective wavelengths different from each other and Raman-amplifying said signal light with said pumping light supplied from said pumping light source unit; and a controller for controlling, when a power of pumping light outputted from at least one of said N pumping light sources included in said pumping light source unit decreases to a level failing to contribute to Raman amplification, a power of pumping light outputted from a pumping light source other than said power-decreased pumping light source so as to yield a power fluctuation of 2 dB or less per channel of Raman-amplified signal light.

51. A Raman amplifier according to claim 50, wherein said controller detects, among said N pumping light sources included in said pumping light source unit, the pumping light source with a power of pumping light outputted therefrom having decreased to a level failing to contribute to Raman amplification, and controls a power of pumping light outputted from the pumping light source other than said power-decreased pumping light source so that a channel wavelength of pumping light outputted therefrom approaches a channel wavelength of pumping light to be outputted from said power-decreased pumping light source.

52. An optical communication system having a plurality of relay sections and including a Raman amplifier, said Raman amplifier comprising:

a Raman amplification optical fiber for Raman-amplifying signal light within a predetermined amplification wavelength band with pumping light; and a pumping light source unit for supplying said Raman amplification optical fiber with said pumping light, said pumping light source unit having:

a pumping light supply system including N ($\geq 2$) pumping light sources for outputting N channels of pumping light having respective wavelengths different from each other, at least one of said pumping light sources including a wavelength variable pumping light source adapted to change a channel wavelength of pumping light outputted therefrom;

a multiplexer for multiplexing said N channels of pumping light respectively outputted from said N pumping light sources; and an output structure for outputting said pumping light multiplexed by said multiplexer, wherein an average value of power fluctuation per channel of signal light for each relay section is 2 dB or less.

* * * * *